(12) United States Patent
Suzuki

(10) Patent No.: US 8,142,983 B2
(45) Date of Patent: Mar. 27, 2012

(54) LITHOGRAPHIC PRINTING PLATE PRECURSOR AND METHOD OF LITHOGRAPHIC PRINTING

(75) Inventor: Shota Suzuki, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/401,322

(22) Filed: Mar. 10, 2009

(65) Prior Publication Data

US 2009/0233229 A1 Sep. 17, 2009

(30) Foreign Application Priority Data

Mar. 11, 2008 (JP) ................................. 2008-060766

(51) Int. Cl.
- G03F 7/32 (2006.01)
- G03F 7/11 (2006.01)
- G03F 7/004 (2006.01)
- G03F 7/028 (2006.01)
- B41C 1/10 (2006.01)
- B41C 1/14 (2006.01)
- B41C 1/18 (2006.01)

(52) U.S. Cl. .................. 430/281.1; 430/287.1; 430/944; 430/926; 430/283.1; 430/284.1; 430/138; 430/302; 101/450.1

(58) Field of Classification Search ........................ None
See application file for complete search history.

(56) References Cited

U.S. PATENT DOCUMENTS

| | | | | |
|---|---|---|---|---|
| 3,458,311 | A * | 7/1969 | Alles | 430/273.1 |
| 3,782,950 | A * | 1/1974 | Ranz et al. | 430/281.1 |
| 4,258,121 | A | 3/1981 | Kojima | |
| 4,266,005 | A * | 5/1981 | Nakamura et al. | 430/271.1 |
| 4,615,968 | A | 10/1986 | Berger et al. | |
| 4,942,111 | A * | 7/1990 | Wade et al. | 430/273.1 |
| 5,723,260 | A * | 3/1998 | Tsuji et al. | 430/278.1 |
| 6,034,150 | A * | 3/2000 | Hoyle et al. | 522/63 |
| 6,153,662 | A * | 11/2000 | Miller et al. | 522/63 |
| 6,555,593 | B1 * | 4/2003 | Hoyle et al. | 522/63 |
| 2003/0013603 | A1 * | 1/2003 | Ishii et al. | 502/167 |
| 2004/0024151 | A1 * | 2/2004 | Becker et al. | 526/217 |
| 2004/0198859 | A1 * | 10/2004 | Nguyen et al. | 522/26 |
| 2006/0269874 | A1 | 11/2006 | Huang et al. | |

FOREIGN PATENT DOCUMENTS

EP  1 449 833 A1  8/2004

OTHER PUBLICATIONS

Ad Stijnman, "Oil-based printing ink on paper", PapierRestaurierung vol. 1 (2000), Suppl.*
"Biochemicals for the Printing Industry" from http://cool.conservation-us.org/iada/pr00jb_1.pdf with a copyright dated of 1997 to Institute for local Self-Reliance.*
Transilwrap Company, inc., Introduction to Offset Lithography printed from the Web on Nov. 23, 2011.*
Shapiro, ed, The Lithographers Manual, fourth ed, The GRaphic ARts Technical Foundation Inc., Pittsburgh, Pennsylvania, pp. 13:1 to 13:13 of chapter 13 wherein a discussion of components of inks include vehicles for ink. PTO stamp date of Jan. 26, 1971.*
A web based description of an ATSM D5958-99 (2011) Standard Practices for Preparation of Oil Based Ink Resin Solution for sale at http://www.astm.org/Standards/D5958.htm, downloaded Nov. 23, 2011.*
European Search Report issued Aug. 31, 2010, in EP 09003458.8.

\* cited by examiner

*Primary Examiner* — Cynthia Hamilton
(74) *Attorney, Agent, or Firm* — Birch, Stewart, Kolasch & Birch, LLP

(57) ABSTRACT

A lithographic printing plate precursor is provided that, using laser exposure, exhibits an excellent capacity for plate inspection, an excellent on-press development performance or gum development performance, and an excellent scumming behavior, while maintaining a satisfactory printing durability. There is also provided a method of lithographic printing that uses this lithographic printing plate precursor. The lithographic printing plate precursor comprises an image recording layer having (A) a nonionic polymerization initiator that contains at least two cyclic imide structures, and (B) a compound that has at least one addition-polymerizable ethylenically unsaturated bond.

10 Claims, 1 Drawing Sheet

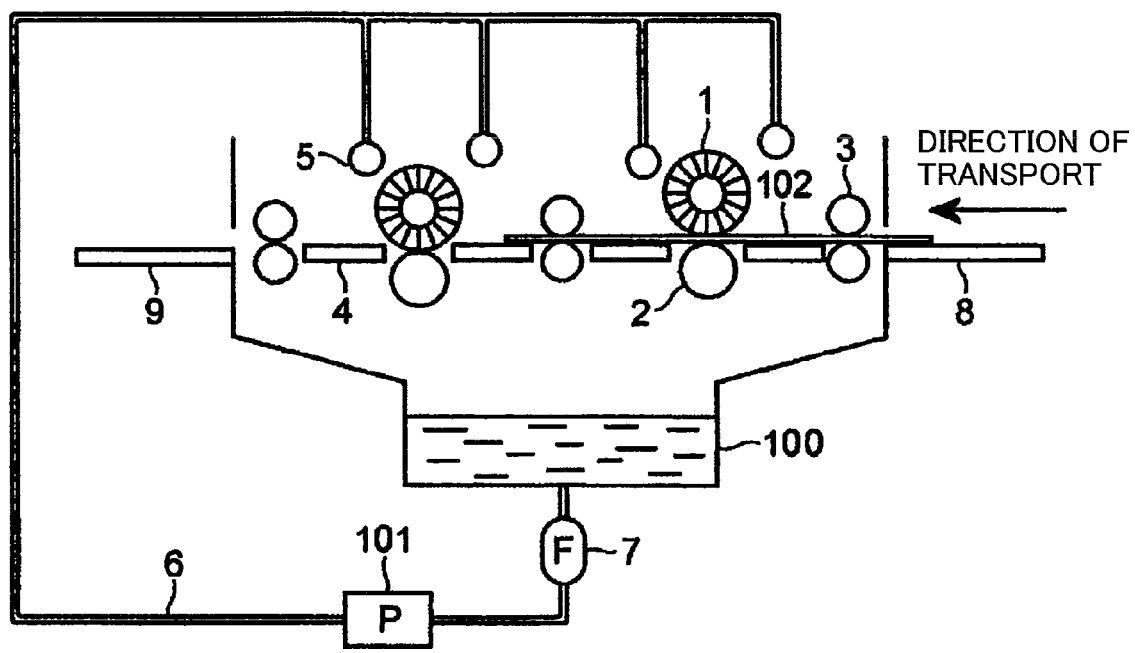

LITHOGRAPHIC PRINTING PLATE PRECURSOR AND METHOD OF LITHOGRAPHIC PRINTING

BACKGROUND OF THE INVENTION

1. Field of the Invention

The present invention relates to a lithographic printing plate precursor and to a method of lithographic printing using this lithographic printing plate precursor. More particularly, the present invention relates to a lithographic printing plate precursor that enables so-called direct platemaking by laser scanning based on a digital signal from, for example, a computer; to a method of lithographic printing in which printing is carried out by direct development of the aforementioned lithographic printing plate precursor on a press without going through a development process step; and to a method of lithographic printing in which printing is carried out after the aforementioned lithographic printing plate precursor has been subjected to a development process step using a gum solution.

2. Description of the Related Art

A lithographic printing plate typically comprises an oleophilic image area that is ink receptive during the printing process and a hydrophilic nonimage area that is fountain solution receptive during the printing process. Lithographic printing is a method that utilizes the fact that water and oleophilic ink repel each other: differences in the ink attachment behavior are produced on the surface of the lithographic printing plate by using the oleophilic image areas on the lithographic printing plate as ink receptive areas and using the hydrophilic nonimage areas on the lithographic printing plate as fountain solution receptive areas (areas not receptive to ink). After ink uptake has been brought about only in the image areas, the ink is transferred to the receiving medium, e.g., paper.

A lithographic printing plate precursor (PS plate) comprising an oleophilic photosensitive resin layer (image recording layer) disposed on a hydrophilic support has heretofore been widely used to produce the aforementioned lithographic printing plate. Platemaking is typically carried out by a method in which the lithographic printing plate precursor is exposed to light through an original image, for example, a lith film, after which the areas forming the image areas of the image recording layer remain while nonimage areas on image recording layer is dissolved and removed by an alkaline developing solution or an organic solvent to expose the hydrophilic surface of support, thus yielding the lithographic printing plate.

The conventional platemaking process for lithographic printing plate precursors has required a step in which, after photoexposure, the unwanted image recording layer is dissolved and removed by, for example, a developing solution adapted to the image recording layer; however, a concern with these separately conducted wet processes has been to render them unnecessary or to simplify them. In particular, attention to the global environment has in recent years caused the disposal of the waste solutions discharged in association with these wet processes to become a major issue for the industrial sector as a whole, and as a consequence there has been an even stronger desire to address the aforementioned concern.

In this context, the method known as on-press development has been introduced as a convenient platemaking method. In on-press development, an image recording layer is used that enables the removal of unwanted areas of the image recording layer to be carried out during an ordinary printing process: after photoexposure, the lithographic printing plate is obtained by removal of the unwanted areas of the image recording layer on the press.

The following are examples of specific methods of on-press development: use of a lithographic printing plate precursor that has an image recording layer that can be dissolved or dispersed in the fountain solution, in the ink solvent, or in an emulsion of the fountain solution and ink; mechanical removal of the image recording layer by contact with rollers or the blanket cylinder on the press; mechanical removal of the image recording layer by carrying out contact with rollers or the blanket cylinder after the cohesive strength within the image recording layer or the adhesive force between the image recording layer and support has been weakened by penetration by, for example, the fountain solution or the ink solvent.

Unless stated otherwise, in the present invention, the "development processing step" refers to a step in which the hydrophilic surface of the support is exposed by the removal of those areas of the image recording layer that have not been exposed to the laser, wherein this removal is effected by contact with a fluid (typically an alkaline developing solution) using an apparatus (typically an automatic developing apparatus) outside of the press, and "on-press development" denotes a step and a method in which the hydrophilic surface of the support is exposed by the removal of those areas of the image recording layer that have not been exposed to the laser, wherein this removal is effected by contact with a fluid (typically the printing ink and/or fountain solution) using the press.

In another convenient platemaking method, removal of the unwanted areas of the image recording layer is carried out with a gum solution (this is typically an aqueous solution that contains a hydrophilic resin), i.e., gum development is carried out, and subsequent to this contact with printing ink and fountain solution on the press is executed in a conventional manner and printing is carried out.

At the same time, digital technology, in which the image data is electronically processed, stored, and output using a computer, has become widespread during the last few years, and various new image output methods have entered into practice in association with this digital technology. Accompanying this, interest has been growing in computer-to-plate (CTP) technology, in which the digitized image data is carried by a highly convergent beam of radiation, for example, laser light, and the lithographic printing plate precursor is subjected to a scanning photoexposure with this light in order to directly produce the lithographic printing plate without going through lith film. As a consequence, the appearance of lithographic printing plate precursors adapted to this technology has become a technical problem of the utmost importance.

Thus, as described in the preceding, based on global environmental concerns and the need to adapt and conform to digital technology, there has recently been an even stronger desire than before for a simplification of platemaking technology, for its conversion to a dry technology, and for its conversion into a processless technology.

A light source and image recording layer that support handling in a light room or under yellow illumination are required for the simplification of the platemaking process as described above, or for its conversion to a dry procedure, or to make it processless. This requirement arises from the fact that the image recording layer exhibits photosensitivity after exposure because it has not been fixed by a development process, which creates the potential for fogging in the interval up to the printing step. Solid-state lasers (e.g., the YAG laser and so forth) and semiconductor lasers that emit infrared radiation at wavelengths of 760 to 1200 nm are very useful as such laser light sources because they can be inexpensively acquired as small, high-output devices. UV lasers can also be used.

An example of an on-press-developable lithographic printing plate precursor that is image-recordable with such an infrared laser is described in Japanese Patent No. 2,938,397, which describes a lithographic printing plate precursor in which an image-forming layer having particles of a hydrophobic thermoplastic polymer dispersed in a hydrophilic binder is provided on a hydrophilic support. In its essential features, Japanese Patent No. 2,938,397 describes the possibility of exposure of this lithographic printing plate precursor with an infrared laser to bring about image formation by the thermal coalescence of the hydrophobic thermoplastic polymer particles; mounting on the press cylinder; and on-press development by the fountain solution and/or ink.

This method of image formation by coalescence by the simple thermal fusion of microparticles does have excellent on-press developing characteristics, but is compromised by a very weak image strength and an unsatisfactory printing durability.

A lithographic printing plate precursor comprising a hydrophilic support bearing microcapsules that hold a polymerizable compound is described in Japanese Patent Application Publication Nos. 2001-277740 and 2001-277742.

In the lithographic printing plate precursor described in Japanese Patent Application Publication No. 2002-287334, a photosensitive layer containing an infrared absorber, a radical polymerization initiator, and a polymerizable compound is disposed on a support.

Due to the high density of chemical bonds in the image regions, these polymerization reaction-based methods are characterized by a relatively good image strength in comparison to image areas formed by the thermal fusion of polymer microparticles. However, an intermediate layer has had to be disposed between the support and the image-recording layer in order to provide a satisfactory printing durability, capacity for on-press development, and scumming behavior.

The use of a water-soluble resin that confers hydrophilicity for an intermediate layer tasked in such a manner is generally known. The on-press-developable lithographic printing plate precursor described in Japanese Patent Application Publication No. 2005-125749 is provided with an intermediate layer of a polymer that has a hydrophilic group, a polymerizable group, and a group capable of adsorbing to the substrate.

However, the scumming behavior in the nonimage areas is still unsatisfactory even when an on-press-developable lithographic printing plate precursor is provided with these intermediate layers, and there has been a requirement for additional improvements with regard to scumming that takes the form of circular spots of from several μm to several thousand μm (referred to hereafter as spot scumming).

In addition, in a step that precedes mounting of the printing plate on the press in the case of lithographic printing plate precursors, the image on the printing plate is inspected and identified in order to determine whether image recording has been performed in accordance with the purpose of the printing plate. With the usual lithographic printing plate precursors that are accompanied by a development process step, the image recording layer is typically provided with color in advance. This facilitates identification of the image after platemaking (after the development process) and before printing (before mounting the printing plate on the press).

However, with on-press-developable or processless (developmentless) lithographic printing plate precursors, which are not accompanied by a development process prior to printing, there is no image on the printing plate at the stage where the printing plate is mounted on the press and inspection of the plate therefore cannot be performed. In particular, the ability to distinguish whether a register mark, which functions as a guide for registration in multicolor printing, has been written out is crucial for the printing process. Due to this, there is a requirement with on-press-developable or processless (developmentless) lithographic printing plate precursors for a means of checking the image at the stage where exposure or heating has occurred, that is, the exposed region or heated region must develop color or must decolorize.

Printing plates have been introduced that employ, as a print-out agent, a compound that generates acid, base, or a radical under the action of light or heat and a compound that changes color when it interacts with the generated acid, base, or radical (refer, for example, to Japanese Patent Application Publication No. Hei 11-277927). The utilization of the color change of a thermodegradable compound as a print-out agent has also been proposed for a direct-writing lithographic printing plate precursor that has a heat-sensitive layer (refer, for example, to Japanese Patent Application Publication No. 2000-335129). The use as the print-out agent of a thermodegradable dye that has a thermodegradation temperature no greater than 250° C. has also been proposed (refer, for example, to Japanese Patent Application Publication No. 2003-191657).

According to these cited technologies, colorization or decolorization is produced in the exposed areas, and, while the ability to check the image is improved to some degree, these technologies have been associated with various problems. For example, color development sufficient to check the image may not be obtained; dye that has undergo color development, or dye that has not been degraded by exposure and hence has not undergone decolorization, can stain the fountain solution and influence the finish of the printed material; insoluble dye may remain present in the ink or fountain solution; and the dye can react with components in the ink or fountain solution to produce a precipitate, i.e., scum.

DISCLOSURE OF THE INVENTION

Problem to be Solved by the Invention

An object of the present invention is to provide a lithographic printing plate precursor that, with the use of laser exposure, exhibits an excellent capacity for plate inspection, an excellent on-press development performance or gum development performance, and an excellent scumming behavior, while maintaining a satisfactory printing durability. An additional object is to provide a method of lithographic printing that uses this lithographic printing plate precursor.

Means to Solve the Problem

As a result of intensive investigations in order to achieve the objects cited above, the present inventor discovered, based on the use of a nonionic polymerization initiator that has a specific structure, a simple platemaking method and specifically a lithographic printing plate precursor that exhibits an excellent developability in on-press development and in gum development, an excellent capacity for plate inspection while maintaining a satisfactory printing durability, and an excellent scumming behavior, and a lithographic printing method that uses this lithographic printing plate precursor. The present invention was achieved based on this discovery. The lithographic printing plate precursor of the present invention can be employed as an on-press-developable lithographic printing plate precursor or as a gum-developable lithographic printing plate precursor.

That is, the present invention is as follows.

<1> A lithographic printing plate precursor that comprises an image recording layer having (A) a nonionic polymerization initiator that contains at least two cyclic imide structures, and (B) a compound that contains at least one addition-polymerizable ethylenically unsaturated bond.

<2> The aforementioned lithographic printing plate precursor, wherein the nonionic polymerization initiator (A) is a compound represented by the following general formula (1)

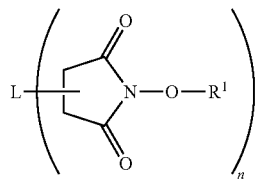

(1)

(in the formula, n represents an integer of at least 2, $R^1$ represents a monovalent organic group other than a hydrogen atom or represents a halogen atom, and L represents an organic linking group).

<3> The aforementioned lithographic printing plate precursor, wherein the nonionic initiator (A) is a compound represented by the following general formula (2) or (3)

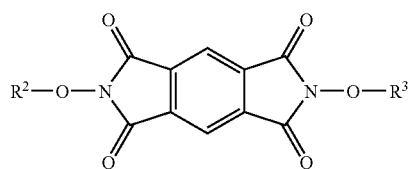

(2)

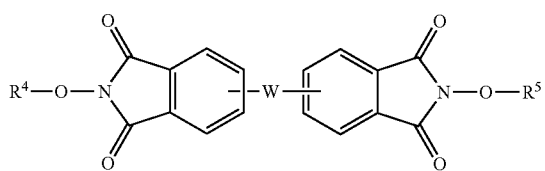

(3)

(in the formulas, $R^2$, $R^3$, $R^4$, and $R^5$ each independently represent a monovalent organic group other than a hydrogen atom or represents a halogen atom, and W represents a divalent organic linking group).

<4> The aforementioned lithographic printing plate precursor, that further has a protective layer.

<5> The aforementioned lithographic printing plate precursor, wherein the image recording layer further contains (C) an infrared absorber.

<6> The aforementioned lithographic printing plate precursor, wherein the infrared absorber (C) is a cyanine dye.

<7> The aforementioned lithographic printing plate precursor, wherein the infrared absorber (C) is a compound that contains a solvent-soluble group in the molecule.

<8> The aforementioned lithographic printing plate precursor, wherein the solvent-soluble group present in the infrared absorber (C) is at least one selected from the group consisting of an alkyloxy group, an aryloxy group, an alkyloxycarbonyl group, and an aryloxycarbonyl group.

<9> The aforementioned lithographic printing plate precursor, wherein the infrared absorber (C) has a cyanine dye structure represented by the following general formula (4) and has at least one solvent-soluble group in the molecule

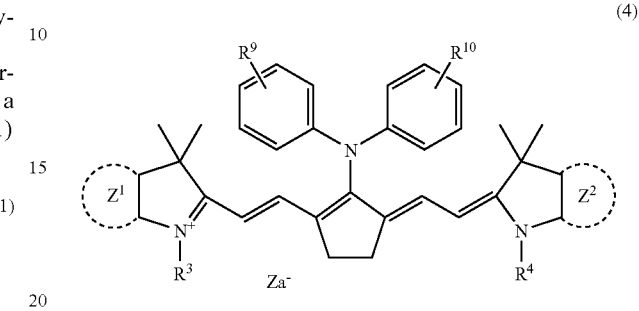

(4)

(in the formula, $Z^1$ and $Z^2$ each independently represent an optionally substituted aromatic ring or aromatic heterocycle, $R^3$ and $R^4$ each independently represent hydrocarbyl that contains no more than 20 carbons and that may be substituted, $R^9$ and $R^{10}$ each independently represent a hydrogen atom or an optionally substituted alkoxy group, and Za— represents a counteranion that is present when charge neutralization is required).

<10> The aforementioned lithographic printing plate precursor, wherein the infrared absorber (C) has a salt structure comprising a cation and an anion, and the anion moiety is an inorganic anion.

<11> The aforementioned lithographic printing plate precursor, wherein the image recording layer further contains (D) a binder polymer.

<12> A lithographic printing method, comprising the steps of:

imagewise exposing the lithographic printing plate precursor as described above using an infrared laser; and carrying out printing, without executing any development process, by supplying an oil-based ink and a water-based component to the lithographic printing plate precursor after exposure, wherein the portions of the image recording layer that are not exposed to the infrared laser are removed by the oil-based ink and/or water-based component during the course of the printing step.

Considered in more specific terms, this is a lithographic printing method in which the lithographic printing plate precursor is mounted on the press and subjected to imagewise exposure with a laser, or is subjected to imagewise exposure with a laser and is thereafter mounted on the plate, and printing is then carried out by supplying an oil-based ink and a water-based component to the lithographic printing plate precursor and removing the unexposed areas of the image recording layer.

<13> A lithographic printing method, comprising the steps of:

imagewise exposing the lithographic printing plate precursor as described above using a laser;

executing thereafter a development process with a gum solution to remove unexposed portions of the image recording layer; and then carrying out printing by supplying an oil-based ink and a water-based component to the lithographic printing plate precursor.

Effect of the Invention

The color-development mechanism of the present invention, which contributes to the plate inspection capacity, is unclear, but the following is hypothesized.

The nonionic polymerization initiator that has at least two cyclic imide structures in the molecule (the component (A) used in the present invention) produces radicals as a result of heating or exposure by the infrared laser and thereby functions to initiate and cause the development of the polymerization of the compound that has at least one addition-polymerizable ethylenically unsaturated bond (component (B)); in addition, electron transfer occurs from the infrared absorber (C), which has been excited by exposure with the infrared laser, to the (A) cyclic imide structure-containing nonionic polymerization initiator, with the appearance of an initiation activity. Accompanying this, it is thought that the infrared absorber (C) undergoes a structural change caused by the electron transfer, which brings about a color change. It is thought that due to the use of the (A) cyclic imide structure-containing nonionic polymerization initiator, electron transfer from the excited dye occurs and proceeds in an efficient manner, which results in a large color change and thus yields an excellent visualization, and in combination therewith a high-strength cured image is formed.

The following advantages also accrue: the image recording layer can be uniformly applied in a highly concentrated state; also, there is a diminution of the scum production, fountain solution staining, and spot scumming that are caused during on-press development by components in the image forming layer.

The lithographic printing plate precursor of the present invention has an excellent on-press developability and when on-press development is begun can reduce the amount of printing paper required until a condition is reached in which the ink is not transferred to nonimage areas, that is, it can reduce the number of wasted paper sheets. In addition, the lithographic printing plate precursor of the present invention has an excellent printing durability and thus provides a good productivity and enables high quality printing.

The lithographic printing plate precursor of the present invention also has an excellent developability with gum solutions, and when subjected to a simple platemaking procedure using gum development it exhibits an excellent fine line reproducibility and also exhibits an excellent printing durability and thus provides a good productivity and enables high quality printing.

The lithographic printing plate precursor of the present invention has the ability to exhibit a satisfactory printing durability using laser exposure and can combine printing durability with a fitness or suitability for simplified platemaking (on-press development or gum development).

In addition, the lithographic printing plate precursor of the present invention exhibits an excellent plate inspection capacity and can provide a reduction in the spot scumming caused by contamination of the nonimage areas; this makes it possible to provide a good quality printed material.

The present invention can provide, using laser exposure and maintaining a satisfactory printing durability therewith, an on-press-developable lithographic printing plate precursor that exhibits an excellent capacity for plate inspection, an excellent on-press development performance, and an excellent scumming behavior. The present invention can also provide a lithographic printing method that uses this on-press-developable lithographic printing plate precursor. In addition, the present invention can provide, using laser exposure and maintaining a satisfactory printing durability therewith, a lithographic printing plate precursor that exhibits an excellent capacity for plate inspection, an excellent gum developability, and an excellent scumming behavior. The present invention can also provide a lithographic printing method that uses this lithographic printing plate precursor.

BRIEF DESCRIPTION OF THE DRAWINGS

FIG. 1 shows in schematic form the structure of an example of an automatic developer that can be used for carrying out development with a gum solution, wherein the reference numbers in the FIGURE are defined as follows: 1 refers to a rotating brush roll, 2 refers to a receiving roll, 3 refers to a transport roll, 4 refers to a transport guide plate, 5 refers to a spray pipe, 6 refers to a conduit, 7 refers to a filter, 8 refers to a plate feed table, 9 refers to a plate discharge table, 100 refers to a developing fluid tank, 101 refers to a circulation pump, and 102 refers to a plate

MODE FOR CARRYING OUT THE INVENTION

The invention is described in detail in the following.
The Lithographic Printing Plate Precursor The image recording layer of the lithographic printing plate precursor of the present invention characteristically comprises (A) a nonionic polymerization initiator that has at least two cyclic imide structures in the molecule and (B) a compound that has at least one addition-polymerizable ethylenically unsaturated bond, and preferably further comprises (C) an infrared absorber.

This image recording layer can be imaged by exposure to infrared radiation and is a so-called on-press-developable image recording layer in that after the image has been recorded by infrared exposure the image recording layer is submitted to the printing step without going through any wet developing process step and by printing the nonimage areas are removed by the oil-based component/hydrophilic component (e.g., ink and/or fountain solution) during the course of printing.

The individual constituent components of the image recording layer are described in detail in the following.

<(A) The Nonionic Polymerization Initiator that Gas at Least Two Cyclic Imide Structures>

This nonionic polymerization initiator can first of all be a compound represented by the following general formula (1)

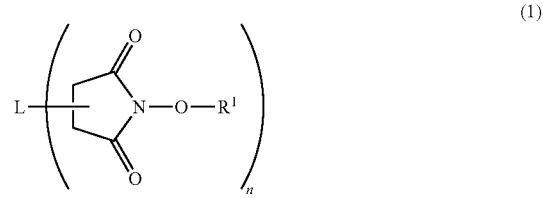

(in the formula, n represents an integer of at least 2, $R^1$ represents a monovalent organic group other than a hydrogen atom or represents a halogen atom, and L represents an organic linking group).

The monovalent organic group and halogen atom represented by $R^1$ will now be described.

The monovalent organic group in those instances where $R^1$ represents a monovalent organic group can be exemplified by the amino group, substituted amino groups, substituted carbonyl groups, the hydroxyl group, substituted oxy groups, thiol groups, thioether groups, silyl groups, the nitro group, the cyano group, alkyl groups, alkenyl groups, alkynyl groups, aryl groups, heterocyclic groups, the sulfo group, substituted sulfonyl groups, sulfonato, substituted sulfinyl, phosphono, substituted phosphono groups, phosphonato, substituted phosphonato groups, and so forth, wherein substituents may additionally be present when their introduction is possible.

The alkyl represented by $R^1$ can be exemplified by straight chain, branched, and cyclic alkyl having from 1 to 20 carbons. More preferred thereamong are straight chain alkyl having from 1 to 12 carbons, branched alkyl having from 3 to 12 carbons, and cyclic alkyl having from 5 to 10 carbons. Specific examples are as follows: methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neopentyl, 1-methylbutyl, isohexyl, 2-ethylhexyl, 2-methylhexyl, cyclohexyl, cyclopentyl, and 2-norbornyl.

When the alkyl represented by $R^1$ bears a substituent group (i.e., when it is a substituted alkyl group), the alkyl moiety of the substituted alkyl group can then be the divalent organic residue obtained by removing any one of the hydrogen atoms on the $C_{1-20}$ alkyl described above; the preferred ranges for the number of carbons are also the same as for the alkyl described above.

Preferred specific examples for the case in which $R^1$ is substituted alkyl are as follows: chloromethyl, bromomethyl, 2-chloroethyl, trifluoromethyl, methoxymethyl, methoxycarbonylmethyl, isopropoxymethyl, butoxymethyl, s-butoxybutyl, methoxyethoxyethyl, allyloxymethyl, phenoxymethyl, acetyloxymethyl, methylthiomethyl, tolylthiomethyl, pyridylmethyl, tetramethylpiperidinylmethyl, N-acetyltetramethylpiperidinylmethyl, trimethylsilylmethyl, methoxyethyl, ethylaminoethyl, diethylaminopropyl, morpholinopropyl, acetyloxymethyl, benzoyloxymethyl, N-cyclohexylcarbamoyloxyethyl, N-phenylcarbamoyloxyethyl, acetylaminoethyl, N-methylbenzoylaminopropyl, 2-oxoethyl, 2-oxopropyl, carboxypropyl, methoxycarbonylethyl, allyloxycarbonylbutyl, chlorophenoxycarbonylmethyl,
carbamoylmethyl, N-methylcarbamoylethyl, N,N-dipropylcarbamoylmethyl, N-(methoxyphenyl)carbamoylethyl, N-methyl-N-(sulfophenyl)carbamoylmethyl, sulfobutyl, sulfonatobutyl, sulfamoylbutyl, N-ethylsulfamoylmethyl, N,N-dipropylsulfamoylpropyl, N-tolylsulfamoylpropyl, N-methyl-N-(phosphonophenyl)sulfamoyloctyl, phosphonobutyl, phosphonatohexyl, diethylphosphonobutyl, diphenylphosphonopropyl, methylphosphonobutyl, methylphosphonatobutyl, tolylphosphonohexyl, tolylphosphonatohexyl, phosphonooxypropyl, phosphonatooxybutyl, benzyl, phenethyl, α-methylbenzyl, 1-methyl-1-phenylethyl, p-methylbenzyl, cinnamyl, allyl, 1-propenylmethyl, 2-butenyl, 2-methylallyl, 2-methylpropenylmethyl, 2-propynyl, 2-butynyl, 3-butynyl, and so forth.

The substituents that can be introduced into the alkyl represented by $R^1$ are exemplified by the substituents described in the preceding description of substituted alkyl groups and also by the monovalent substituents composed of nonmetal atoms that are exemplified in the following. Preferred examples that include the above-described substituents are as follows: halogen atoms (—F, —Br, —Cl, —I), the hydroxyl group, alkoxy, aryloxy, the mercapto group, alkylthio, arylthio, alkyldithio, aryldithio, the amino group, N-alkylamino, N,N-dialkylamino, N-arylamino, N,N-diarylamino, N-alkyl-N-arylamino, acyloxy, carbamoyloxy, N-alkylcarbamoyloxy, N-arylcarbamoyloxy, N,N-dialkylcarbamoyloxy, N,N-diarylcarbamoyloxy, N-alkyl-N-arylcarbamoyloxy, alkylsulfoxy, arylsulfoxy, acylthio, acylamino, N-alkylacylamino, N-arylacylamino, the ureido group, N'-alkylureido, N',N'-dialkylureido, N'-arylureido, N',N'-diarylureido, N'-alkyl-N'-arylureido, N-alkylureido, N-arylureido, N'-alkyl-N-alkylureido, N'-alkyl-N-arylureido, N',N'-dialkyl-N-alkylureido, N',N'-dialkyl-N-arylureido, N'-aryl-N-alkylureido, N'-aryl-N-arylureido, N',N'-diaryl-N-alkylureido, N',N'-diaryl-N-arylureido, N'-alkyl-N'-aryl-N-alkylureido, N'-alkyl-N'-aryl-N-arylureido, alkoxycarbonylamino, aryloxycarbonylamino, N-alkyl-N-alkoxycarbonylamino, N-alkyl-N-aryloxycarbonylamino, N-aryl-N-alkoxycarbonylamino, N-aryl-N-aryloxycarbonylamino, the formyl group, acyl, the carboxyl group, alkoxycarbonyl, aryloxycarbonyl, the carbamoyl group, N-alkylcarbamoyl, N,N-dialkylcarbamoyl, N-arylcarbamoyl, N,N-diarylcarbamoyl, N-alkyl-N-arylcarbamoyl, alkylsufinyl, arylsulfinyl, alkylsulfonyl, arylsulfonyl, the sulfo group (—SO$_3$H) and its conjugate base (referred to as the sulfonato group), alkoxysulfonyl, aryloxysulfonyl, sulfinamoyl, N-alkylsulfinamoyl, N,N-dialkylsulfinamoyl, N-arylsulfinamoyl, N,N-diarylsulfinamoyl, N-alkyl-N-arylsulfinamoyl, sulfamoyl, N-alkylsulfamoyl, N,N-dialkylsulfamoyl, N-arylsulfamoyl, N,N-diarylsulfamoyl, N-alkyl-N-arylsulfamoyl, the phosphono group (—PO$_3$H$_2$) and its conjugate base (referred to as the phosphonato group), dialkylphosphono (—PO$_3$(alkyl)$_2$), diarylphosphono (—PO$_3$(aryl)$_2$), alkylarylphosphono (—PO$_3$(aryl)(alkyl)), monoalkylphosphono (—PO$_3$H(alkyl)) and its conjugate base (referred to as the alkylphosphonato group), monoarylphosphono (—PO$_3$H(aryl)) and its conjugate base (referred to as the arylphosphonato group), phosphonooxy (—OPO$_3$H$_2$) and its conjugate base (referred to as the phosphonatooxy group), dialkylphosphonooxy (—OPO$_3$(alkyl)$_2$), diarylphosphonooxy (—OPO$_3$(aryl)$_2$), alkylarylphosphonooxy (—OPO$_3$(aryl)(alkyl)), monoalkylphosphonooxy (—OPO$_3$H(alkyl)) and its conjugate base (referred to as the alkylphosphonatooxy group), monoarylphosphonooxy (—OPO$_3$H(aryl)) and its conjugate base (referred to as the arylphosphonatooxy group), the cyano group, the nitro group, aryl, alkenyl, alkynyl, heterocyclics, silyl, and so forth.

The alkyl moiety in the substituent introducible into the alkyl represented by $R^1$ is specifically exemplified as in the above-described case in which $R^1$ is substituted alkyl, and the preferred ranges are also the same. The following are specific examples of the aryl moiety in the substituent capable of introduction into the alkyl represented by $R^1$: phenyl, biphenyl, naphthyl, tolyl, xylyl, mesityl, cumenyl, chlorophenyl, bromophenyl, chloromethylphenyl, hydroxyphenyl, methoxyphenyl, ethoxyphenyl, phenoxyphenyl, acetoxyphenyl, benzoyloxyphenyl, methylthiophenyl, phenylthiophenyl, methylaminophenyl, dimethylaminophenyl, acetylaminophenyl, carboxyphenyl, methoxycarbonylphenyl, ethoxyphenylcarbonyl, phenoxycarbonylphenyl, N-phenylcarbamoylphenyl, cyanophenyl, sulfophenyl, sulfonatophenyl, phosphonophenyl, phosphonatophenyl, and so forth.

The alkenyl represented by $R^1$ can be exemplified by $C_{2-20}$ alkenyl. Preferred thereamong is $C_{2-10}$-alkenyl, while $C_{2-8}$ alkenyl is more preferred. The alkenyl group may additionally bear a substituent. Introducible substituents can be exemplified by halogen atoms, alkyl, substituted alkyl, aryl, and substituted aryl. Halogen atoms and $C_{1-10}$ straight-chain, branched, and cyclic alkyl are preferred. The alkenyl can be specifically exemplified by vinyl, 1-propenyl, 1-butenyl, cinnamyl, 1-pentenyl, 1-hexenyl, 1-octenyl, 1-methyl-1-propenyl, 2-methyl-1-propenyl, 2-methyl-1-butenyl, 2-phenyl-1-ethenyl, 2-chloro-1-ethenyl, and so forth.

The alkynyl represented by $R^1$ can be exemplified by $C_{2-20}$ alkynyl. Preferred thereamong is $C_{2-10}$ alkynyl, while $C_{2-8}$ alkynyl is more preferred. Specific examples are ethynyl, 1-propynyl, 1-butynyl, phenylethynyl, trimethylsilylethynyl, and so forth.

The aryl represented by $R_1$ is exemplified by the benzene ring, condensed ring systems formed from 2 or 3 benzene rings, and condensed ring systems formed from benzene and a five-membered unsaturated ring. Specific examples are phenyl, naphthyl, anthryl, phenanthryl, indenyl, acenaphthenyl, and fluorenyl. Preferred thereamong are phenyl and naphthyl.

The aryl represented by $R^1$ may have a substituent on the ring-forming carbon, and this substituent can be exemplified by monovalent substituents that are composed of nonmetal atoms. Preferred examples of substituents that can be introduced are the aforementioned alkyl and substituted alkyl and the substituents cited in the description of the substituents for substituted alkyl.

The heterocyclic group represented by $R^1$ is preferably a 3- to 8-membered heterocyclic ring; 3- to 6-membered heterocyclic rings that contain a nitrogen atom, oxygen atom, or sulfur atom are more preferred; and 5- or 6-membered heterocyclic rings that contain a nitrogen atom, oxygen atom, or sulfur atom are even more preferred. Specific examples are the pyrrole ring, furan ring, thiophene ring, benzopyrrole ring, benzofuran ring, benzothiophene ring, pyrazole ring, isoxazole ring, isothiazole ring, indazole ring, benzoisoxazole ring, benzoisothiazole ring, imidazole ring, oxazole ring, thiazole ring, benzimidazole ring, benzoxazole ring, benzothiazole ring, pyridine ring, quinoline ring, isoquinoline ring, pyridazine ring, pyrimidine ring, pyrazine ring, phthalazine ring, quinazoline ring, quinoxaline ring, aziridine ring, phenanthridine ring, carbazole ring, purine ring, pyran ring, piperidine ring, piperazine ring, morpholine ring, indole ring, indolizine ring, chromene ring, cinnoline ring, acridine ring, phenothiazine ring, tetrazole ring, triazine ring, and so forth.

The heterocyclic ring represented by $R^1$ may have a substituent on the ring-forming carbon, and this substituent can be exemplified by monovalent substituents that are composed of nonmetal atoms. Preferred examples of substituents that can be introduced are the aforementioned alkyl and substituted alkyl and the substituents cited in the description of the substituents for substituted alkyl.

The silyl represented by $R^1$ is preferably $C_{0-30}$ silyl, more preferably $C_{3-20}$ silyl, and even more preferably $C_{3-10}$ silyl, in each case optionally bearing a substituent. Specific examples are trimethylsilyl, triethylsilyl, tripropylsilyl, triisopropylsilyl, cyclohexyldimethylsilyl, dimethylvinylsilyl, and so forth.

The thiol group represented by $R^1$ is preferably a $C_{0-30}$ thiol group, more preferably a $C_{3-20}$ thiol group, and even more preferably a $C_{1-10}$ thiol group, in each case optionally bearing a substituent. Specific examples are mercaptomethyl, mercaptoethyl, 4-mercaptocyclohexyl, 4-mercaptophenyl, and so forth.

The thioether group represented by $R^1$ is preferably a $C_{0-30}$ thioether group, more preferably a $C_{3-20}$ thioether group, and even more preferably a $C_{1-10}$ thioether group, in each case optionally bearing a substituent.

The thioether group can be specifically exemplified by alkylthio groups such as methylthio, ethylthio, cyclohexylthio, and so forth and by arylthio groups such as phenylthio and so forth.

The halogen atom represented by $R^1$ can be exemplified by the fluorine atom, bromine atom, chlorine atom, and iodine atom, with the chlorine atom and bromine atom being preferred thereamong.

The substituted oxy group ($R^{06}O-$) can be a substituted oxy group in which $R^{06}$ is a monovalent nonmetal atomic group excluding the hydrogen atom. Preferred substituted oxy groups can be exemplified by alkoxy, aryloxy, acyloxy, carbamoyloxy, N-alkylcarbamoyloxy, N-arylcarbamoyloxy, N,N-dialkylcarbamoyloxy, N,N-diarylcarbamoyloxy, N-alkyl-N-arylcarbamoyloxy, alkylsulfoxy, arylsulfoxy, phosphonooxy, and phosphonatooxy. The alkyl and aryl therein can be exemplified by those given for the previously described alkyl and substituted alkyl and aryl and substituted aryl. The acyl group ($R^{07}CO-$) in the acyloxy group can be exemplified by acyl in which $R^{07}$ is an alkyl, substituted alkyl, aryl, or substituted aryl previously cited as an example. Among the substituents under consideration, alkoxy, aryloxy, acyloxy, and arylsulfoxy are more preferred. The following are specific examples of preferred substituted oxy groups: methoxy, ethoxy, propyloxy, isopropyloxy, butyloxy, pentyloxy, hexyloxy, dodecyloxy, benzyloxy, allyloxy, phenethyloxy, carboxyethyloxy, methoxycarbonylethyloxy, ethoxycarbonylethyloxy, methoxyethoxy, phenoxyethoxy, methoxyethoxyethoxy, ethoxyethoxyethoxy, morpholinoethoxy, morpholinopropyloxy, allyloxyethoxyethoxy, phenoxy, tolyloxy, xylyloxy, mesityloxy, mesityloxy, cumenyloxy, methoxyphenyloxy, ethoxyphenyloxy, chlorophenyloxy, bromophenyloxy, acetyloxy, benzoyloxy, naphthyloxy, phenylsulfonyloxy, phosphonooxy, phosphonatooxy, and so forth.

The amino group may be a substituted amino group, which also encompasses amide groups. This amide-inclusive substituted amino group ($R^{08}NH-$, $(R^{09})(R^{010})N-$) may be such a group in which $R^{08}$, $R^{09}$, and $R^{010}$ are monovalent nonmetal atomic groups excluding the hydrogen atom. $R^{09}$ and $R^{010}$ may be bonded to each other to form a ring. The following are preferred examples of the substituted amino group: N-alkylamino, N,N-dialkylamino, N-arylamino, N,N-diarylamino, N-alkyl-N-arylamino, acylamino, N-alkylacylamino, N-arylacylamino, the ureido group, N'-alkylureido, N',N'-dialkylureido, N'-arylureido, N',N'-diarylureido, N'-alkyl-N'-arylureido, N-alkylureido, N-arylureido, N'-alkyl-N-alkylureido, N'-alkyl-N-arylureido, N',N'-dialkyl-N-alkylureido, N'-alkyl-N'-arylureido, N',N'-dialkyl-N-alkylureido, N',N'-dialkyl-N'-arylureido, N'-aryl-N-alkylureido, N'-aryl-N-arylureido, N',N'-diaryl-N-alkylureido, N',N'-diaryl-N-arylureido, N'-alkyl-N'-aryl-N-alkylureido, N'-alkyl-N'-aryl-N-arylureido, alkoxycarbonylamino, aryloxycarbonylamino, N-alkyl-N-alkoxycarbonylamino, N-alkyl-N-aryloxycarbonylamino, N-aryl-N-alkoxycarbonylamino, and N-aryl-N-aryloxycarbonylamino. The alkyl and aryl in the preceding can be exemplified by those given for the previously described alkyl and substituted alkyl and aryl and substituted aryl. The $R^{07}$ in the acyl group ($R^{07}CO-$) in the acylamino, N-alkylacylamino, and N-arylacylamino is as previously described. More preferred among the preceding are N-alkylamino, N,N-dialkylamino, N-arylamino, and acylamino. Specific examples of preferred substituted amino groups are as follows: methylamino, ethylamino, diethylamino, morpholino, piperidino, pyrrolidino, phenylamino, benzoylamino, and acetylamino.

The substituted sulfonyl ($R^{011}-SO_2-$) can be such a group in which $R^{011}$ is a monovalent nonmetal atomic group. Particularly preferred examples are alkylsulfonyl, arylsulfonyl, and substituted and unsubstituted sulfamoyl. The alkyl and aryl in the preceding can be exemplified by those given for the previously described alkyl and substituted alkyl and aryl and substituted aryl. This substituted sulfonyl can be specifically exemplified by butylsulfonyl, phenylsulfonyl, chlorophenylsulfonyl, sulfamoyl, N-alkylsulfamoyl, N,N-dialkylsulfamoyl, N-arylsulfamoyl, N-alkyl-N-arylsulfamoyl, and so forth.

The sulfonato group (—SO$_3$—) denotes, as previously described, the conjugate base anion of the sulfo group (—SO$_3$H), and its use in combination with a countercation is generally preferred. This countercation can be exemplified by the generally known countercations, i.e., the various onium species (ammonium species, sulfonium species, phosphonium species, iodonium species, azinium species, and so forth) and metal ions (Na$^+$, K$^+$, Ca$^{2+}$, Zn$^{2+}$, and so forth).

The substituted carbonyl group (R$^{O13}$—CO—) can be such a group in which R$^{O13}$ is a monovalent nonmetal atomic group. Preferred examples of the substituted carbonyl group are formyl, acyl, carboxyl, alkoxycarbonyl, aryloxycarbonyl, carbamoyl, N-alkylcarbamoyl, N,N-dialkylcarbamoyl, N-arylcarbamoyl, N,N-diarylcarbamoyl, and N-alkyl-N'-arylcarbamoyl. The alkyl and aryl in the preceding can be exemplified by those given for the previously described alkyl and substituted alkyl and aryl and substituted aryl. Substituted carbonyl that is more preferred among the preceding can be exemplified by formyl, acyl, carboxyl, alkoxycarbonyl, aryloxycarbonyl, carbamoyl, N-alkylcarbamoyl, N,N-dialkylcarbamoyl, and N-arylcarbamoyl. Formyl, acyl, alkoxycarbonyl, and aryloxycarbonyl are even more preferred. Specific examples of preferred substituted carbonyl groups are as follows: formyl, acetyl, benzoyl, carboxyl, methoxycarbonyl, ethoxycarbonyl, allyloxycarbonyl, dimethylaminophenylethenylcarbonyl, methoxycarbonylmethoxycarbonyl, N-methylcarbamoyl, N-phenylcarbamoyl, N,N-diethylcarbamoyl, morpholinocarbonyl, and so forth.

The substituted sulfinyl (R$^{O14}$—SO—) can be such a group in which R$^{O14}$ is a monovalent nonmetal atomic group. Preferred examples are alkylsulfinyl, arylsulfinyl, sulfinamoyl, N-alkylsulfinamoyl, N,N-dialkylsulfinamoyl, N-arylsulfinamoyl, N,N-diarylsulfinamoyl, and N-alkyl-N-arylsulfinamoyl. The alkyl and aryl in the preceding can be exemplified by those given for the previously described alkyl and substituted alkyl and aryl and substituted aryl. Alkylsulfinyl and arylsulfinyl are examples more preferred from among the preceding. Specific examples of such substituted sulfinyl groups are hexylsulfinyl, benzylsulfinyl, and tolylsulfinyl.

The substituted phosphono group denotes a group generated by substituting one or two of the hydroxyl groups in the phosphono group with another organic oxo group. Preferred examples are the previously cited dialkylphosphono group, diarylphosphono group, alkylarylphosphono group, monoalkylphosphono group, and monoarylphosphono group. More preferred thereamong are the dialkylphosphono group and diarylphosphono group. Specific examples thereof are diethylphosphono, dibutylphosphono, and diphenylphosphono.

The phosphonato group (—PO$_3^{2-}$, —PO$_3$H—) denotes the conjugate base anion originating with the first or second acid dissociation of the phosphono group (—PO$_3$H$_2$). The use in combination with a countercation is generally preferred. This countercation can be exemplified by the generally known countercations, i.e., the various onium species (ammonium species, sulfonium species, phosphonium species, iodonium species, azinium species, and so forth) and metal ions (Na$^+$, K$^+$, Ca$^{2+}$, Zn$^{2+}$, and so forth).

The substituted phosphonato group is the conjugate base anion of a substituted phosphono group in which, among the previously cited substituted phosphono groups, one organic oxo group has been substituted for hydroxyl and is specifically exemplified by the conjugate base of the previously cited monoalkylphosphono group (—PO$_3$H(alkyl)) and the conjugate base of the previously cited monoarylphosphono group (—PO$_3$H(aryl)).

Preferred embodiments of R$^1$ are as follows: C$_{1-20}$ optionally substituted alkyl or carbonyl is preferred; C$_{1-15}$ optionally substituted alkyl or carbonyl is more preferred; and C$_{1-10}$ optionally substituted alkyl or carbonyl is even more preferred.

The organic linking group represented by L can be a polyvalent organic group composed of nonmetal atoms and is preferably composed of from 1 to 60 carbon atoms, from 0 to 10 nitrogen atoms, from 0 to 50 oxygen atoms, from 1 to 100 hydrogen atoms, and from 0 to 20 sulfur atoms. Preferred specific examples for the example of a divalent organic linking group L are branched and straight chain alkylene, the oxy group, the carbonyl group, and the sulfonyl group.

The organic linking group represented by L may also have a structure comprising a ring condensed with each of the at least two imide rings. Thus, for example, the compound represented by general formula (1) can be a compound in which the imide rings are connected to each other through an aromatic ring or rings, a heterocyclic ring or rings, or an aliphatic ring or rings; preferred thereamong are compounds in which the imide rings are connected to each other by an aromatic ring or rings or a heterocyclic ring or rings.

The organic linking group represented by L may also bear a substituent, and introducible substituent groups can be exemplified by halogen atoms, the hydroxyl group, the carboxyl group, the sulfonato group, the nitro group, the cyano group, amide groups, the amino group, alkyl, alkenyl, alkynyl, aryl, halogenated alkyl, substituted oxy groups, substituted sulfonyl groups, substituted carbonyl groups, substituted sulfinyl groups, the sulfo group, phosphono, phosphonato, silyl, heterocycles, and so forth.

Compounds with general formula (2) and (3) below are more specific examples of the component (A) used by the present invention, i.e., a nonionic polymerization initiator that has at least two cyclic imide structures in the molecule, and are described below.

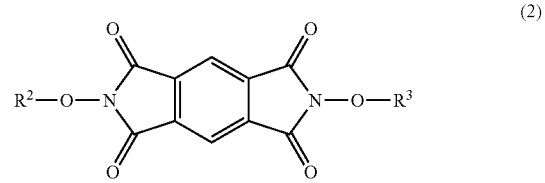

(2)

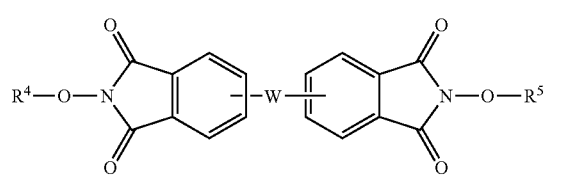

(3)

(in the formulas, R$^2$, R$^3$, R$^4$, and R$^5$ each independently represent a halogen atom or a monovalent organic group excluding the hydrogen atom and W represents a divalent organic linking group).

R$^2$ to R$^5$ in general formulas (2) and (3) have the same definitions as the halogen atom and monovalent organic group represented by R$^1$ in the previously cited general formula (1) and their preferred ranges are also the same. W in general formula (3) has the same definition as the organic linking group represented by L in general formula (1). W can be, for example, the branched and straight chain alkylene, oxy, carbonyl, sulfonyl, and so forth cited as divalent organic linking groups in the definition of L given above, and these groups may also bear the same substituents as for the previously described L.

Specific examples of compounds represented by general formulas (1) to (3) are listed below as exemplary compounds (A-1) to (A-48), but the scope of the present invention is not limited to these.

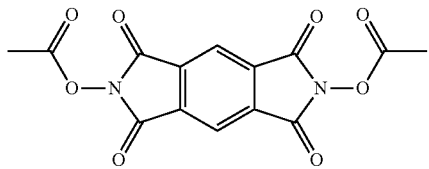
(A-1)

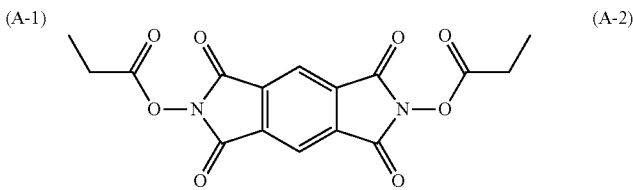
(A-2)

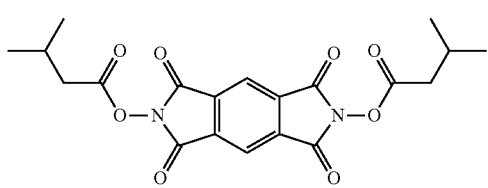
(A-3)

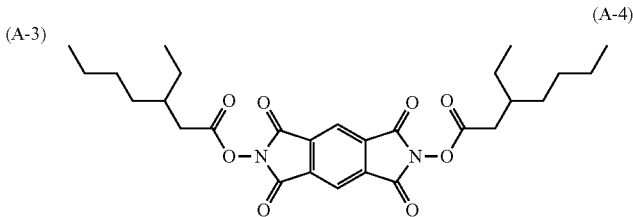
(A-4)

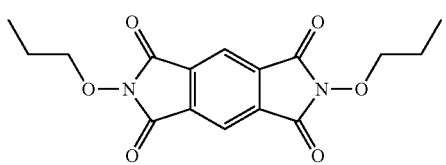
(A-5)

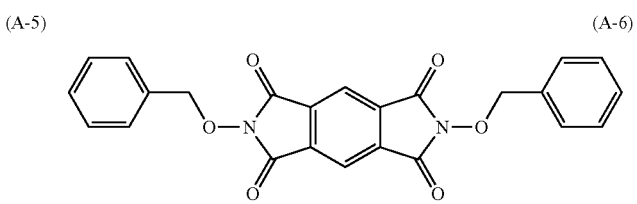
(A-6)

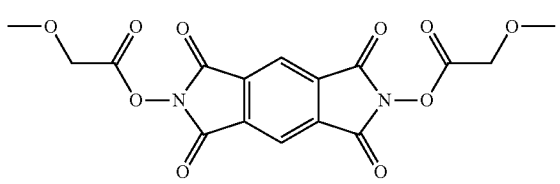
(A-7)

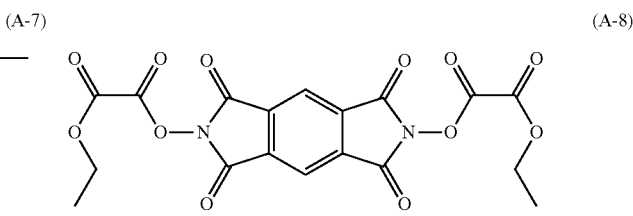
(A-8)

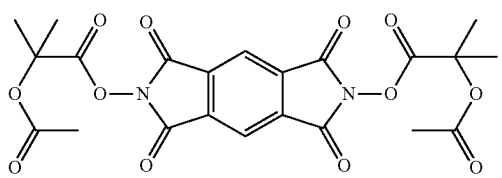
(A-9)

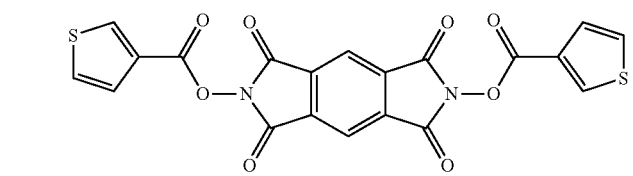
(A-10)

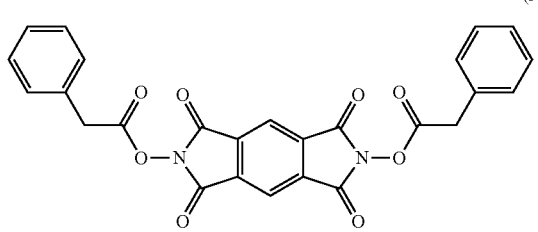
(A-11)

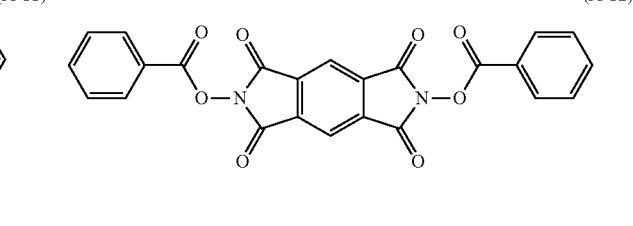
(A-12)

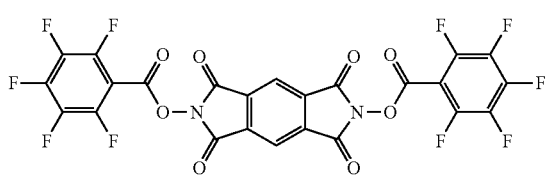
(A-13)

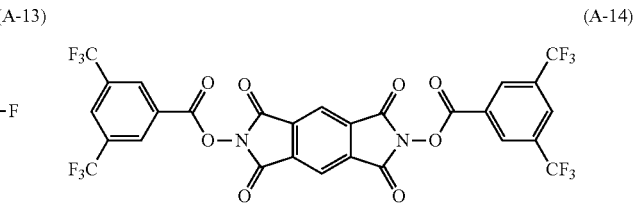
(A-14)

-continued
(A-15) 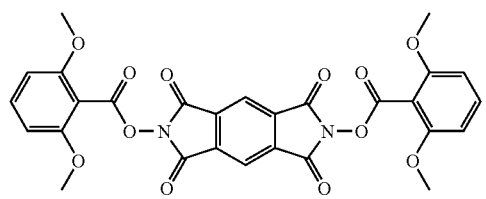
(A-16) 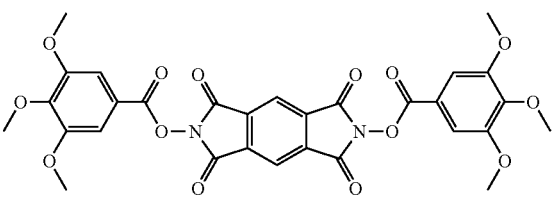
(A-17) 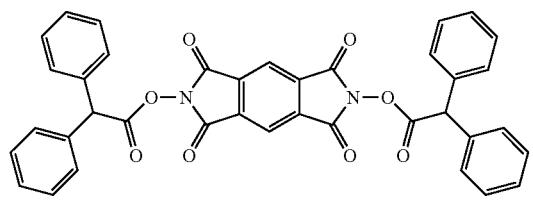
(A-18) 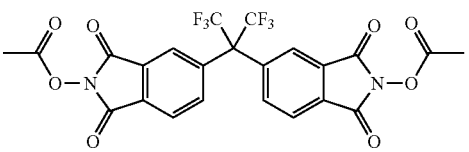
(A-19) 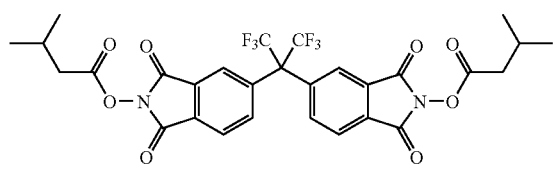
(A-20) 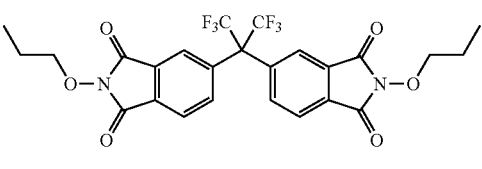
(A-21) 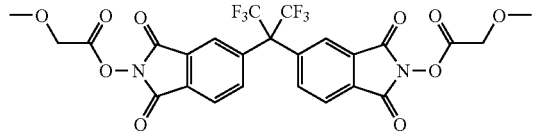
(A-22) 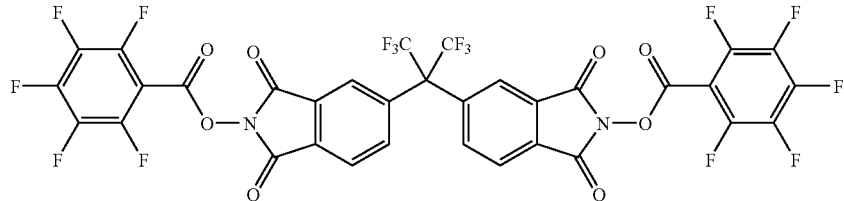
(A-23) 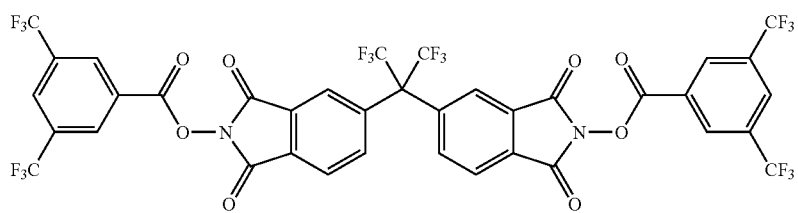
(A-24) 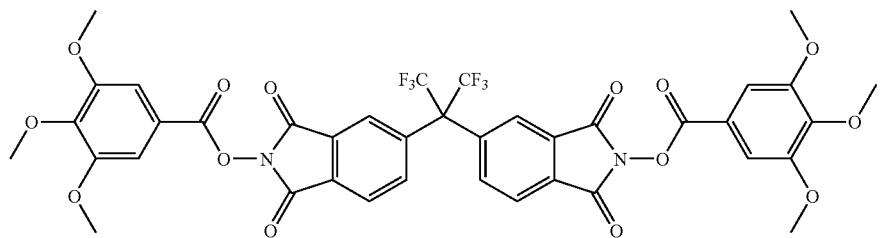
(A-25) 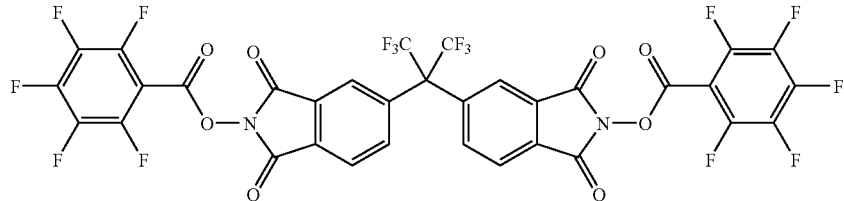
(A-26) 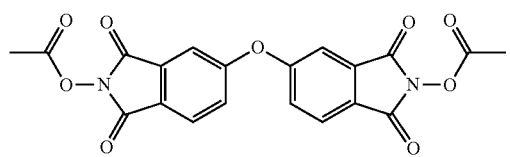
(A-27) 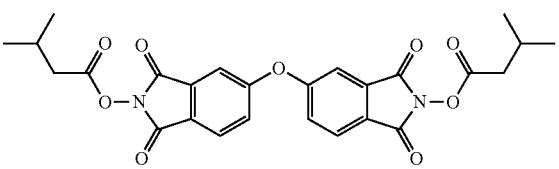

(A-28) 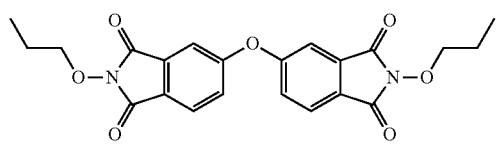
(A-29) 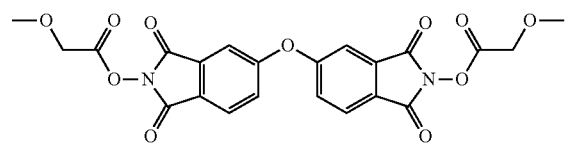
(A-30) 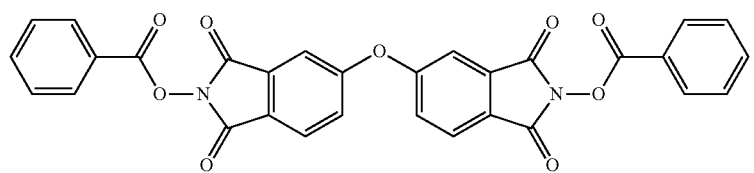
(A-31) 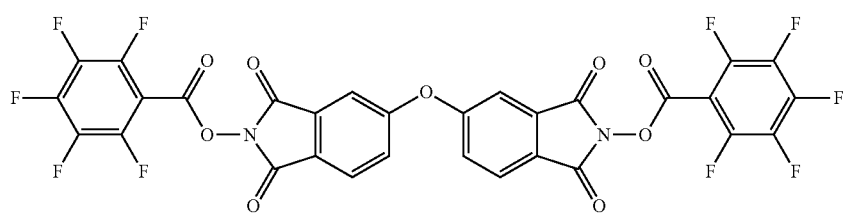
(A-32) 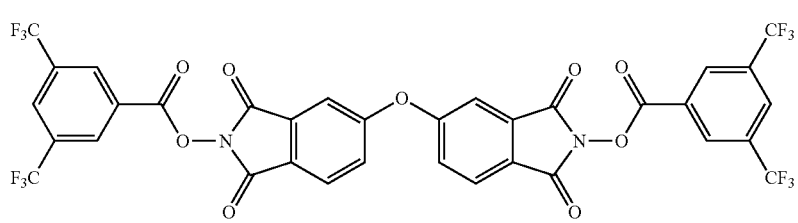
(A-33) 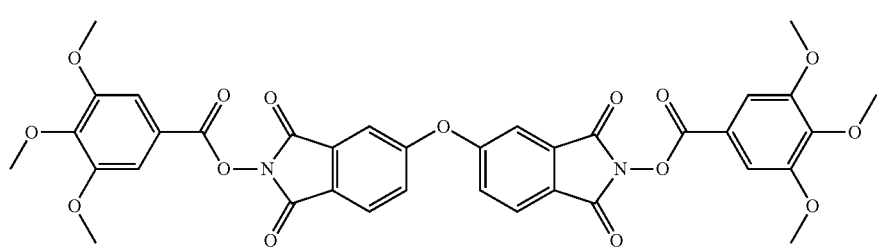
(A-34) 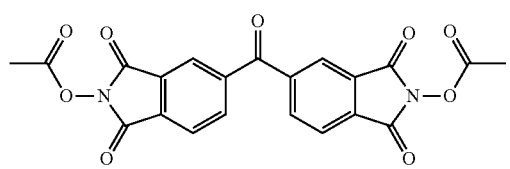
(A-35) 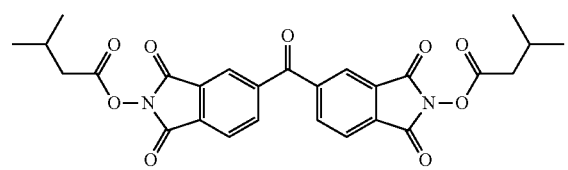
(A-36) 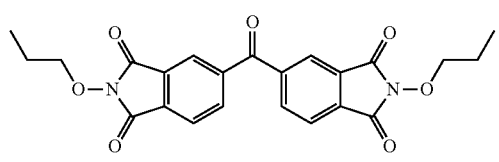
(A-37)
(A-38) 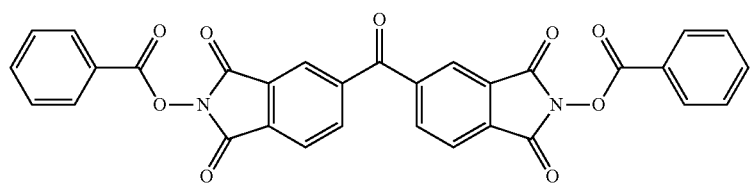

-continued
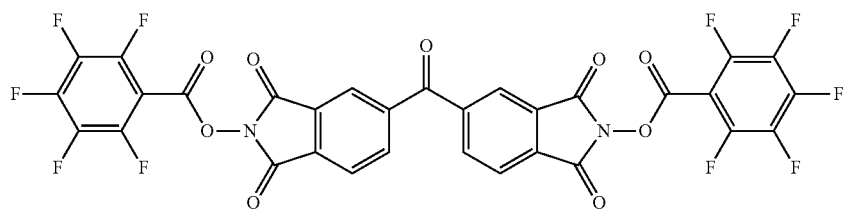
(A-39)
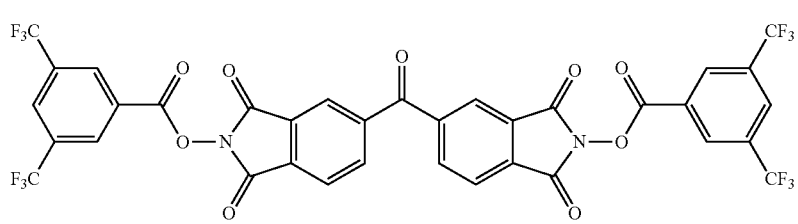
(A-40)
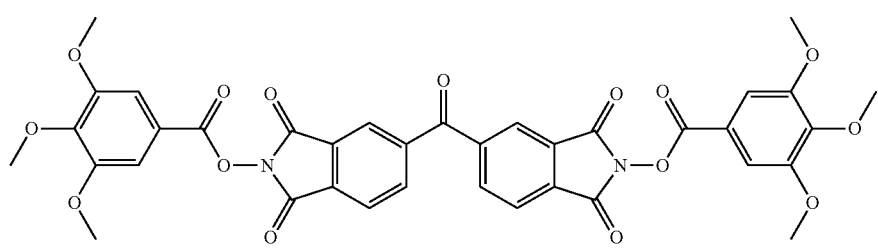
(A-41)
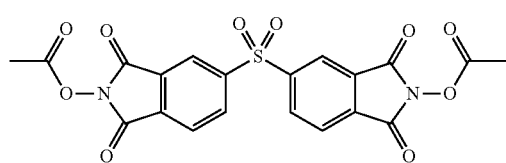
(A-42)
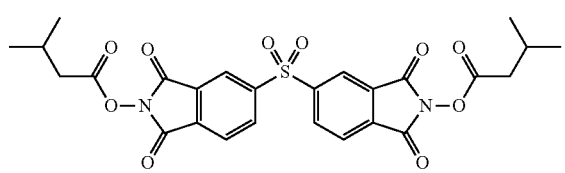
(A-43)
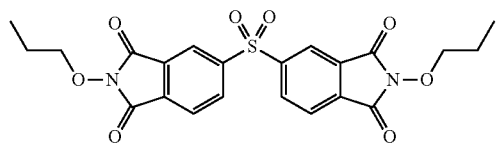
(A-44)
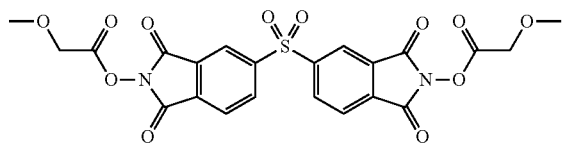
(A-45)
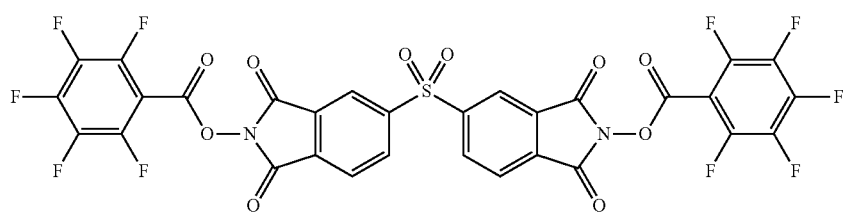
(A-46)
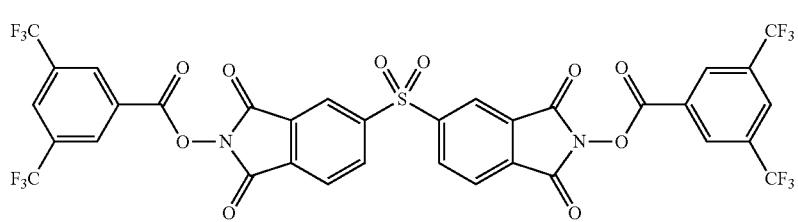
(A-47)

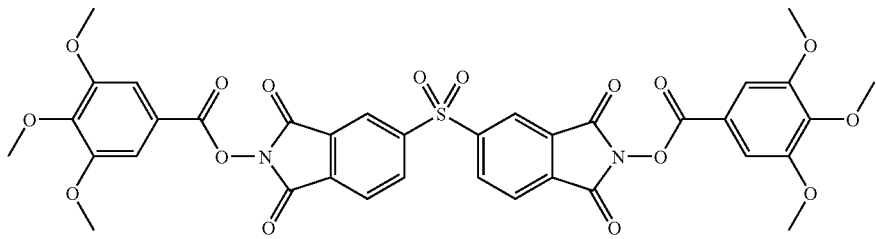
(A-48)

Only a single (A) cyclic imide structure-containing nonionic polymerization initiator may be used or two or more may be used in combination. In this case, combinations of a dimer or polymer with a different compound can also be used.

The content in the present invention of the (A) cyclic imide structure-containing nonionic polymerization initiator is preferably 0.1 to 50 mass %, more preferably 0.5 to 30 mass %, and even more preferably 1 to 20 mass %, in each case with reference to the total solids fraction in the image recording layer of the lithographic printing plate precursor.

For embodiments that employ a compound represented by general formula (2) or a compound represented by general formula (3), the suitable range for the content in the polymerizable composition is also the same as above.

When the content is in the cited range, an excellent sensitivity is obtained, as is an excellent resistance to scumming in the nonimage regions during printing. This polymerization initiator may be added to the same layer as the other components, or a separate layer may be provided and the polymerization initiator under consideration may be added to this separate layer.

<Other Polymerization Initiators>

Another polymerization initiator is not required in the present invention because the above-described (A) cyclic imide structure-containing nonionic polymerization initiator has a polymerization initiation activity; however, and insofar as the effects of the present invention are not impaired, a polymerization initiator other than the above-described (A) cyclic imide structure-containing nonionic polymerization initiator can be used in combination therewith.

Polymerization initiators co-usable in the present invention are compounds that produce radicals under the effect of light energy, thermal energy, or both and thereby initiate and promote the polymerization of the compound that contains a polymerizable unsaturated group; examples are the known thermal polymerization initiators, compounds that contain a bond having a small bond dissociation energy, and photopolymerization initiators. Radical-generating compounds preferred for use in the present invention are compounds that generate radicals under the action of thermal energy and thereby initiate and promote the polymerization of the compound that contains a polymerizable unsaturated group. The thermal radical generator used in the present invention can be selected as appropriate from known polymerization initiators and compounds that contain a bond having a small bond dissociation energy. A single radical-generating compound can be used or two or more can be used in combination.

The radical-generating compounds can be exemplified by (a) organic halides, (b) carbonyl compounds, (c) organoperoxides, (d) azo-type polymerization initiators, (e) azide compounds, (f) metallocene compounds, (g) hexaarylbiimidazole compounds, (h) organoboric acid compounds, (i) disulfone compounds, (j) oxime ester compounds, and (k) onium salt compounds.

The each compound is explained below.

The organic halides (a) can be specifically exemplified by the compounds described in Wakabayashi et al., Bull. Chem. Soc. Japan, 42, 2924 (1969); U.S. Pat. No. 3,905,815; Japanese Patent Publication No. Sho 46-4605; Japanese Patent Application Publication Nos. Sho 48-36281, Sho 55-32070, Sho 60-239736, Sho 61-169835, Sho 61-169837, Sho 62-58241, Sho 62-212401, Sho 63-70243, and Sho 63-298339; and M. P. Hutt, Journal of Heterocyclic Chemistry, 1, No. 3 (1970). Trihalomethyl-substituted oxazole compounds and s-triazine compounds are particularly preferred.

s-triazine derivatives having at least one mono-, di-, or tri-halogen-substituted methyl group bonded to the s-triazine ring are more preferred, and specific examples are 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-($\alpha,\alpha,\beta$-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl-4,6-bis(trichloromethyl)-s-triazine, 2-(p-isopropyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, and so forth.

The aforementioned carbonyl compounds (b) can be exemplified by benzophenone derivatives, e.g., benzophenone, Michler's ketone, 2-methylbenzophenone, 3-methylbenzophenone, 4-methylbenzophenone, 2-chlorobenzophenone, 4-bromobenzophenone, 2-carboxybenzophenone, and so forth; acetophenone derivatives, e.g., 2,2-dimethoxy-2-phenylacetophenone, 2,2-diethoxyacetophenone, 1-hydroxycyclohexyl phenyl ketone, $\alpha$-hydroxy-2-methylphenylpropanone, 1-hydroxy-1-methylethyl (p-isopropylphenyl) ketone, 1-hydroxy-1-(p-dodecylphenyl) ketone, 2-methyl-(4'-(methylthio)phenyl)-2-morpholino-1-propanone, 1,1,1-trichloromethyl (p-butylphenyl) ketone, and so forth; thioxanthone derivatives, e.g., thioxanthone, 2-ethylthioxanthone, 2-isopropylthioxanthone, 2-chlorothioxanthone, 2,4-dimethylthioxanthone, 2,4-diethylthioxanthone, 2,4-diisopropylthioxanthone, and so forth; and benzoic acid ester derivatives, e.g., ethyl p-dimethylaminobenzoate, ethyl p-diethylaminobenzoate, and so forth.

The aforementioned organoperoxides (c) can be exemplified by trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic peroxide, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy dicarbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, tosyl carbonate, 3,3',4,4'-tetra(tert-butylperoxycarbonyl)benzophenone, 3,3',4,4'-tetra(tert-hexylperoxycarbonyl)benzophenone, 3,3',4,4'-tetra(p-isopropylcumylperoxycarbonyl)benzophenone, carbonyl di(tert-butylperoxydihydrogen diphthalate), carbonyl di(tert-hexylperoxydihydrogen diphthalate), and so forth.

The aforementioned azo compounds (d) can be exemplified, inter alia, by the azo compounds described in Japanese Patent Application Publication No. Hei 8-108621.

The aforementioned azid compounds (e) can be exemplified by the azid polymer described in Abstract of Spring Meeting of Research Presentation, The Society of Photographic Science and Technology of Japan, 1968, page 55, and by 2-azid benzoxazole, benzoylazide, 2-azidebenzimidazole and the like described in U.S. Pat. No. 3,282,693.

The aforementioned metallocene compounds (f) can be exemplified by the titanocene compounds described in Japanese Patent Application Publication Nos. Sho 59-152396, Sho 61-151197, Sho 63-41484, Hei 2-249, Hei 2-4705, and Hei 5-83588, for example, dicyclopentadienyl-Ti-bisphenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-triafluorophen-1-yl, dimethylcyclopentadienyl-Ti-bis-2,3,5,6-tetrafluorophen-1-yl, and dimethylcyclopentadienyl-Ti-bis-2,3,4,5,6-pentafluorophen-1-yl; additional examples are the iron-arene complexes described in Japanese Patent Application Publication Nos. Hei 1-304453 and Hei 1-152109.

The aforementioned hexaarylbiimidazole compounds (g) can be exemplified by the compounds described in Japanese Patent Publication No. Hei 6-29285 and U.S. Pat. Nos. 3,479, 185, 4,311,783, and 4,622,286, and specifically 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, 2,2'-bis(o-trifluorophenyl)-4,4',5,5'-tetraphenylbiimidazole, and so forth.

The aforementioned organoborate salt compounds (h) can be specifically exemplified by the organoborate salts described in Japanese Patent Application Publication Nos. Sho 62-143044, Sho 62-150242, Hei 9-188685, Hei 9-188686, Hei 9-188710, 2000-131837, and 2002-107916, Japanese Patent No. 2,764,769, Japanese Patent Application Publication No. 2002-116539, and Martin Kunz, RadTech '98 Proceedings, Apr. 19-22, 1998, Chicago; the organoboron sulfonium complexes and organoboron oxosulfonium complexes described in Japanese Patent Application Publication Nos. Hei 6-157623, Hei 6-175564, and Hei 6-175561; the organoboron iodonium complexes described in Japanese Patent Application Publication Nos. Hei 6-175554 and Hei 6-175553; the organoboron phosphonium complexes described in Japanese Patent Application Publication No. Hei 9-188710; and the organoboron transition metal coordination complexes described in Japanese Patent Application Publication Nos. Hei 6-348011, Hei 7-128785, Hei 7-140589, Hei 7-306527, and Hei 7-292014.

The aforementioned disulfone compounds (i) can be exemplified by the compounds described in Japanese Patent Application Publication Nos. Sho 61-166544 and 2002-328465.

The aforementioned oxime ester compounds (j) can be exemplified by the compounds described in J. C. S. Perkin II, 1653-1660 (1979), J. C. S. Perkin II, 156-162 (1979), Journal of Photopolymer Science and Technology, 202-232 (1995), and Japanese Patent Application Publication No. 2000-66385; by the compounds described in Japanese Patent Application Publication No. 2000-80068; and specifically by the compounds given by the structural formulas provided below.

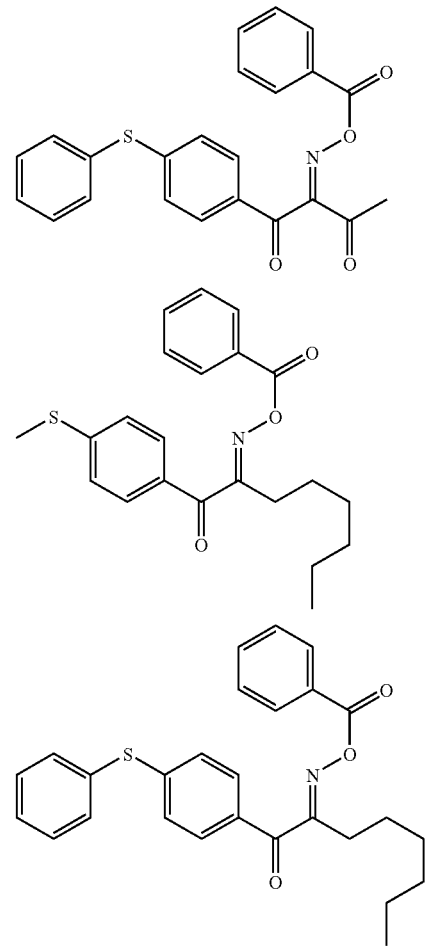

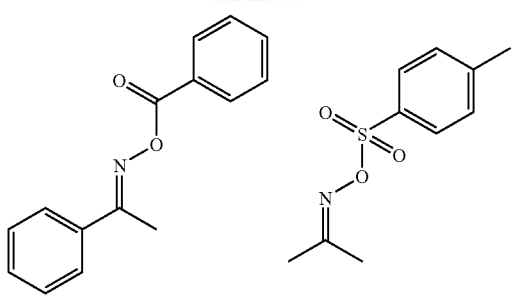
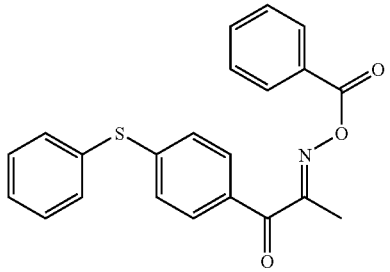
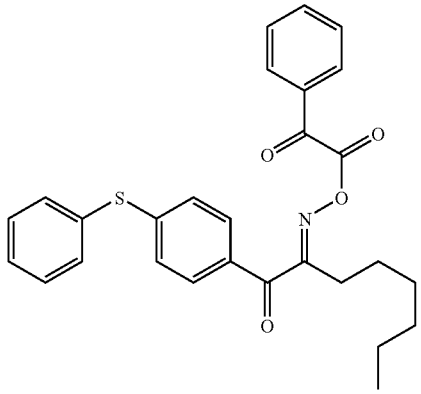
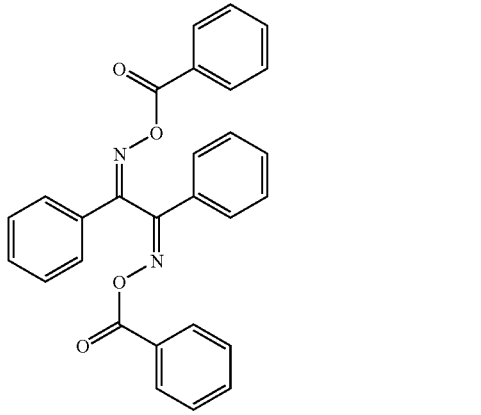
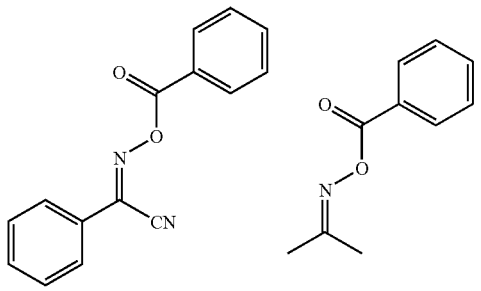
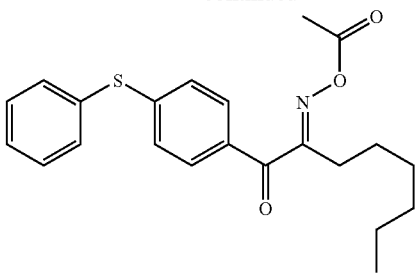
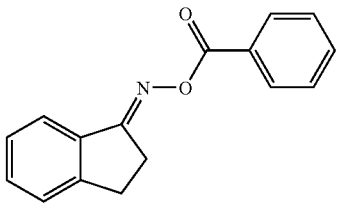
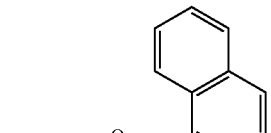
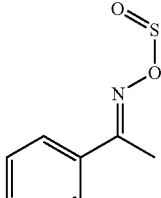
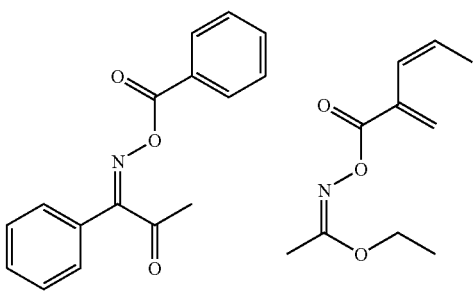
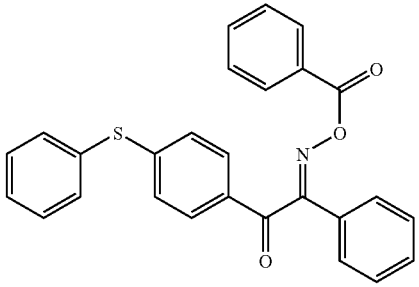
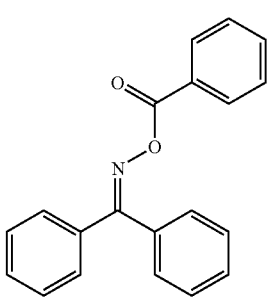

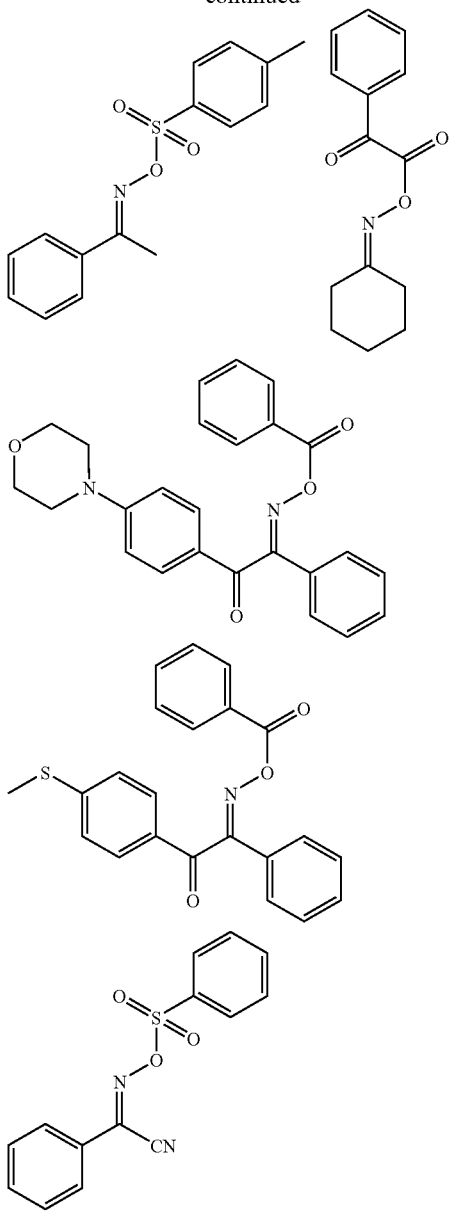

The aforementioned onium salt compounds (k) can be exemplified by onium salts such as the diazonium salts described in S. I. Schlesinger, Photogr. Sci. Eng., 18, 387 (1974) and T. S. Bal et al., Polymer, 21, 423 (1980); the ammonium salts described in U.S. Pat. No. 4,069,055 and Japanese Patent Application Publication No. Hei 4-365049; the phosphonium salts described in U.S. Pat. Nos. 4,069,055 and 4,069,056; the iodonium salts described in European Patent No. 104,143, U.S. Pat. Nos. 339,049 and 410,201, and Japanese Patent Application Publication Nos. Hei 2-150848 and 2-296514; the sulfonium salts described in European Patent Nos. 370,693, 390,214, 233,567, 297,443, and 297,442, U.S. Pat. Nos. 4,933,377, 161,811, 410,201, 339,049, 4,760,013, 4,734,444, and 2,833,827, and German Patent Nos. 2,904,626, 3,604,580 and 3,604,581;

the selenonium salts described in J. V. Crivello et al., Macromolecules, 10(6), 1307 (1977) and J. V. Crivello et al., J. Polymer Sci., Polymer Chem. Ed., 17, 1047 (1979); and the arsonium salts described in C. S. Wen et al., *The Proc. Conf. Rad. Curing, ASIA*, p. 478, Tokyo, October (1988).

Viewed from the standpoints of reactivity and stability, the aforementioned oxime ester compounds and the after-mentioned diazonium salts, iodonium salts, sulfonium salts, and ammonium salts are particularly preferred examples. These onium salts function in the present invention not as an acid generator, but rather as an ionic radical polymerization initiator.

The onium salts represented by the following general formulas (RI-I) to (RI-III) are onium salts that are well suited for use in the present invention.

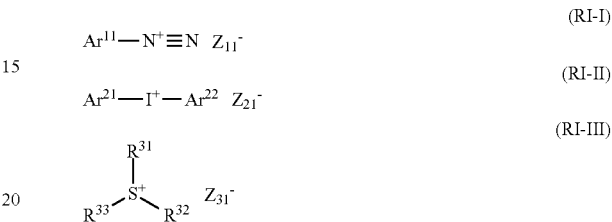

$Ar^{11}$ in formula (RI-I) represents an aryl group that has 20 or fewer carbons and that may have from 1 to 6 substituents. Preferred substituents can be exemplified by alkyl having from 1 to 12 carbons, alkenyl having from 1 to 12 carbons, alkynyl having from 1 to 12 carbons, aryl having from 1 to 12 carbons, alkoxy having from 1 to 12 carbons, aryloxy having from 1 to 12 carbons, halogen, alkylamino having from 1 to 12 carbons, dialkylamino having from 1 to 12 carbons, alkylamide or arylamide having from 1 to 12 carbons, a carbonyl group, the carboxyl group, the cyano group, a sulfonyl group, thioalkyl having from 1 to 12 carbons, and thioaryl having from 1 to 12 carbons.

$Z^{11-}$ represents a monovalent anion and is a halogen ion, perchlorate ion, hexafluorophosphate ion, tetrafluoroborate ion, sulfonate ion, sulfinate ion, thiosulfonate ion, or sulfate ion. Viewed from the perspective of stability and the inspectability of the printed out image, the perchlorate ion, hexafluorophosphate ion, tetrafluoroborate ion, sulfonate ion, and sulfinate ion are preferred.

$Ar^{21}$ and $Ar^{22}$ in formula (RI-II) each independently represent an aryl group that has 20 or fewer carbons and that may have from 1 to 6 substituents. Preferred substituents can be exemplified by alkyl having from 1 to 12 carbons, alkenyl having from 1 to 12 carbons, alkynyl having from 1 to 12 carbons, aryl having from 1 to 12 carbons, alkoxy having from 1 to 12 carbons, aryloxy having from 1 to 12 carbons, halogen, alkylamino having from 1 to 12 carbons, dialkylamino having from 1 to 12 carbons, alkylamide or arylamide having from 1 to 12 carbons, a carbonyl group, the carboxyl group, the cyano group, a sulfonyl group, thioalkyl having from 1 to 12 carbons, and thioaryl having from 1 to 12 carbons.

$Z^{21-}$ represents a monovalent anion and is a halogen ion, perchlorate ion, hexafluorophosphate ion, tetrafluoroborate ion, sulfonate ion, sulfinate ion, thiosulfonate ion, or sulfate ion. Viewed from the perspective of stability, the perchlorate ion, hexafluorophosphate ion, tetrafluoroborate ion, sulfonate ion, sulfinate ion, and carboxylate ion are preferred.

$R^{31}$, $R^{32}$, and $R^{33}$ in formula (RI-III) each independently represent alkyl, alkenyl, or alkynyl or an aryl group that has 20 or fewer carbons and that may have from 1 to 6 substituents, wherein aryl is preferred from the standpoints of reactivity and stability. Preferred substituents can be exemplified by alkyl having from 1 to 12 carbons, alkenyl having from 1 to 12 carbons, alkynyl having from 1 to 12 carbons, aryl having from 1 to 12 carbons, alkoxy having from 1 to 12 carbons, aryloxy having from 1 to 12 carbons, halogen, alkylamino having from 1 to 12 carbons, dialkylamino having from 1 to 12 carbons, alkylamide or arylamide having from 1 to 12 carbons, a carbonyl group, the carboxyl group, the cyano group, a sulfonyl group, thioalkyl having from 1 to 12 carbons, and thioaryl having from 1 to 12 carbons.

$Z^{31-}$ represents a monovalent anion and is a halogen ion, perchlorate ion, hexafluorophosphate ion, tetrafluoroborate ion, sulfonate ion, sulfinate ion, thiosulfonate ion, or sulfate ion. Viewed from the perspective of stability and the printed-out image inspectability, the perchlorate ion, hexafluorophosphate ion, tetrafluoroborate ion, sulfonate ion, sulfinate ion, and carboxylate ion are preferred, while the carboxylate ion described in Japanese Patent Application Publication No. 2001-343742 is more preferred and the carboxylate ion described in Japanese Patent Application Publication No. 2002-148790 is particularly preferred.

Examples of onium salt compounds suitably used as a polymerization initiator in the present invention are described below, however the present invention is not limited thereto.

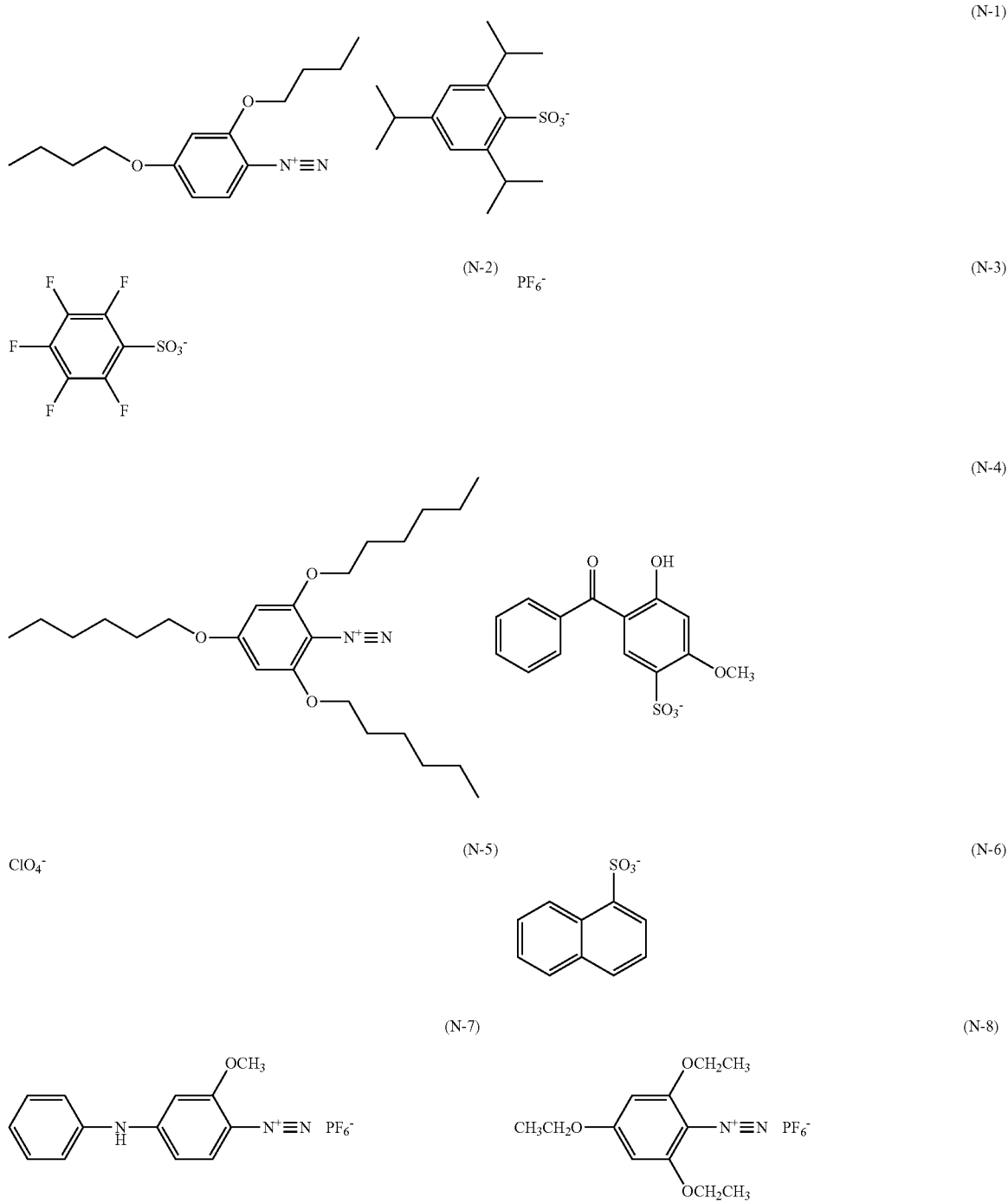

(N-9)
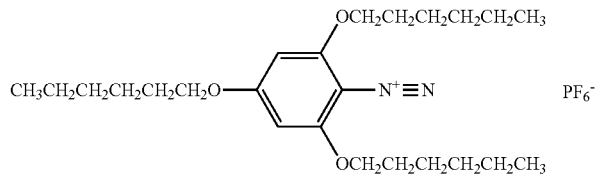
(N-10)
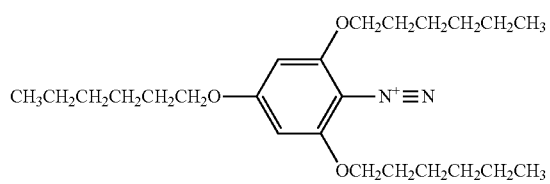 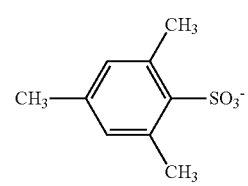
(N-11)
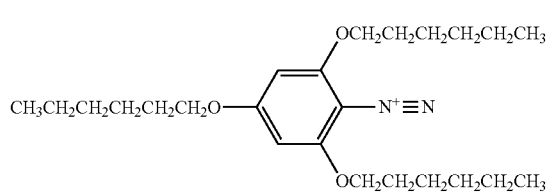 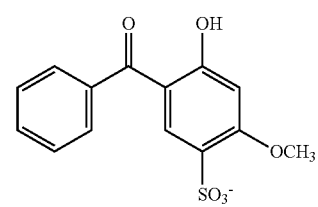
(I-1) 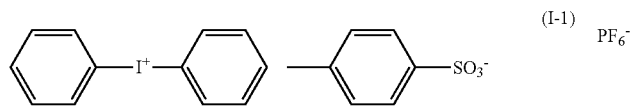 PF$_6^-$
(I-2) 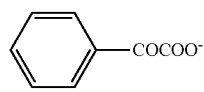
(I-3) 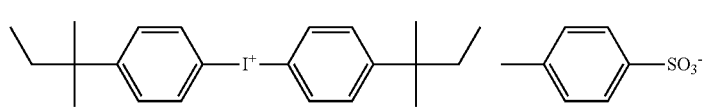
(I-4) ClO$_4^-$
(I-5) 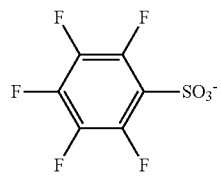
(I-6) 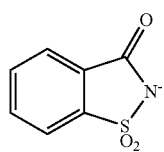
(I-7) CF$_3$SO$_3^-$
(I-8) 
(I-9) 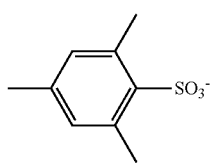
(I-10) PF$_6^-$
(I-11) 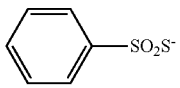

-continued
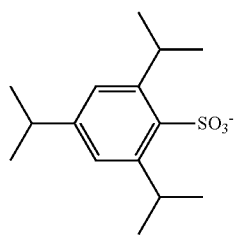
(S-12)
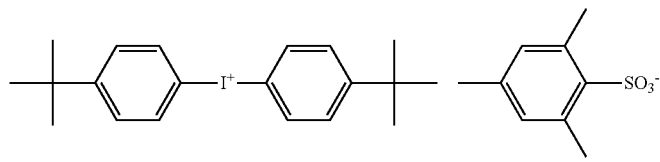
(I-13)
ClO₄⁻ (I-14) PF₆⁻ (I-15)
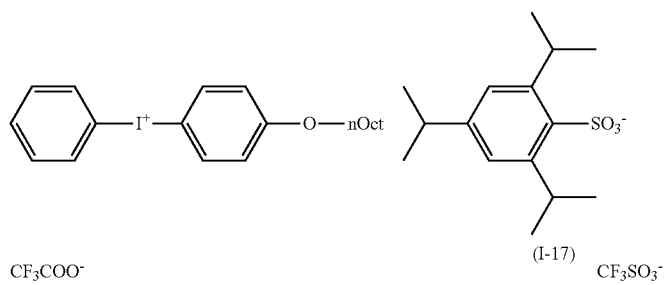
(I-16)
CF₃COO⁻ (I-17) CF₃SO₃⁻ (I-18)
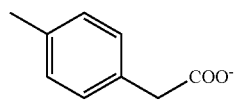
(I-19)
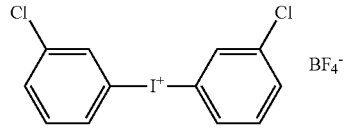
(I-20)
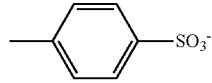 (I-21) 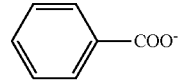 (I-22)
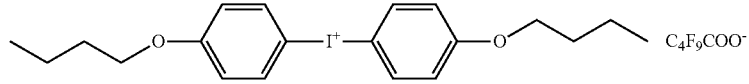
(I-23)
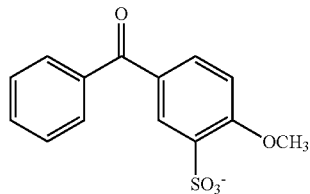
(I-24)
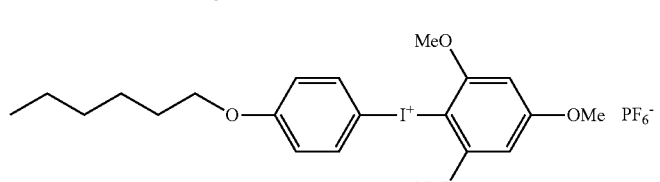
(I-25)
ClO₄⁻
(I-26)

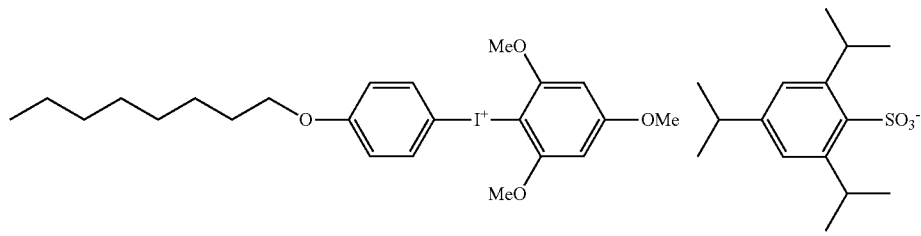
(I-27)
(I-28)    (I-29)
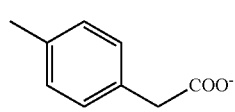
(I-30)
(I-31)
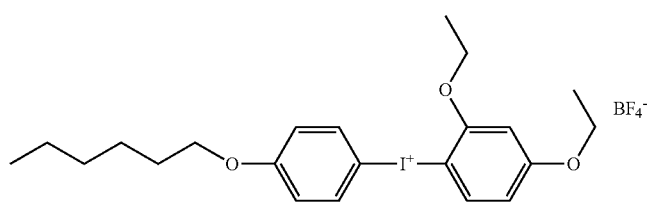
(I-32)
(I-33)   (I-34)
(I-35)
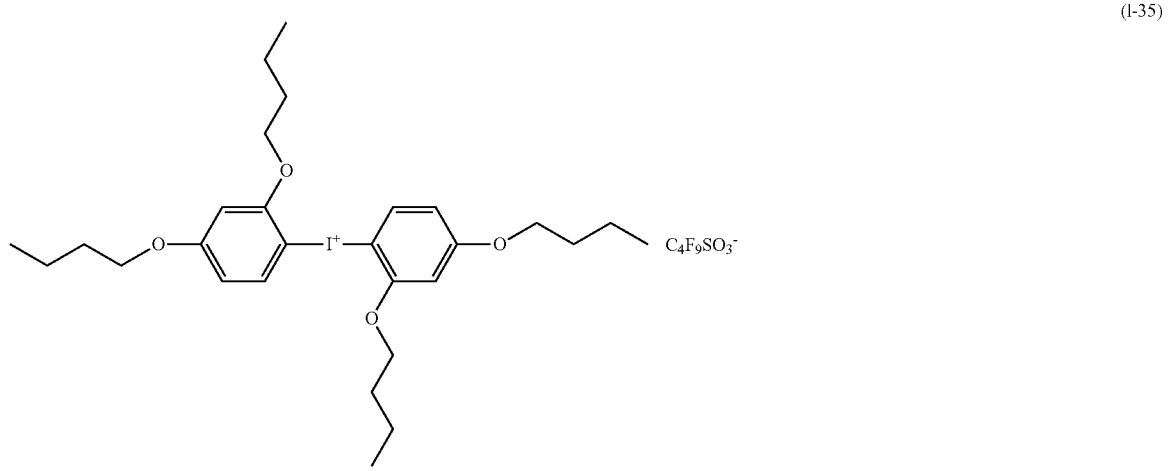
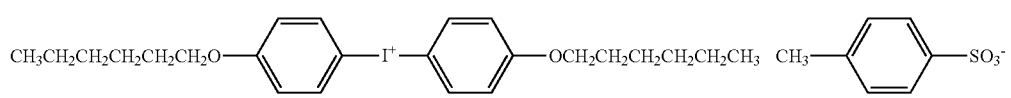
(I-36)
(S-1)   (S-2)
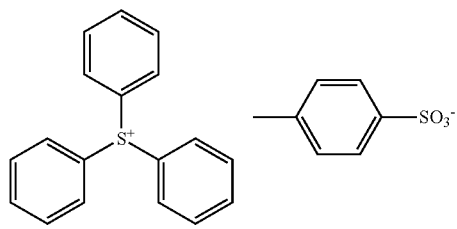
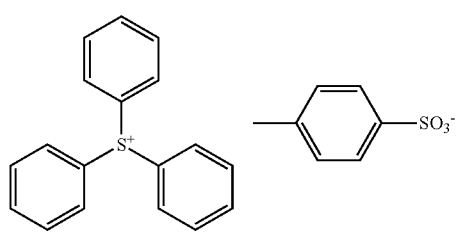

-continued
ClO₄⁻ (S-3)
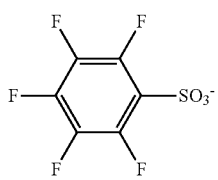 (S-4)
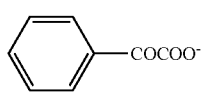 (S-5)
CF₃SO₃⁻ (S-6)
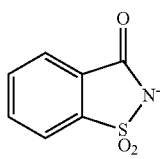 (S-7)
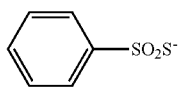 (S-8)
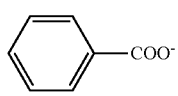 (S-9)
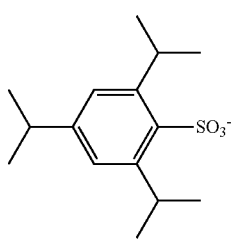 (S-10)
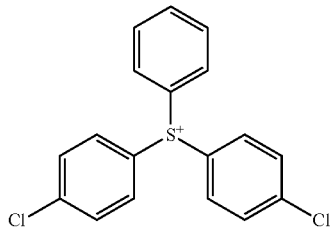 (S-11)
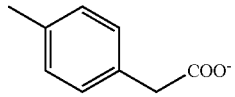 (S-12)
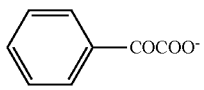 (S-13)
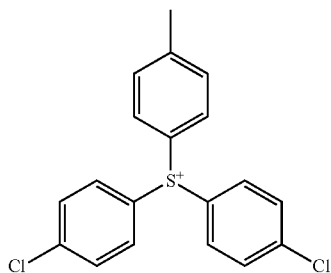
BF₄⁻ (S-14)
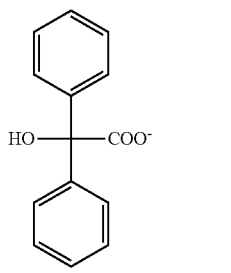 (S-15)
(S-16)

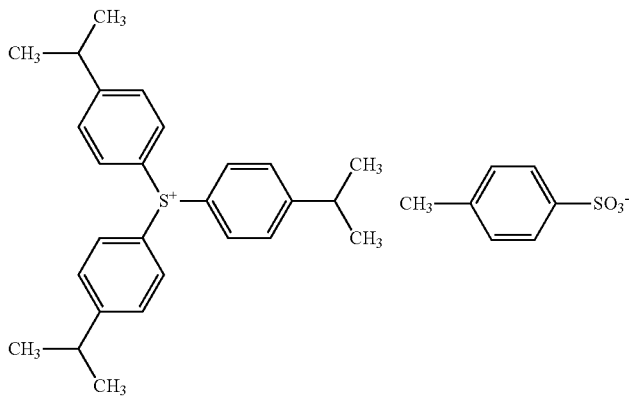
(S-17)

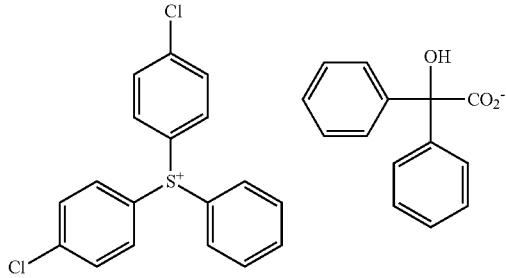
(S-18)

Among the preceding other, co-usable polymerization initiators, those that are onium salts and that have an inorganic anion (e.g., $PF_6{-}$, $BF_4{-}$, $C_4F_9SO_3{-}$, and so forth) as the counterion are preferred from the standpoint of improving the capacity for visual inspection; in addition, diaryliodonium salts that have at least two electron-donating groups are preferred because this provides excellent color generation. This initiator is a compound that has a diaryliodonium skeleton and that has at least two and preferably at least three electron-donating groups (e.g., alkyl, alkoxy, and so forth) on these aryl groups. The electron-donating groups are preferably introduced in para and ortho position on the aryl rings of the iodonium salt.

A single such other polymerization initiator may be used or two or more may be used in combination. This polymerization initiator may be added to the same layer as the other components, or a separate layer may be provided and the polymerization initiator under consideration may be added to this separate layer.

The total polymerization initiator content in the present invention, that is, the sum of the (A) cyclic imide structure-containing nonionic polymerization initiator and the above-described other, co-usable polymerization initiator, is preferably 0.1 to 50 mass %, more preferably 0.5 to 30 mass %, and most preferably 1 to 20 mass %, in each case with reference to the total solids fraction making up the image recording layer.

In those instances where the aforementioned other, co-usable polymerization initiator is employed, its content is preferably 0 to 200 mol % and preferably 0 to 100 mol %, in each case with reference to the (A) cyclic imide structure-containing nonionic polymerization initiator.

<(B) The Compound that has at Least One Addition-Polymerizable Ethylenically Unsaturated Bond>

A compound that has at least one addition-polymerizable ethylenically unsaturated bond (B) (as appropriate, referred to below as the polymerizable compound) is preferably present in the image recording layer of the present invention in order to efficiently carry out the curing reaction.

Polymerizable compounds that can be used by the present invention are addition-polymerizable compounds that have at least one ethylenically unsaturated double bond and are selected from compounds that have at least one and preferably at least two ethylenically unsaturated bonds in terminal position. This group of compounds is widely known in the pertinent industrial field, and these can be used in the present invention without particular limitation. These compounds have, for example, the following chemical configurations: monomer, prepolymer (i.e., dimer, trimer, and oligomer), mixtures of the preceding, copolymers of the preceding, and so forth. Examples of the monomers and their copolymers are unsaturated carboxylic acids (for example, acrylic acid, methacrylic acid, itaconic acid, crotonic acid, isocrotonic acid, maleic acid, and so forth) and their esters and amides, preferably esters between an unsaturated carboxylic acid and an aliphatic polyhydric alcohol compound and amides between an unsaturated carboxylic acid and an aliphatic polyvalent amine compound. Also suitable for use are the addition reaction products from a monofunctional or multifunctional isocyanate or epoxide and an unsaturated carboxylic acid ester or amide that has a nucleophilic substituent such as, for example, the hydroxyl group, amino group, mercapto group, and so forth, and the dehydration condensation reaction products from a monofunctional or multifunctional carboxylic acid and an unsaturated carboxylic acid ester or amide that has a nucleophilic substituent such as, for example, the hydroxyl group, amino group, mercapto group, and so forth. Also suitable are the addition reaction products from a monofunctional or multifunctional alcohol, amine, or thiol and an unsaturated carboxylic acid ester or amide that has an electrophilic substituent such as, for example, the isocyanate group, epoxy group, and so forth, and substitution reaction products from a monofunctional or multifunctional alcohol, amine, or thiol and an unsaturated carboxylic acid ester or amide that has a leaving group such as, for example, a halogen group, tosyloxy group, and so forth. Another set of usable examples is provided by the group of compounds generated by replacing the unsaturated carboxylic acid cited above with, for example, an unsaturated phosphonic acid, styrene, vinyl ether, and so forth.

The following are specific examples of monomers that are esters between an aliphatic polyhydric alcohol compound and an unsaturated carboxylic acid: acrylate esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, EO-modified isocyanurate triacrylate, and so forth;

Methacrylate esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis[p-(methacryloxyethoxy)phenyl]dimethylmethane, and so forth;

Itaconate esters such as ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, and so forth; crotonate esters such as ethylene glycol dicrotonate, tetramethylene glycol dicrotonate, pentaerythritol dicrotonate, sorbitol tetradicrotonate, and so forth; isocrotonate esters such as ethylene glycol diisocrotonate, pentaerythritol diisocrotonate, sorbitol tetraisocrotonate, and so forth; and maleate esters such as ethylene glycol dimaleate, triethylene glycol dimaleate, pentaerythritol dimaleate, sorbitol tetramaleate, and so forth.

Examples of other suitable esters are the aliphatic alcohol-based esters described in Japanese Patent Publication No. Sho 51-47334 and Japanese Patent Application Publication No. Sho 57-196231; esters having an aromatic skeleton as described in Japanese Patent Application Publication Nos. Sho 59-5240, Sho 59-5241, and Hei 2-226149; and the amino group-containing esters described in Japanese Patent Application Publication No. Hei 1-165613. In addition, the above described ester monomers can also be used in the form of mixtures.

The following are specific examples of monomers that are amides between an aliphatic polyvalent amine compound and an unsaturated carboxylic acid: methylenebisacrylamide, methylenebismethacrylamide, 1,6-hexamethylenebisacrylamide, 1,6-hexamethylenebismethacrylamide, diethylenetriamine trisacrylamide, xylylenebisacrylamide, xylylenebismethacrylamide, and so forth. Other examples of preferred amide-type monomers are those having a cyclohexylene structure as described in Japanese Patent Publication No. Sho 54-21726.

Also suitable are urethane-type addition-polymerizable compounds produced using the addition reaction between isocyanate and the hydroxyl group; a specific example here is the vinyl urethane compound containing at least two polymerizable vinyl groups in each molecule, as described in Japanese Patent Publication No. Sho 48-41708, that is generated by the addition of hydroxyl-functional vinyl monomer represented by general formula (V) below to a polyisocyanate compound that contains at least two isocyanate groups in each molecule $$CH_2=C(R^4)COOCH_2CH(R^5)OH \quad (V)$$

(wherein $R^4$ and $R^5$ represent H or $CH_3$).

The following are also suitable: the urethane acrylates as described in Japanese Patent Application Publication No. Sho 51-37193 and Japanese Patent Publication Nos. Hei 2-32293 and Hei 2-16765 and the urethane compounds having an ethylene oxide-type skeleton as described in Japanese Patent Publication Nos. Sho 58-49860, Sho 56-17654, Sho 62-39417, and Sho 62-39418. In addition, a photopolymerizable composition that exhibits a very good photosensitive speed can be obtained by using the addition-polymerizable compounds having an amino structure or sulfide structure in the molecule that are described in Japanese Patent Application Publication Nos. Sho 63-277653, Sho 63-260909, and Hei 1-105238.

Other examples are the polyester acrylates as described in each of Japanese Patent Application Publication No. Sho 48-64183 and Japanese Patent Publication Nos. Sho 49-43191 and Sho 52-30490, as well as multifunctional acrylates and methacrylates such as epoxy acrylates as yielded by the reaction of epoxy resin with acrylic acid or methacrylic acid. Other examples are the special unsaturated compounds described in Japanese Patent Publication Nos. Sho 46-43946, Hei 1-40337, and Hei 1-40336 and the vinylphosphonic acid-type compounds described in Japanese Patent Application Publication No. Hei 2-25493. Structures containing a perfluoroalkyl group as described in Japanese Patent Application Publication No. Sho 61-22048 are suitably used in some cases. Also usable are the compounds introduced as photocurable monomers and oligomers in the *Journal of the Adhesion Society of Japan*, Volume 20, Number 7, pages 300 to 308 (1984).

The specifics of how these addition-polymerizable compounds are used, for example, their structure, whether a single such compound or a combination of these compounds is used, the quantity of addition, and so forth, can be freely established in conformity with the properties designed for the final lithographic printing plate precursor. Selection can be made, for example, based on the following considerations.

Based on a consideration of the sensitivity, a structure is preferred that has a large unsaturated group content per molecule, and difunctional and above is preferred in many cases. In addition, trifunctional and above is preferred for the purpose of raising the strength of the image areas, that is, the cured film. It may also be effective to adjust both the sensitivity and strength by using combinations of compounds that have different numbers of functionalities different polymerizable groups (for example, acrylate esters, methacrylate esters, styrenic compounds, vinyl ether-type compounds).

The selection of the addition-polymerizable compound and its method of use are also important factors for the compatibility and dispersibility with respect to the other components (for example, binder polymer, initiator, colorant, and so forth) in the image recording layer. For example, it may be possible to improve the compatibility by the use of two or more compounds in combination and/or by the use of a low-purity compound. Moreover, it may be possible to select a particular structure with the goal of improving the adhesiveness with, inter alia, an overcoat layer, infra, and/or the substrate.

The polymerizable compound (B) is used preferably at 5 to 80 mass % and more preferably 25 to 75 mass %, in each case with reference to the nonvolatile components in the image recording layer. A single polymerizable compound may be used or two or more may be used in combination. In addition to the preceding, within the context of the use strategy for the addition-polymerizable compound, a suitable structure, composition, and quantity of addition can be freely selected based on a consideration of, for example, the magnitude of polymerization inhibition by oxygen, the resolution, the fogging behavior, the change in refractive index, the surface tackiness, and so forth. Depending on the circumstances, a layer structure coating method such as undercoating and/or overcoating may also be implemented.

<(C) Infrared Absorber>

In instances where image formation is carried out using a laser light source that emits infrared radiation at, for example, 760 to 1200 nm, the image recording layer of the lithographic printing plate precursor of the present invention contains usually an infrared absorber essentially. The infrared absorber functions to convert the absorbed infrared radiation to heat, and functions to be excited to transfer electron/energy to the (A) cyclic imide structure-containing nonionic polymerization initiator. The infrared absorber used in the present invention can be a dye or pigment that presents an absorption maximum at a wavelength of 760 to 1200 nm.

The dye can be exemplified by commercially available dyes and by known dyes described in the literature (for example, *Dye Handbook*, edited by The Society of Synthetic Organic Chemistry, Japan, 1970). Specific examples are dyes such as azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts, metal thiolate complexes, and so forth.

Preferred dyes can be exemplified by the cyanine dyes described in Japanese Patent Application Publication Nos. Sho 58-125246, Sho 59-84356, and Sho 60-78787; the methine dyes described in Japanese Patent Application Publication Nos. Sho 58-173696, Sho 58-181690, and Sho 58-194595; the naphthoquinone dyes described in Japanese Patent Application Publication Nos. Sho 58-112793, Sho 58-224793, Sho 59-48187, Sho 59-73996, Sho 60-52940, and Sho 60-63744; the squarylium dyes described in Japanese Patent Application Publication No. Sho 58-112792; and the cyanine dyes described in British Patent 434,875.

The use is also preferred of the near infrared absorbers/sensitizers described in U.S. Pat. No. 5,156,938; the substituted arylbenzo(thio)pyrylium salts described in U.S. Pat. No. 3,881,924; the trimethine thiapyrylium salts described in Japanese Patent Application Publication No. Sho 57-142645 (U.S. Pat. No. 4,327,169); the pyrylium compounds described in Japanese Patent Application Publication Nos. Sho 58-181051, Sho 58-220143, Sho 59-41363, Sho 59-84248, Sho 59-84249, Sho 59-146063, and Sho 59-146061; the cyanine dyes described in Japanese Patent Application Publication No. Sho 59-216146; the pentamethine thiopyrylium salts described in U.S. Pat. No. 4,283,475; and the pyrylium compounds described in Japanese Patent Publication Nos. Hei 5-13514 and Hei 5-19702. Other preferred dye examples are the near infrared-absorbing dyes represented by formulas (I) and (II) in U.S. Pat. No. 4,756,993.

Other preferred examples of the infrared-absorbing dyes for the present invention are the special indolenine cyanine dyes described in Japanese Patent Application Publication Nos. 2001-247137 and 2002-278057, as exemplified below.

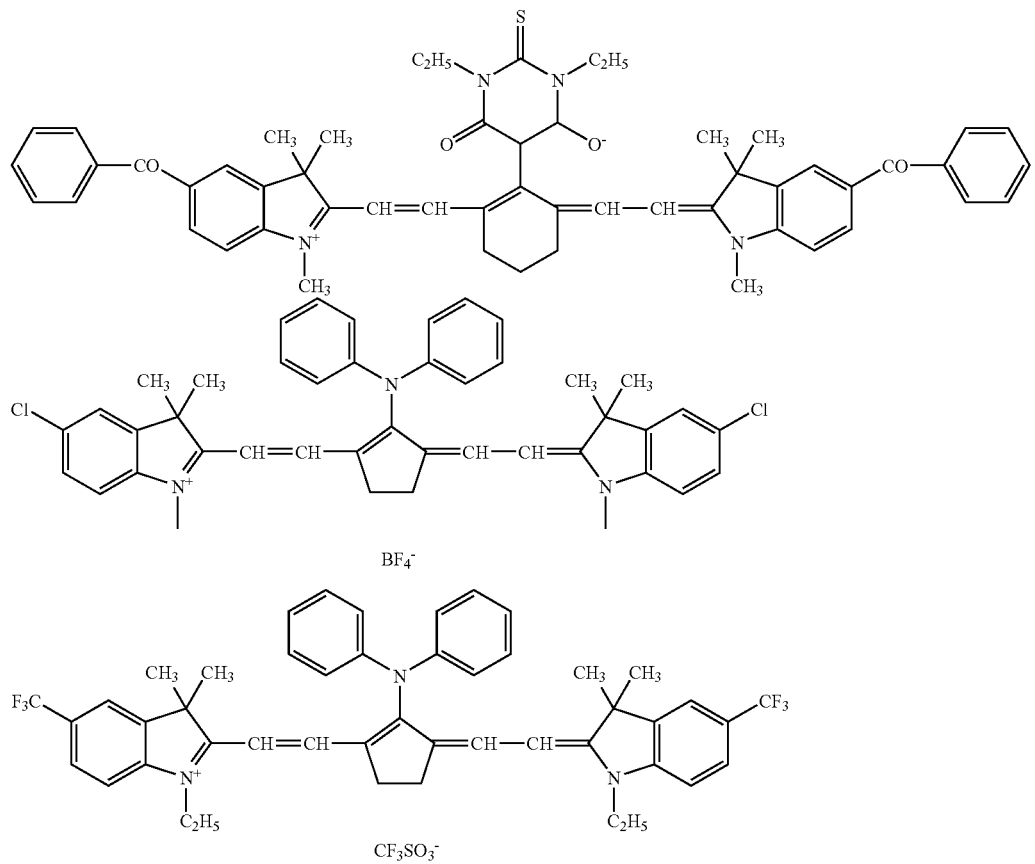

The following are particularly preferred among the dyes cited above: cyanine dyes, squarylium dyes, pyrylium dyes, nickel thiolate complexes, and indolenine cyanine dyes, and in terms of clore changing on electron transfer and stability, those containing in the molecule a 5-membered ring, specifically a 5-membered heterocring containing a nitrogen atom is preferable. The cyanine dyes and indolenine cyanine dyes are more preferred, while the cyanine dyes given by the following general formula (i) are a particularly preferred example.

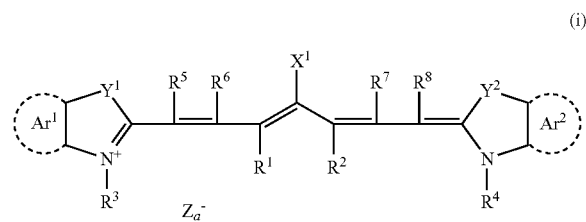

(i)

$X^1$ in general formula (i) represents the hydrogen atom, a halogen atom, —$NPh_2$, $X^2$-$L^1$, or the group depicted below. $X^2$ represents an oxygen atom, nitrogen atom, or sulfur atom; $L^1$ represents $C_{1-12}$ hydrocarbyl, a heteroatom-containing aromatic ring, or heteroatom-containing $C_{1-12}$ hydrocarbyl. This heteroatom represents N, S, O, a halogen atom, or Se.

In the formula depicted below, $X_a$— has the same definition as the $Z_a$— described below, while $R^a$ represents a substituent selected from the hydrogen atom, alkyl, aryl, substituted and unsubstituted amino, and halogen atoms.

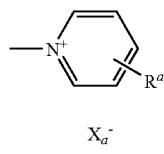

$R^1$ and $R^2$ in general formula (i) each independently represent $C_{1-12}$ hydrocarbyl. Based on a consideration of the storage stability of the coating fluid for forming the recording layer, $R^1$ and $R^2$ are preferably hydrocarbyl that contains at least two carbon atoms and are particularly preferably bonded to each other to form a 5-membered ring or 6-membered ring.

$Ar^1$ and $Ar^2$ are the same or different, and each independently represent possibly substituted aromatic hydrocarbyl. The benzene ring and naphthalene ring are preferred for the aromatic hydrocarbyl. Preferred substituents in the case of substitution are hydrocarbyl containing no more than 12 carbons, halogen atoms, and alkoxy groups containing no more than 12 carbons. $Y^1$ and $Y^2$ are the same or different, and each independently represent the sulfur atom or a dialkylmethylene group that has no more than 12 carbons. $R^3$ and $R^4$ are the same or different, and each independently represent possibly substituted hydrocarbyl having no more than 20 carbons. Preferred substituents in the case of substitution are alkoxy groups having no more than 12 carbons, the carboxyl group, and the sulfo group, and the alkoxy groups having no more than 12 carbons is most preferred. $R^5$, $R^6$, $R^7$, and $R^8$ are the same or different, and each independently represent the hydrogen atom or hydrocarbyl having no more than 12 carbons. The hydrogen atom is preferred based on the ease of starting material acquisition. $Z_a$— represents a counteranion. However, $Z_a$— is not required when the cyanine dye with general formula (i) has an anionic substituent within its structure and charge neutralization is then not required. Based on a consideration of the storage stability of the coating fluid for forming the recording layer, $Z_a$— is preferably a halogen ion, the perchlorate ion, the tetrafluoroborate ion, the hexafluorophosphate ion, or a sulfonate ion and particularly preferably is the perchlorate ion, the hexafluorophosphate ion, or an arylsulfonate ion.

In view of improvement of visibility, $Z_a$— is preferably an inorganic anion or a counteranion of strong acid, and in this connection, $PF_6$—, $BF_4$—, $CF_3SO_3$—, $C_4F_9SO_3$— and so forth can be listed, $PF_6$— being most preferred.

Specific examples of cyanine dyes with general formula (i) that can be suitably used in the present invention are, for example, the dyes described in paragraphs from 0017 to 0019 of Japanese Patent Application Publication No. 2001-133969.

Additional, particularly preferred examples are the special indolenine cyanine dyes described in the previously mentioned Japanese Patent Application Publication Nos. 2001-247137 and 2002-278057.

The pigment used in the present invention may be a commercially available pigment or a pigment as described in the Colour Index (C. I.) database, *The Handbook of Modern Pigments* (Edited by the Japan Association of Pigment Technology, 1977), *Modern Pigment Applications Technology* (CMC, 1986), or *Printing Ink Technology* (CMC, 1984).

With regard to type, the pigment can be, for example, a black pigment, yellow pigment, orange pigment, brown pigment, red pigment, purple pigment, blue pigment, green pigment, fluorescent pigment, metal powder pigment, or polymer-bonded dye. Specific examples are insoluble azo pigments, azo lake pigments, condensed azo pigments, chelate azo pigments, phthalocyanine-based pigments, anthraquinone-based pigments, perylene-based pigments, perinone-based pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments, carbon black, and so forth. Carbon black is preferred among these pigments.

These pigments may be used without a surface treatment or may be used after a surface treatment. Examples of the surface treatment method include coating the surface with a resin or wax, attaching a surfactant, and bonding a reactive material (e.g., silane coupling agent, epoxy compound, polyisocyanate) to the surface of the pigment. These surface treatment methods are described in *Properties and Applications of Metal Soaps* (Saiwai Shobo), *Printing Ink Technology* (CMC, 1984), and *Modern Pigment Applications Technology* (CMC, 1986).

The particle diameter of the pigment is preferably from 0.01 μm to 10 μm, more preferably from 0.05 μm to 1 μm, and particularly preferably from 0.1 μm to 1 μm. Good stability by the pigment dispersion in the coating fluid for forming the image recording layer and good uniformity on the part of the image recording layer are obtained in the cited range.

The known dispersion technologies used, for example, for ink production or toner production, can be used as the method of dispersing the pigment. The dispersing apparatus can be exemplified by ultrasonic dispersers, sand mills, attritors, pearl mills, super mills, ball mills, impellers, dispersers, KD mills, colloid mills, dynatrons, three-roll mills, and pressure kneaders. The details are described in *Modern Pigment Applications Technology* (CMC, 1986).

Among the preceding, compounds that have at least one solvent-soluble group in the cyanine dye skeleton are particularly preferred infrared absorbers (C) for the lithographic printing plate precursor of the present invention. In the present invention, a solvent-soluble group denotes an organic functional group that can raise the solvent solubility of the infrared absorber. While any functional group that has this property can be used without particular limitation, the following are preferred: alkyloxy, aryloxy, alkylcarbonyl, arylcarbonyl, alkyloxycarbonyl, aryloxycarbonyl, sulfonylamide, the carboxyl group, the sulfonic acid group, the hydroxyl group, alkylcarbonyloxy, arylcarbonyloxy, and the amide group. The following are solvent-soluble groups that are more preferred among the preceding: alkyloxy, aryloxy, alkyloxycarbonyl, and aryloxycarbonyl. The most preferred solvent-soluble groups are alkyloxy and aryloxy.

In more specific terms, a preferred infrared absorber (C) has the cyanine dye structure represented by general formula (i) given above and has at least one solvent-soluble group in the molecule. In a more preferred embodiment, and considered with reference to any and all of the cyanine dye structures represented by the preceding general formula (i), the solvent-soluble group is introduced onto the aromatic hydrocarbyl represented by $Ar^1$ and/or $Ar^2$, the nitrogen atoms at both ends, and/or the Ph (aromatic ring) in those instances where $X^1$ represents —$NPh_2$. Viewed from the perspective of improving the on-press developability, a solvent-soluble group is most preferably introduced on the nitrogen atoms at both ends. With regard to the number of solvent-soluble groups to be introduced, at least one is introduced, but the introduction of from two to six per individual cyanine dye molecule is preferred from the standpoints of enabling uniform application of the image recording layer in a highly concentrated state, improving the inhibition of gas generation caused during on-press development by components in the image recording layer, and improving the on-press developability.

The following are specific examples of infrared absorbers that are well adapted for use in the present invention, although the present invention is not limited to these.

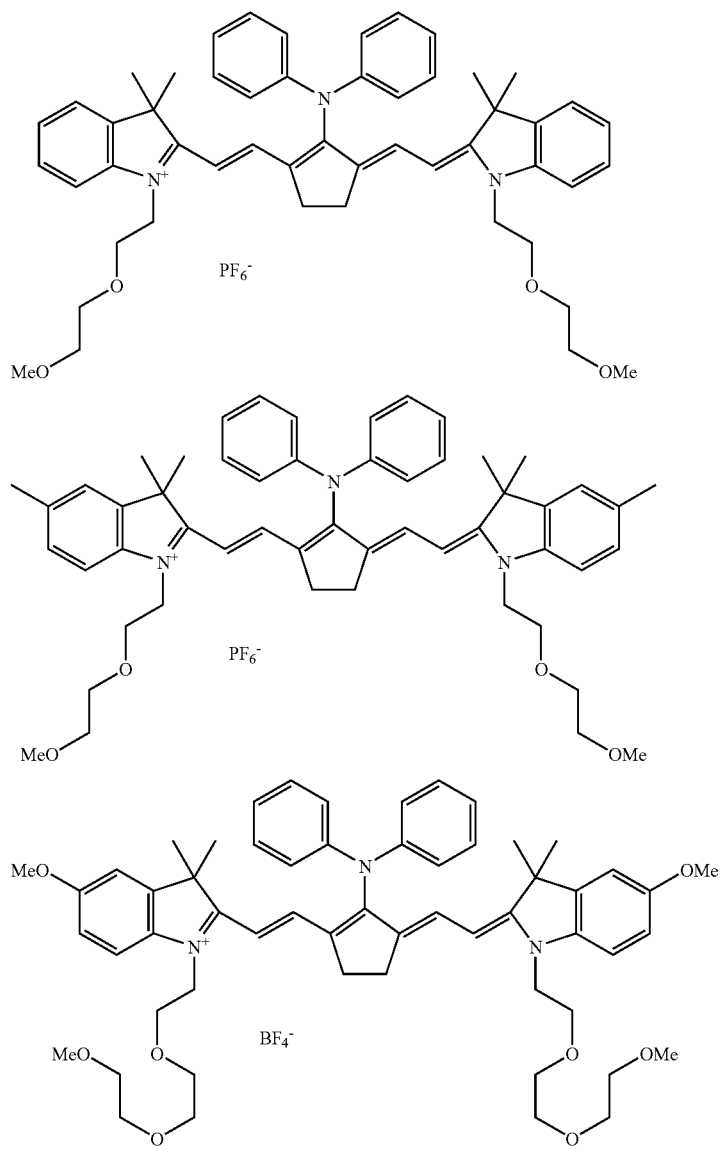

-continued
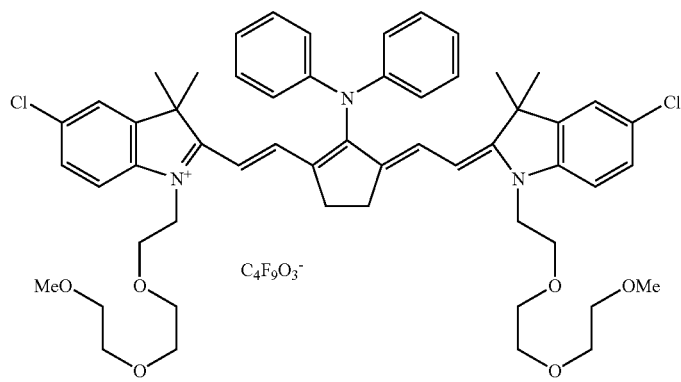
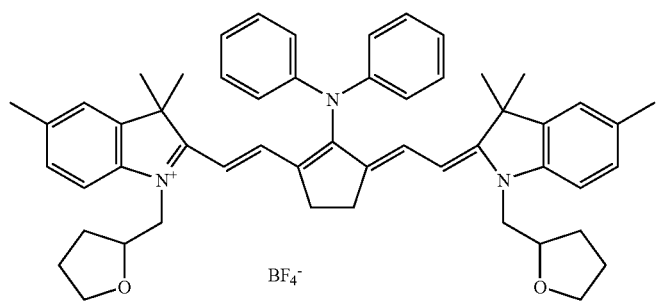
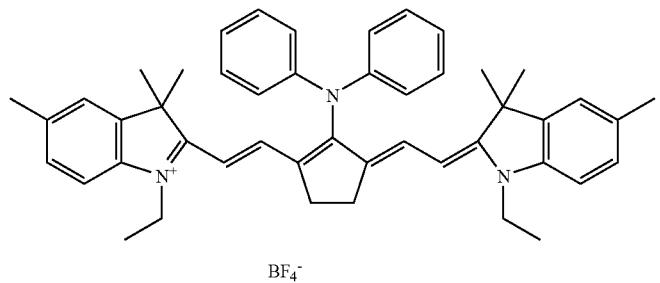
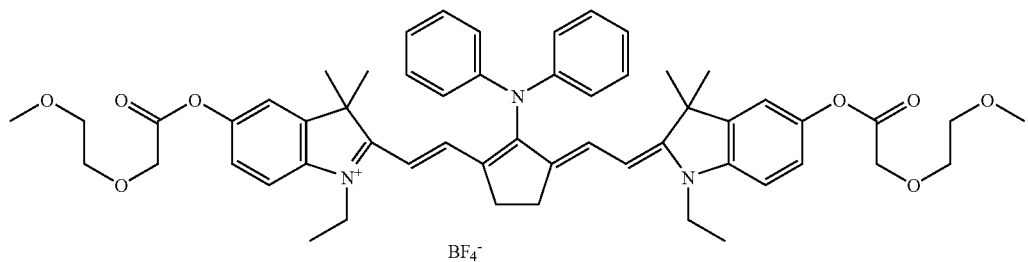
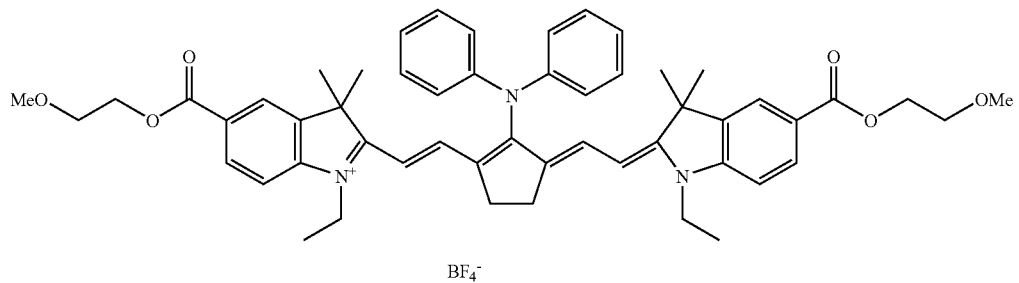

-continued
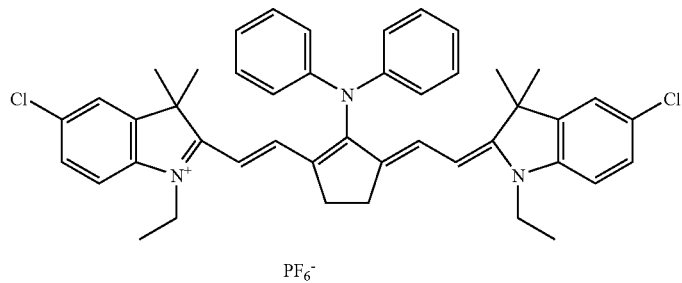
PF6⁻
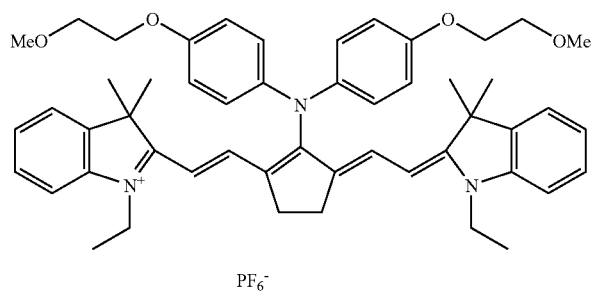
PF6⁻
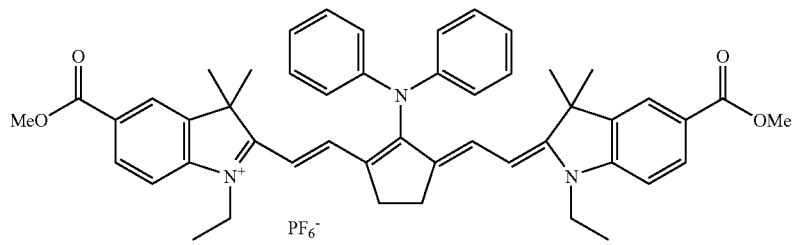
PF6⁻
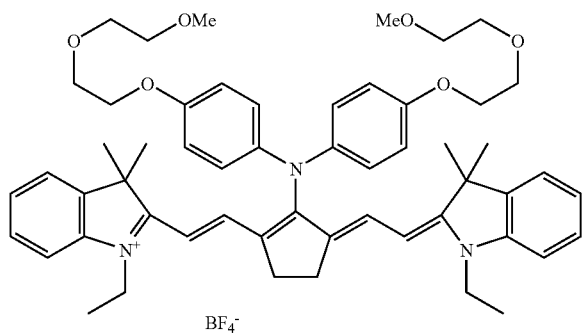
BF4⁻
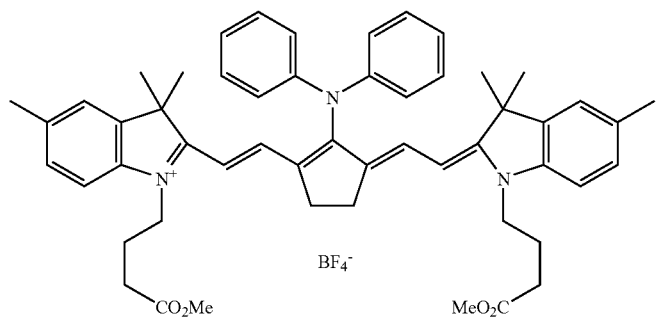
BF4⁻

-continued
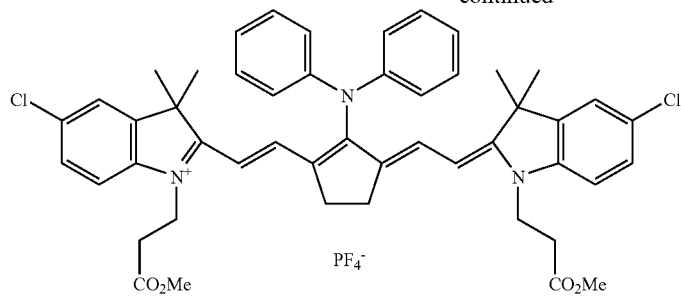
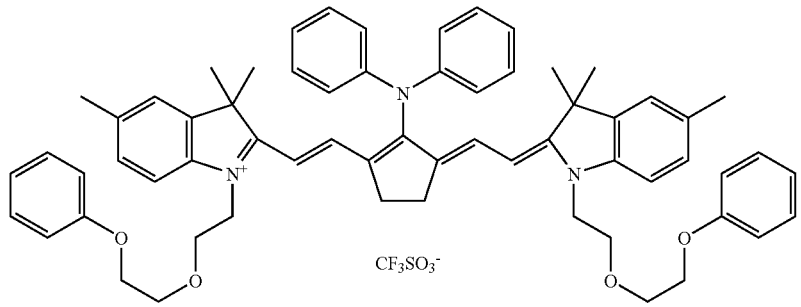
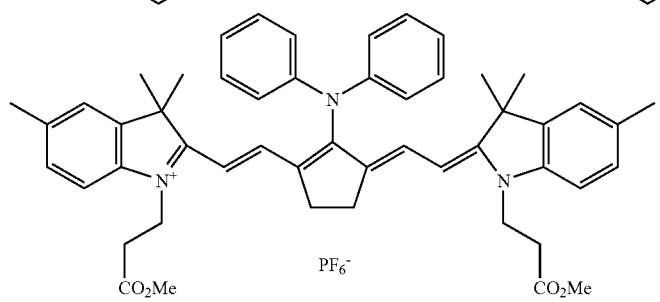
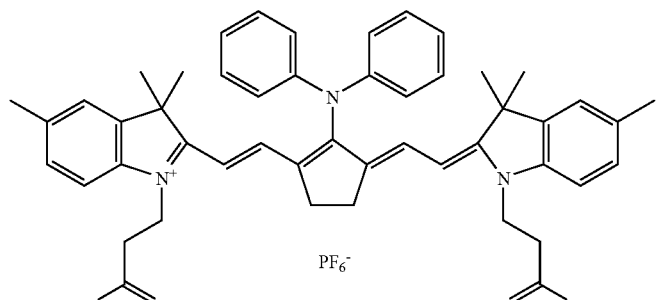
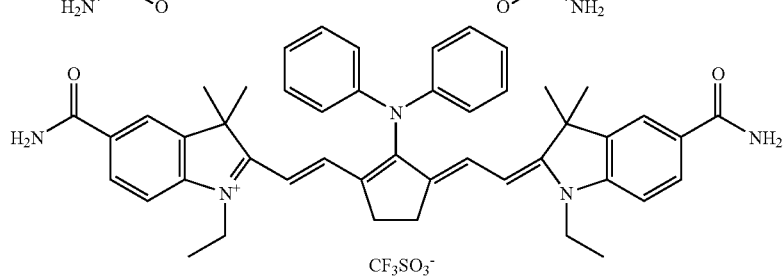
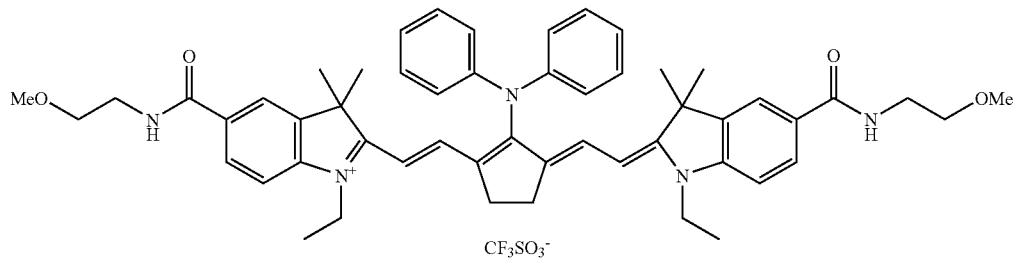

-continued
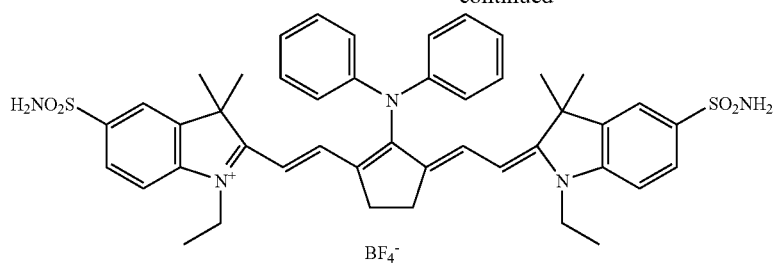
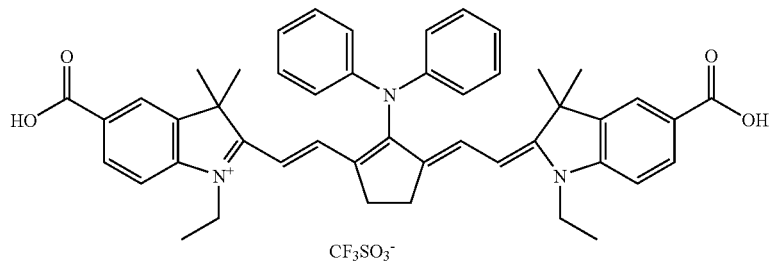
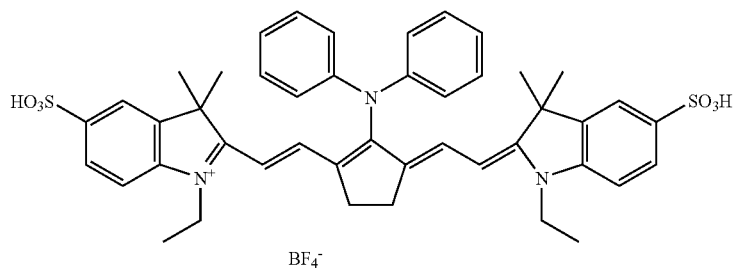
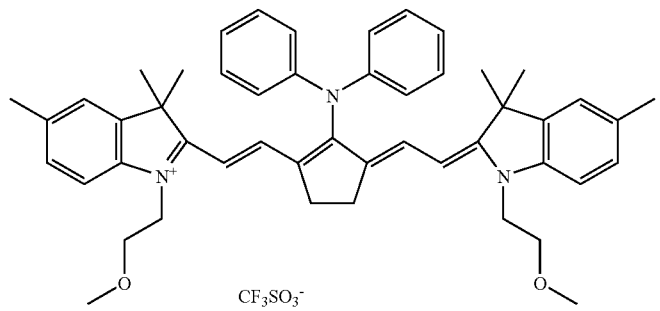
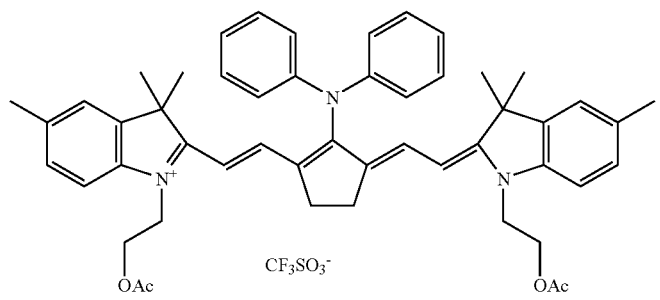
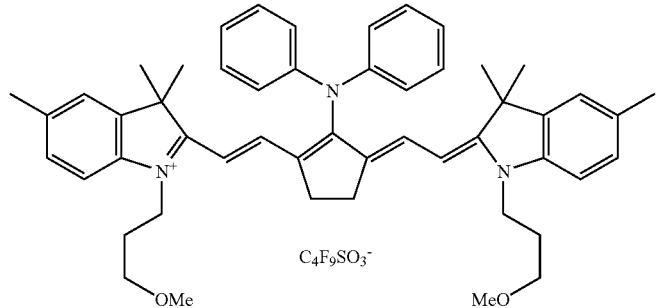

-continued
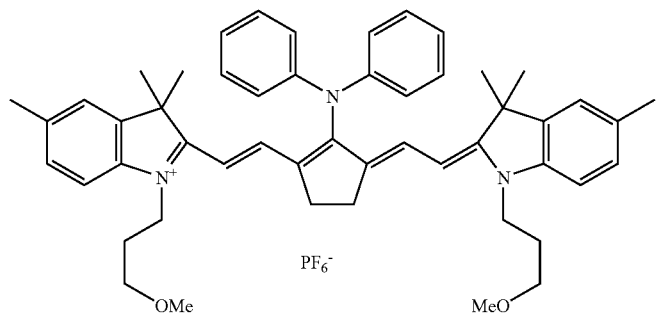
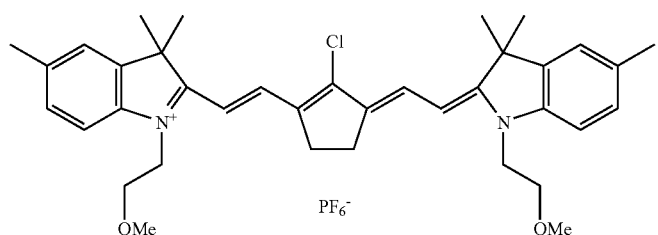
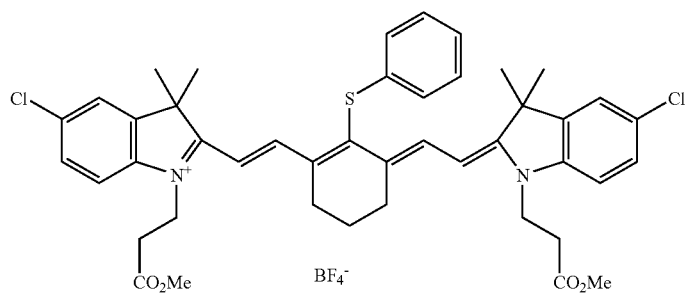
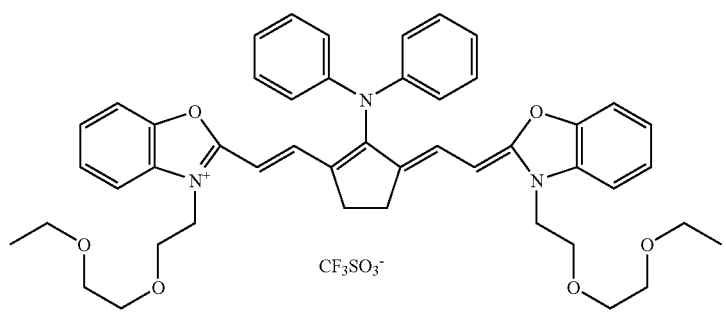
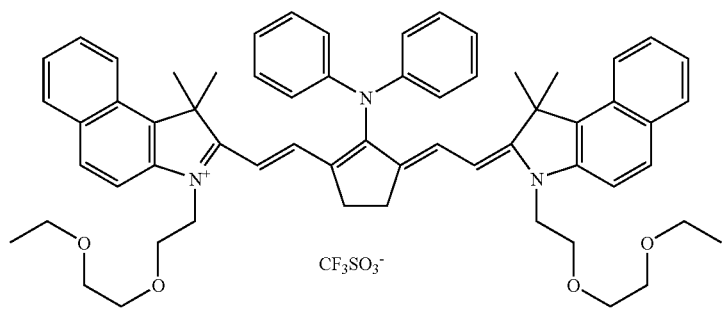

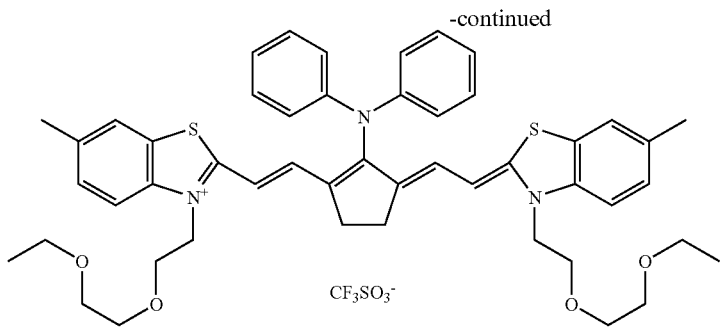

The infrared absorber (C) may be added to the same layer as the other components, or a separate layer may be provided and the infrared absorber may be added to this separate layer. With reference to the fabrication of a negative-working lithographic printing plate precursor, the infrared absorber (C) is added in such a manner that the absorbance of the image recording layer at the wavelength of maximum absorption in the 760 nm to 1200 nm wavelength range is 0.3 to 1.2 when measured by a reflection measurement procedure. The range of 0.4 to 1.1 is preferred. In the cited range, a uniform polymerization reaction develops across the thickness of the image recording layer, an excellent film strength in the image areas is obtained, and an excellent adhesiveness for the support is obtained.

The absorbance of the image recording layer can be adjusted through the quantity of infrared absorber addition to the image recording layer and through the thickness of the image recording layer. The absorbance can be measured by the usual methods. Measurement can be carried out, for example, by the following methods: the image recording layer is formed on a reflective support, e.g., aluminum, in a thickness determined as appropriate in the range required of the post-drying coating rate for lithographic printing plates, and the reflection density is then measured with an optical densitometer or measurement is carried out using a spectrophotometer by reflection using an integrating sphere.

The infrared absorber (C) is added to the image recording layer preferably at from 0.1 to 30 mass %, more preferably at from 0.5 to 20 mass %, and even more preferably at from 1 to 10 mass %, in each case with reference to the total solids fraction.

<(D) The Binder Polymer>

A binder polymer can be used in the image recording layer in the present invention in order to improve the film strength of the image recording layer. The heretofore known binder polymers can be used without limitation as the binder polymer used by the present invention, wherein film-forming polymers are preferred. Examples of such binder polymers are acrylic resins, polyvinyl acetal resins, polyurethane resins, polyurea resins, polyimide resins, polyamide resins, epoxy resins, methacrylic resins, polystyrene resins, novolac-type phenolic resins, polyester resins, synthetic rubbers, and natural rubbers.

The binder polymer may be crosslinkable in order to improve the film strength of the image areas. A crosslinkable functional group, e.g., an ethylenically unsaturated bond, may be introduced into the main chain of the polymer or in side chain position on the polymer in order to impart crosslinkability to the binder polymer. The crosslinkable functional group may be introduced through copolymerization.

Examples of polymers that have ethylenically unsaturated bonds in the molecular main chain are poly-1,4-butadiene, poly-1,4-isoprene, and so forth.

Examples of polymers that have ethylenically unsaturated bonds in side chain position on the molecule are polymers of an ester or amide of acrylic acid or methacrylic acid wherein the ester or amide residue (R in —COOR or CONHR) contains an ethylenically unsaturated bond.

Examples of the ethylenically unsaturated bond-containing residue (the R cited above) are as follows: —$(CH_2)_n$CR$^1$=CR$^2$R$^3$, —$(CH_2O)_n$CH$_2$CR$^1$=CR$^2$R$^3$, —$(CH_2CH_2O)_n$CH$_2$CR$^1$=CR$^2$R$^3$, —$(CH_2)_n$NH—CO—O—CH$_2$CR$^1$=CR$^2$R$^3$, —$(CH_2)_n$—O—CO—CR$^1$=CR$^2$R$^3$, and $(CH_2CH_2O)_2$—X (in these formulas, R$^1$ to R$^3$ each represent the hydrogen atom, a halogen atom, or $C_{1-20}$ alkyl, aryl, alkoxy, or aryloxy; R$^1$ may be bonded with R$^2$ or R$^3$ to form a ring; n is an integer from 1 to 10; and X is a dicyclopentadienyl residue).

The following are specific examples of the ester residue: —CH$_2$CH=CH$_2$ (described in Japanese Patent Publication No. Hei 7-21633), —CH$_2$CH$_2$O—CH$_2$CH=CH$_2$, —CH$_2$C(CH$_3$)=CH$_2$, —CH$_2$CH=CH—C$_6$H$_5$, —CH$_2$CH$_2$OCOCH=CH—C$_6$H$_5$, —CH$_2$CH$_2$—NH-COO—CH$_2$CH=CH$_2$, and CH$_2$CH$_2$O—X (X in the formula represents a dicyclopentadienyl residue).

The following are specific examples of the amide residue: —CH$_2$CH=CH$_2$, —CH$_2$CH$_2$—Y (Y in the formula represents a cyclohexene residue), and —CH$_2$CH$_2$—OCO—CH=CH$_2$.

For example, a free radical (polymerization-initiating radical or the propagating radical in the polymerization process based on the polymerizable compound) adds to the crosslinkable functional group in the crosslinkable binder polymer; addition polymerization occurs between polymers, either directly or through a polymer chain from the polymerizable compound; and curing occurs through the formation of crosslinks between the polymer molecules. Alternatively, an atom in the polymer (for example, a hydrogen atom on a carbon atom adjacent to the functional crosslinking group) is abstracted by a free radical to produce polymer radicals and these bond to each other to bring about curing by the formation of crosslinks between polymer molecules.

The crosslinkable group content in the binder polymer (content of the radically polymerizable unsaturated double bonds as determined by iodine titration) is preferably 0.1 to 10.0 mmol, more preferably 1.0 to 7.0 mmol, and most preferably 2.0 to 5.5 mmol, in each case per 1 g of the binder polymer. An excellent sensitivity and an excellent storage stability are obtained in the cited range.

Viewed from the perspective of improving the on-press developability of the unexposed areas of the image recording layer, the binder polymer preferably has a high solubility or dispersibility in the ink and/or fountain solution. The binder polymer is preferably oleophilic in order to improve the solubility or dispersibility in inks, and is preferably hydrophilic in order to improve the solubility or dispersibility in fountain solutions. Due to this, the combined used of an oleophilic binder polymer and a hydrophilic binder polymer is also effective in the present invention.

Suitable examples of hydrophilic binder polymers are binder polymers that contain a hydrophilic group such as the hydroxyl group, the carboxyl group, a carboxylate group, hydroxyethyl, polyoxyethyl, hydroxypropyl, polyoxypropyl, the amino group, aminoethyl, aminopropyl, the ammonium group, an amide group, carboxymethyl, the sulfo group, a phosphate group, and so forth.

The following are specific examples: gum arabic, casein, gelatin, starch derivatives, carboxymethyl cellulose and its sodium salt, cellulose acetate, sodium alginate, vinyl acetate-maleic acid copolymers, styrene-maleic acid copolymers, polyacrylic acids and their salts, polymethacrylic acids and their salts, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate that has a degree of hydrolysis of at least 60 mol % and preferably at least 80 mol %, polyvinyl formal, polyvinyl butyral, polyvinylpyrrolidone, homopolymers and copolymers of acrylamide, homopolymers and copolymers of methacrylamide, homopolymers and copolymers of N-methylolacrylamide, polyvinylpyrrolidone, alcohol-soluble nylon, polyethers between 2,2-bis(4-hydroxyphenyl)propane and epichlorohydrin, and so forth.

The binder polymer has a mass-average molar weight preferably of at least 5000 and more preferably from 10,000 to 300,000 and a number-average molar weight preferably of at least 1000 and more preferably from 2000 to 250,000. The polydispersity (mass-average molar mass/number-average molar weight) is preferably 1.1 to 10.

The binder polymer can be acquired as a commercial product or can be acquired by synthesis by known methods.

The binder polymer content is 5 to 90 mass %, preferably 5 to 80 mass %, and more preferably 10 to 70 mass %, in each case with respect to the total solids fraction in the image recording layer. An excellent image area strength and an excellent image formability are obtained in the cited range.

The (B) compound that has at least one addition-polymerizable ethylenically unsaturated bond and (D) binder polymer are preferably used in the present invention in quantities that provide a mass ratio of 0.4/1 to 1.8/1. 0.7/1 to 1.5/1 is more preferred. An effect of the present invention, i.e., an improvement in the on-press developability while maintaining the printing durability intact, is substantially manifested in the cited range.

<Microcapsule and/or Microgel>

Viewed from the perspective of obtaining an excellent on-press developability, the image recording layer in the present invention preferably assumes an embodiment that contains microcapsules and/or a microgel. That is, this is an embodiment in which the aforementioned components (A) to (D) that constitute the image recording layer and the other constituent components described below are incorporated in microcapsules and/or a microgel.

The microcapsules used by the present invention may, for example, as described in Japanese Patent Application Publication Nos. 2001-277740 and 2001-277742, incorporate all or a portion of the components that make up the image recording layer (the components (A) to (D) described above). However, constituent components of the image recording layer may also be present therein outside the microcapsules. In a preferred embodiment of a microcapsule-containing image recording layer, the hydrophobic constituent components are incorporated in the microcapsules and the hydrophilic constituent components are present outside the microcapsules.

In another embodiment of the present invention, the image recording layer may contain crosslinked resin particles, that is, may contain a microgel. This microgel can contain a portion of the aforementioned components (A) to (D) within the microgel and/or on its surface. Specifically, an embodiment in which a reactive microgel is made by placing component (B), i.e., the compound that has at least one addition-polymerizable ethylenically unsaturated bond, on the surface of the microgel is particularly preferred from the standpoints of the image-formation sensitivity and the printing durability.

Known methods can be employed to microcapsulate the constituent components of the image recording layer or to formulate these components as a microgel.

The microcapsule production method can be exemplified by the following, but is not limited to the following: the use of coacervation as described in U.S. Pat. Nos. 2,800,457 and 2,800,458; interfacial polymerization as described in U.S. Pat. No. 3,287,154 and Japanese Patent Publication Nos. Sho 38-19574 and Sho 42-446; polymer precipitation as described in U.S. Pat. Nos. 3,418,250 and 3,660,304; the use of an isocyanate polyol wall material as described in U.S. Pat. No. 3,796,669; the use of an isocyanate wall material as described in U.S. Pat. No. 3,914,511; the use of a urea/form-aldehyde-type or urea/formaldehyde/resorcinol-type wall-forming material as described in U.S. Pat. Nos. 4,001,140, 4,087,376, and 4,089,802; the use of a melamine-formaldehyde resin or hydroxycellulose wall material as described in U.S. Pat. No. 4,025,445; in situ polymerization of monomer as described in Japanese Patent Publication Nos. Sho 36-9163 and Sho 51-9079; spray drying as described in GB Patent No. 930422 and U.S. Pat. No. 3,111,407; and electrolytic dispersion and cooling as described in GB Patent Nos. 952807 and 967074.

A preferred microcapsule wall for use in the present invention has 3-dimensional crosslinking and is solvent swellable. From this standpoint, the microcapsule wall material is preferably polyurea, polyurethane, polyester, polycarbonate, polyamide, or a mixture of the preceding, with polyurea and polyurethane being particularly preferred. In addition, a compound having a crosslinkable functional group (e.g., an ethylenically unsaturated bond) capable of introduction into the binder polymer, previously described, may be introduced into the microcapsule wall.

The microgel production method can be the interfacial polymerization-based granulation described in Japanese Patent Publication Nos. Sho 38-19574 and Sho 42-446 or granulation based on nonaqueous dispersion polymerization as described in Japanese Patent Application Publication No. Hei 5-61214. However, there is no limitation to these methods.

The known microcapsule production methods described above can be used for the aforementioned interfacial polymerization-based method.

A preferred microgel for use in the present invention is granulated using interfacial polymerization and has 3-dimensional crosslinking. From this standpoint, the material used is preferably polyurea, polyurethane, polyester, polycarbonate, polyamide, or a mixture or the preceding, with polyurea and polyurethane being particularly preferred.

The average particle size of the microcapsule or microgel is preferably from 0.01 to 3.0 μm, more preferably from 0.05 to 2.0 μm, and particularly preferably from 0.10 to 1.0 μm. Good resolution and good timewise stability are obtained within the cited range.

<Other Components>

The image recording layer in the present invention may also contain other components on an optional basis.

Other components that can be present in the image forming layer of the present invention are described in the following.

(1) Surfactant

A surfactant can be used in the image recording layer of the present invention to improve coating planarity.

The surfactant can be, for example, a nonionic surfactant, anionic surfactant, cationic surfactant, amphoteric surfactant, or fluorosurfactant, wherein fluorosurfactants are preferred thereamong.

The fluorosurfactant can be, for example, a fluorosurfactant that contains a perfluoroalkyl group in the molecule. Such fluorosurfactants can be exemplified by anionic fluorosurfactants such as perfluoroalkylcarboxylate salts, perfluoroalkylsulfonate salts, perfluoroalkyl phosphate esters, and so forth; amphoteric fluorosurfactants such as perfluoroalkylbetaines and so forth; cationic fluorosurfactants such as perfluoroalkyltrimethylammonium salts and so forth; and nonionic fluorosurfactants such as perfluoroalkylamine oxides, perfluoroalkyl/ethylene oxide adducts, oligomers that contain both a perfluoroalkyl group and a hydrophilic group, oligomers that contain both a perfluoroalkyl group and an oleophilic group, oligomers that contain a perfluoroalkyl group and a hydrophilic group and an oleophilic group, urethanes that contain both a perfluoroalkyl group and an oleophilic group, and so forth. Also suitable are the fluorosurfactants described in Japanese Patent Application Publication Nos. Sho 62-170950, Sho 62-226143, and Sho 60-168144.

A single surfactant may be used or a combination of two or more surfactants may be used.

The surfactant content is preferably 0.001 to 10 mass % and more preferably 0.01 to 5 mass %, in each case with reference to the total solids fraction in the image recording layer.

(2) Colorant

A dye that absorbs strongly in the visible light region can be used in the image recording layer of the present invention as an image colorant. Specific examples are Oil Yellow #101, Oil Yellow #103, Oil Pink #312, Oil Green BG, Oil Blue BOS, Oil Blue #603, Oil Black BY, Oil Black BS, and Oil Black T-505 (the preceding are products of Orient Chemical Industries, Ltd.), as well as Victoria Pure Blue, Crystal Violet (CI 42555), Methyl Violet (CI 42535), Ethyl Violet, Rhodamine B (CI 145170B), Malachite Green (CI 42000), Methylene Blue (CI 52015), and the dyes described in Japanese Patent Application Publication No. Sho 62-293247. Also suitable for use are pigments such as phthalocyanine pigments, azo pigments, carbon black, titanium oxide, and so forth.

The addition of these colorants is preferred because their addition facilitates discrimination of the image areas from the nonimage areas after image formation.

The quantity of addition is 0.01 to 10 mass % with reference to the total solids fraction of the image recording layer.

(3) Print-Out Agent

A compound that changes color under the action of acid or radicals can be added to the image recording layer of the present invention in order to produce a print-out image. Various dyes, for example, diphenylmethane types, triphenylmethane types, thiazine types, oxazine types, xanthene types, anthraquinone types, iminoquinone types, azo types, and azomethine types, are effectively used as this compound.

Specific examples as follows: dyes such as Brilliant Green, Ethyl Violet, Methyl Green, Crystal Violet, Basic Fuchsine, Methyl Violet 2B, Quinaldine Red, Rose Bengal, Methanyl Yellow, Thymol Sulfophthalein, Xylenol Blue, Methyl Orange, Paramethyl Red, Congo Red, Benzopurpurin 4B, α-Naphthyl Red, Nile Blue 2B, Nile Blue A, Methyl Violet, Malachite Green, Parafuchsine, Victoria Pure Blue BOH (Hodogaya Chemical Co., Ltd.), Oil Blue #603 (Orient Chemical Industries, Ltd.), Oil Pink #312 (Orient Chemical Industries, Ltd.), Oil Red 5B (Orient Chemical Industries, Ltd.), Oil Scarlet #308 (Orient Chemical Industries, Ltd.), Oil Red OG (Orient Chemical Industries, Ltd.), Oil Red RR (Orient Chemical Industries, Ltd.), Oil Green #502 (Orient Chemical Industries, Ltd.), Spiron Red BEH Special (Hodogaya Chemical Co., Ltd.), m-Cresol Purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carboxystearylamino-4-p-N,N-bis(hydroxyethyl)aminophenyliminonaphthoquinone, 1-phenyl-3-methyl-4-p-diethylaminophenylimino-5-pyrazolone, and 1-β-naphthyl-4-p-diethylaminophenylimino-5-pyrazolone; also, leuco dyes such as p,p',p''-hexamethyltriaminotriphenylmethane (Leuco Crystal Violet) and Pergascript Blue SRB (Ciba Geigy Ltd.).

In addition to the preceding, the leuco dyes known as materials for heat-sensitive paper and pressure-sensitive paper are suitably used. Specific examples are as follows: Crystal Violet lactone, Malachite Green lactone, benzoyl leuco Methylene Blue, 2-(N-phenyl-N-methylamino)-6-(N-p-tolyl-N-ethyl)aminofluoran, 2-anilino-3-methyl-6-(N-ethyl-p-tolidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N—N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-aminofluoran, 3-(N,N-diethylamino)-7-(4-chloroanilino)fluoran, 3-(N,N-diethylamino)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrrolidino-6-methyl-7-anilinofluoran, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-azaphthalide, and 3-(4-diethylaminophenyl)-3-(1-ethyl-2-methylindol-3-yl)phthalide.

A suitable quantity of addition for the dye that undergoes acid- or radical-induced color change is in each case 0.01 to 10 mass % with reference to the solids fraction in the image recording layer.

(4) Polymerization Inhibitor

A small amount of a thermal polymerization inhibitor is preferably added to the image recording layer of the present invention in order to prevent unwanted thermal polymerization of the radically polymerizable monomer (B) during production or storage of the image recording layer.

Suitable examples of the thermal polymerization inhibitor are hydroquinone, p-methoxyphenol, di-tert-butyl-p-cresol, pyrogallol, tert-butylcatechol, benzoquinone, 4,4'-thiobis(3- methyl-6-tert-butylphenol), 2,2'-methylenebis(4-methyl-6-tert-butylphenol), and N-nitroso-N-phenylhydroxylamine/aluminum salt.

The quantity of addition for the thermal polymerization inhibitor is preferably approximately 0.01 mass % to approximately 5 mass % with reference to the total solids fraction of the image recording layer.

(5) Higher Fatty Acid Derivatives and so Forth

In order to prevent oxygen-mediated inhibition of the polymerization, for example, a higher fatty acid or derivative thereof, such as behenic acid or behenamide, may be added to the image recording layer of the present invention; this becomes partitioned to the surface of the image recording layer in the drying process that follows coating. The quantity of addition of the higher fatty acid derivative is preferably approximately 0.1 mass % to approximately 10 mass % with reference to the total solids fraction of the image recording layer.

(6) Plasticizer

The image recording layer of the present invention may contain a plasticizer in order to improve the on-press develop ability.

Suitable examples of the plasticizer are as follows: phthalate esters such as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate, diallyl phthalate, and so forth; glycol esters such as dimethyl glycol phthalate, ethyl phthalyl ethyl glycolate, methyl phthalyl ethyl glycolate, butyl phthalyl butyl glycolate, triethylene glycol dicaprylate, and so forth; phosphate esters such as tricresyl phosphate, triphenyl phosphate, and so forth; esters of dibasic fatty acids such as diisobutyl adipate, dioctyl adipate, dimethyl sebacate, dibutyl sebacate, dioctyl azelate, dibutyl maleate, and so forth; and also polyglycidyl methacrylate, triethyl citrate, glycerol triacetate, and butyl laurate.

The plasticizer content is preferably no more than approximately 30 mass % with respect to the total solids fraction in the image recording layer.

(7) Finely Divided Inorganic Particles

The image recording layer of the present invention may contain finely divided inorganic particles in order to improve the cured film strength in the image areas and improve the on-press developability of the nonimage areas.

Suitable examples of the finely divided inorganic particles are silica, alumina, magnesium oxide, titanium oxide, magnesium carbonate, calcium alginate, and mixtures of the preceding. Even though these lack the ability to convert light to heat, they can be used to strengthen the film and, through surface roughening, to reinforce the interfacial adhesion.

The finely divided inorganic particles preferably have an average particle size of 5 nm to 10 μm and more preferably 0.5 to 3 μm. Within the cited range, the finely divided inorganic particles can be stably dispersed in the image recording layer and can satisfactorily maintain the film strength of the image recording layer and can also form nonimage areas that exhibit an excellent hydrophilicity and thus are resistant to scumming during printing.

The finely divided inorganic particles under consideration can be easily acquired as commercial products, e.g., as a colloidal dispersion of silica.

The content of the finely divided inorganic particles is preferably no more than 40 mass % and more preferably no more than 30 mass %, in each case with reference to the total solids fraction of the image recording layer.

(8) Low Molecular Weight Hydrophilic Compounds

The image recording layer of the present invention may contain a low molecular weight hydrophilic compound in order to improve the on-press developability without lowering the printing durability.

The low molecular weight hydrophilic compound can be exemplified by water-soluble organic compounds, e.g., glycols such as ethylene glycol, diethylene glycol, triethylene glycol, propylene glycol, dipropylene glycol, tripropylene glycol, and so forth, as well as the ether and ester derivatives of the preceding; polyhydroxy compounds such as glycerol, pentaerythritol, tris(2-hydroxyethyl)isocyanurate, and so forth; organic amines such as triethanolamine, diethanolamine, monoethanolamine, and so forth, as well as their salts; organosulfonic acids such as alkylsulfonic acids, toluenesulfonic acid, benzenesulfonic acid, and so forth, as well as their salts; organosulfamic acids such as alkylsulfamic acids and so forth, as well as their salts; organosulfuric acids such as alkyl sulfates, alkyl ether sulfates, and so forth, as well as their salts; organophosphonic acids such as phenylphosphonic acid and so forth, as well as their salts; and organic carboxylic acids such as tartaric acid, oxalic acid, citric acid, malic acid, gluconic acid, amino acids, and so forth, as well as their salts.

The use is preferred among the preceding of the salts of organosulfur acids, such as the sodium and lithium salts of organosulfonic acids, organosulfamic acids, and organosulfuric acids.

Examples of specific organosulfonate salt compounds are sodium normal-butylsulfonate, sodium isobutylsulfonate, sodium sec-butylsulfonate, sodium tert-butylsulfonate, sodium normal-pentylsulfonate, sodium 1-ethylpropylsulfonate, sodium normal-hexylsulfonate, sodium 1,2-dimethylpropylsulfonate, sodium 2-ethylbutylsulfonate, sodium 2-ethylhexylsulfonate, sodium cyclohexylsulfonate, sodium normal-heptylsulfonate, sodium normal-octylsulfonate, sodium tert-octylsulfonate, sodium normal-nonylsulfonate, sodium allylsulfonate, sodium 2-methylallylsulfonate, sodium 4-[2-(2-butyloxyethoxy)ethoxy]butane-1-sulfonate, sodium 4-[2-(2-hexyloxyethoxy)ethoxy]butane-1-sulfonate, sodium 4-{2-[2-(2-ethyl)hexyloxyethoxy]ethoxy}butane-1-sulfonate, sodium 4-[2-(2-decyloxyethoxy)ethoxy]butane-1-sulfonate, sodium 4-{2-[2-(2-butyloxyethoxy)ethoxy]ethoxy}butane-1-sulfonate, sodium 4-[2-{2-[2-(2-ethyl)hexyloxyethoxy]ethoxy}ethoxy]butane-1-sulfonate, sodium benzenesulfonate, sodium p-toluenesulfonate, sodium p-hydroxybenzenesulfonate, sodium p-styrenesulfonate, sodium dimethyl 5-sulfoisophthalate, disodium 1,3-benzenedisulfonate, trisodium 1,3,5-benzenetrisulfonate, sodium p-chlorobenzenesulfonate, sodium 3,4-dichlorobenzenesulfonate, sodium 1-naphthylsulfonate, sodium 2-napthylsulfonate, sodium 4-hydroxynaphthylsulfonate, disodium 1,5-naphthalenedisulfonate, disodium 2,6-naphthalenedisulfonate, trisodium 1,3,6-napthalenetrisulfonate, and the salts of the preceding obtained by exchange with lithium.

Specific organosulfamate salt compounds are sodium normal-butylsulfamate, sodium isobutylsulfamate, sodium tert-butylsulfamate, sodium normal-pentylsulfamate, sodium 1-ethylpropylsulfamate, sodium normal-hexylsulfamate, sodium 1,2-dimethylpropylsulfamate, sodium 2-ethylbutylsulfamate, sodium cyclohexylsulfamate, and the salts of the preceding obtained by exchange with lithium.

The structure of the hydrophobic moiety is small in these compounds and as a consequence they have almost no surface-active action and can be clearly distinguished from the previously cited surfactants that are used to good effect, such as the long-chain alkylsulfonate salts and long-chain alkylbenzenesulfonate salts.

Compounds represented by the following general formula (5) are preferably used as the organosulfate salt.

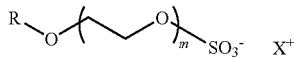 (5)

In general formula (5), R represents alkyl, alkenyl, alkynyl, aryl, or a heterocyclic group; m represents an integer from 1 to 4; and X represents sodium, potassium, or lithium.

Preferred examples of R are straight chain, branched, and cyclic $C_{1-12}$ alkyl, $C_{1-12}$ alkenyl, $C_{1-12}$ alkynyl, and aryl that has no more than 20 carbons. These groups may also have a substituent or substituents. Introducible substituents in this case can be exemplified by straight chain, branched, and cyclic $C_{1-12}$ alkyl, $C_{1-12}$ alkenyl, $C_{1-12}$ alkynyl, halogen, and aryl that has no more than 20 carbons.

Preferred examples of compounds represented by general formula (5) are as follows: sodium oxyethylene 2-ethylhexyl ether sulfate, sodium dioxyethylene 2-ethylhexyl ether sulfate, potassium dioxyethylene 2-ethylhexyl ether sulfate, lithium dioxyethylene 2-ethylhexyl ether sulfate, sodium trioxyethylene 2-ethylhexyl ether sulfate, sodium tetraoxyethylene 2-ethylhexyl ether sulfate, sodium dioxyethylene hexyl ether sulfate, sodium dioxyethylene octyl ether sulfate, and sodium dioxyethylene lauryl ether sulfate. The compounds most preferred among the preceding are sodium dioxyethylene 2-ethylhexyl ether sulfate, potassium dioxyethylene 2-ethylhexyl ether sulfate, and lithium dioxyethylene 2-ethylhexyl ether sulfate.

The low molecular weight hydrophilic compound is added to the image recording layer so as to be preferably at least 0.5 mass % to no more than 20 mass % of the total solids fraction of the image recording layer, more preferably at least 1 mass % to no more than 10 mass % of the total solids fraction of the image recording layer, and even more preferably at least 2 mass % to no more than 8 mass % of the total solids fraction of the image recording layer. An excellent on-press developability and an excellent printing durability are obtained in the cited range.

A single one of these compounds may be used or a mixture of two or more may be used.

(9) Oleosensitizer

An oleosensitizer, e.g., a phosphonium compound, low molecular weight nitrogenous compound, or ammonium group-containing polymer, can be used in the image recording layer in order to improve the receptivity in those instances where an inorganic layer compound is present in the protective layer, infra. Different species may be used in combination as the oleosensitizer.

These compounds function as a surface coating agent (oleosensitizer) for the inorganic layer compound and prevent the inorganic layer compound from lowering the receptivity during the course of printing.

Suitable phosphonium compounds can be exemplified by compounds represented by the following general formula (6) as described in Japanese Patent Application Publication No. 2006-297907 and compounds represented by the following general formula (7) as described in Japanese Patent Application Publication No. 2007-50660.

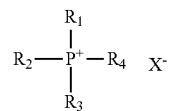 (6)

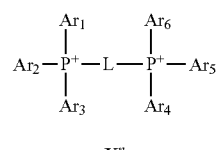 (7)

$R_1$ to $R_4$ in general formula (6) each independently represent optionally substituted alkyl, alkenyl, alkynyl, cycloalkyl, alkoxy, aryl, aryloxy, alkylthio, or a heterocyclic group or the hydrogen atom. At least two of $R_1$ to $R_4$ may be bonded to each other to form a ring. X— represents a counteranion.

In the case of general formula (7), $Ar_1$ to $Ar_6$ each independently represent aryl or a heterocyclic group; L represents a divalent linking group; X represents an n-valent counteranion; n represents an integer of 1 to 3; and m represents a number that satisfies n×m=2. Preferred examples of the aryl here are phenyl, naphthyl, tolyl, xylyl, fluorophenyl, chlorophenyl, bromophenyl, methoxyphenyl, ethoxyphenyl, dimethoxyphenyl, methoxycarbonylphenyl, dimethylaminophenyl, and so forth. The heterocyclic group can be exemplified by pyridyl, quinolyl, pyrimidinyl, thienyl, furyl, and so forth. L represents a divalent linking group. The number of carbons in the linking group is preferably 6 to 15, and more preferably this is a $C_{6-12}$ linking group. X— represents a counteranion, wherein preferred counteranions are halogen anions such as Cl—, Br—, and I—, the sulfonate anion, carboxylate anions, sulfate ester anions, $PF_6$—, $BF_4$—, and the perchlorate anion. Particularly preferred thereamong are halogen anions such as Cl—, Br—, and I—, the sulfonate anion, and carboxylate anions.

The following are specific examples of phosphonium compounds represented by the above cited general formulas (6) and (7).

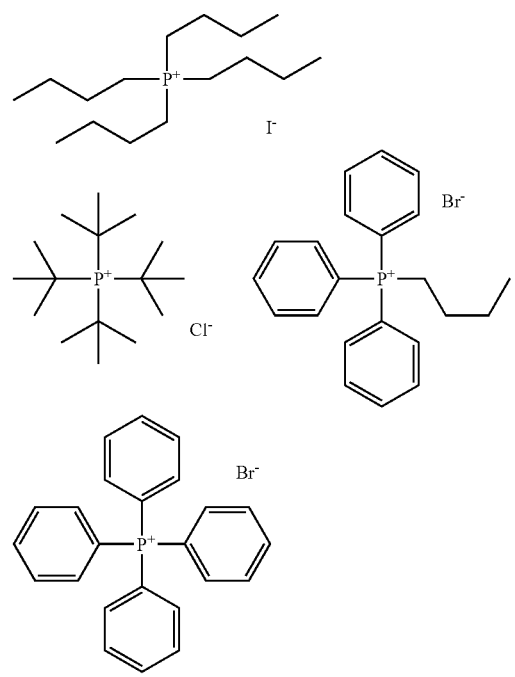

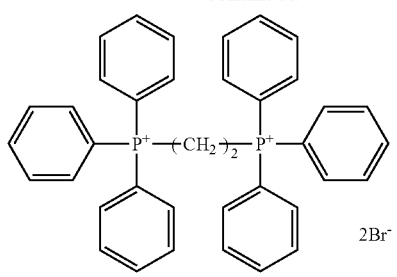

2Br⁻

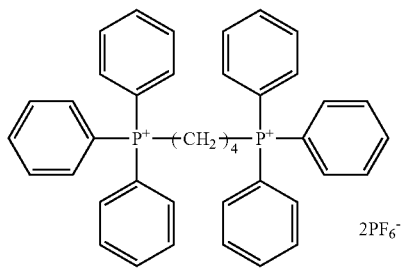

2PF₆⁻

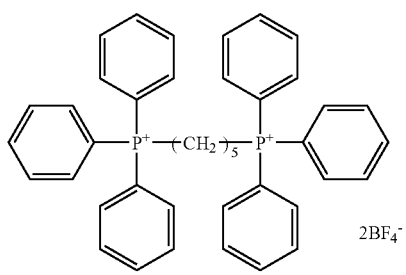

2BF₄⁻

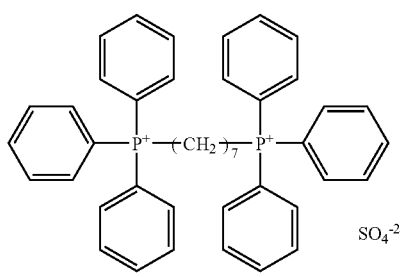

SO₄⁻²

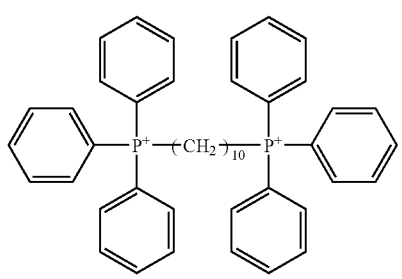

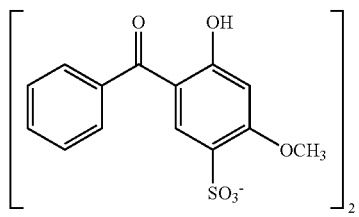

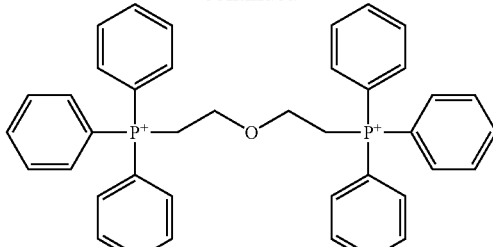

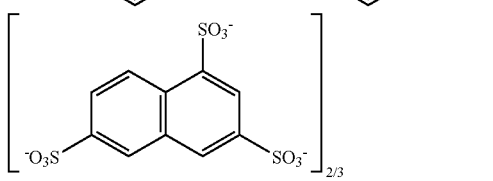

In addition to the phosphonium compounds described above, low molecular weight nitrogenous compounds are examples of oleosensitizers suitable for use in the present invention. Compounds having the structure shown in general formula (8) below are examples of preferred low molecular weight nitrogenous compounds.

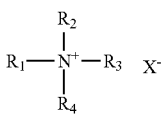

(8)

$R_1$ to $R_4$ in the formula each independently represent alkyl, alkenyl, alkynyl, cycloalkyl, alkoxy, aryl, aralkyl, or a heterocyclic group, in each case substituted or unsubstituted, or the hydrogen atom. At least two of $R_1$ to $R_4$ may be bonded to each other with the formation of a ring. X— is an anion and represents $PF_6$—, $BF_4$—, or an organosulfonate anion having a substituent selected from alkyl, alkenyl, alkynyl, cycloalkyl, alkoxy, aryl, aralkyl, and heterocyclic groups.

Thus, the low molecular weight nitrogenous compound used by the present invention can be an amine salt in which at least one of $R_1$ to $R_4$ is the hydrogen atom or a quaternary ammonium salt in which none of $R_1$ to $R_4$ are the hydrogen atom. Other acceptable structures are the imidazolinium salts represented by the following general formula (9), benzoimidazolinium salts represented by the following general formula (10), pyridinium salts represented by the following general formula (11), and quinolinium salts with the following general formula (12).

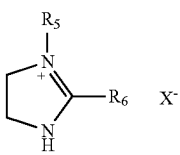

(9)

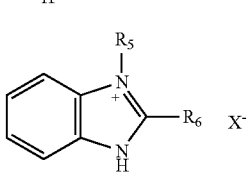

(10)

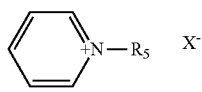
(11)

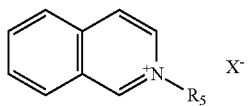
(12)

$R_5$ and $R_6$ in the preceding formulas represent alkyl, alkenyl, alkynyl, cycloalkyl, alkoxy, aryl, aralkyl, or a heterocyclic group, in each case substituted or unsubstituted, or the hydrogen atom. X— is an anion and is defined as for X— in the previously cited general formula (8).

The use is preferred among the preceding of quaternary ammonium salts and pyridinium salts. Specific examples of these are as follows.

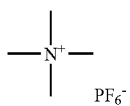
(A-1)

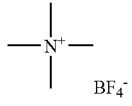
(A-2)

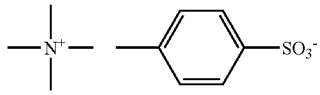
(A-3)

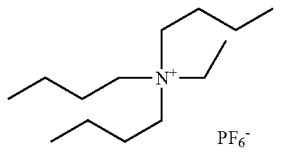
(A-4)

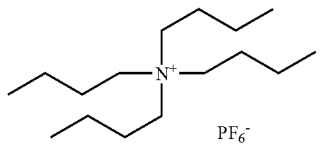
(A-5)

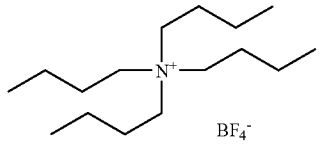
(A-6)

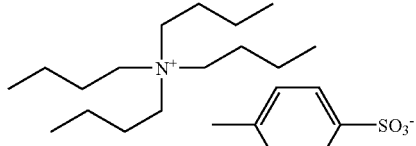
(A-7)

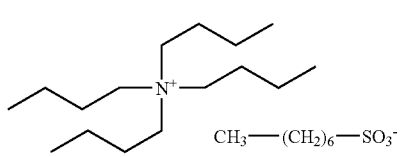
(A-8)

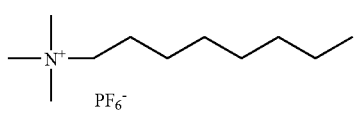
(A-9)

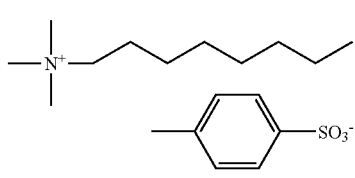
(A-10)

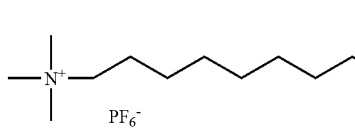
(A-11)

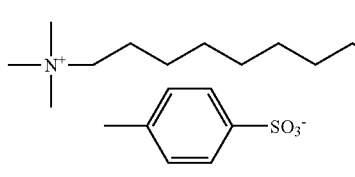
(A-12)

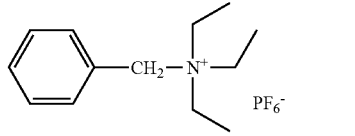
(A-13)

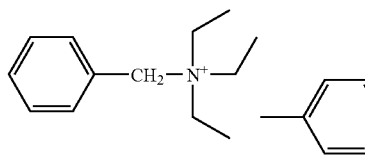
(A-14)

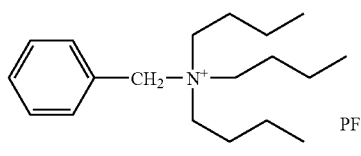
(A-15)

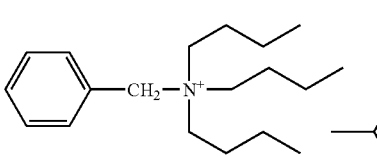
(A-16)

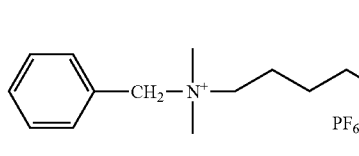
(A-17)

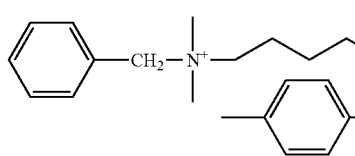
(A-18)

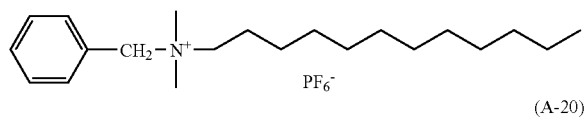

(A-19)

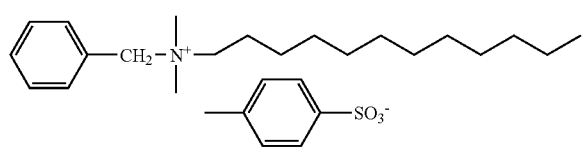

(A-20)

The quantity of addition of the aforementioned phosphonium compound or low molecular weight nitrogenous compound to the image recording layer is preferably 0.01 to 20 mass %, more preferably 0.05 to 10 mass %, and most preferably 0.1 to 5 mass %, in each case with reference to the solids fraction of the image recording layer. A good ink receptivity during printing is obtained within these ranges.

The ammonium group-containing polymers shown below are also suitable for the oleosensitizer used in the present invention. While the ammonium group-containing polymer need only have the ammonium group in its structure, polymers that contain the structures represented by the following general formula (13) and general formula (14) as repeat units are preferred.

(13)

(14)

(In the formulas, $R^{11}$ and $R^{12}$ each independently represent the hydrogen atom or methyl; $R^2$ represents a divalent linking group such as optionally substituted alkylene and optionally substituted alkyleneoxy; $R^{31}$, $R^{32}$, and $R^{33}$ each independently represent $C_{1-10}$ alkyl or aralkyl; X— represents an organic or inorganic anion, such as F—, Cl—, Br—, I—, an optionally substituted benzenesulfonate anion, the methyl sulfate anion, the ethyl sulfate anion, the propyl sulfate anion, an optionally branched butyl sulfate anion, an optionally branched amyl sulfate anion, $PF_6$—, $BF_4$—, $B(C_6F_5)_4$—, and so forth; $R^4$ represents $C_{1-21}$ alkyl, aralkyl, aryl, —$(C_2H_4O)_n$—$R^5$, or $(C_3H_6O)_n$—$R^5$; $R^5$ represents the hydrogen atom, methyl, or ethyl; and n is 1 or 2.)

This ammonium salt-containing polymer contains at least one structural unit represented by general formula (13) and at least one structural unit represented by general formula (14), but may contain two or more of either structural unit and may contain two or more of both structural units. There is no limitation on the ratio between the two structural units, but 5:95 to 80:20 is particularly preferred. This polymer may contain other copolymer components within a range that can retain the effects of the present invention.

This ammonium salt-containing polymer has a value for the reduced specific viscosity (measured as described below, unit: cSt/g/mL) preferably in the range of 5 to 120, more preferably in the range of 10 to 110, and particularly preferably in the range of 15 to 100.

<Method of Measuring the Reduced Specific Viscosity>

3.33 g of the 30 mass % polymer solution (1 g as the solids fraction) is weighed into a 20 mL volumetric flask and the flask is brought to volume with N-methylpyrrolidone. This solution is introduced into a Ubbelohde reduced viscosity capillary tube (viscosity constant=0.010 cSt/s); the time required for downflow is measured at 30° C.; and the calculation is performed by the usual method using the following formula.

kinematic viscosity=viscosity constant×the time(s) required for the fluid to pass through the capillary tube The content of the ammonium salt-containing polymer is preferably 0.0005 mass % to 30.0 mass %, more preferably 0.001 mass % to 20.0 mass %, and most preferably 0.002 mass % to 15.0 mass %, in each case with reference to the total solids fraction of the image recording layer. An excellent receptivity is obtained in the cited range. The ammonium salt-containing polymer may additionally be present in the protective layer.

Specific examples of the ammonium salt-containing polymer are provided below.

(1)

(2)

-continued
(3)
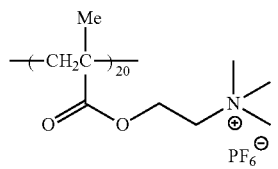 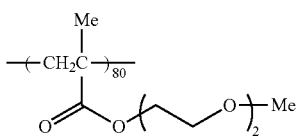
(4)
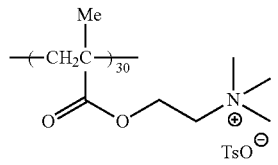 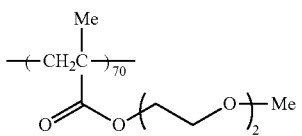
(5)
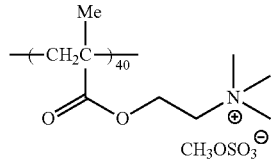 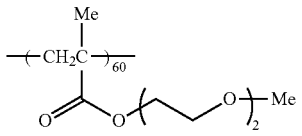
(6)
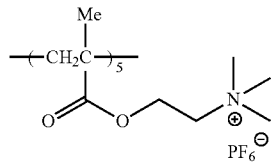 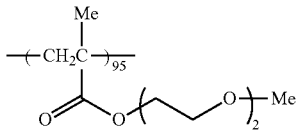
(7)
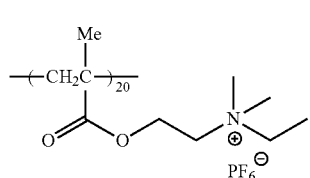 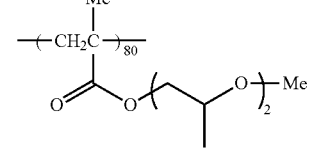
(8)
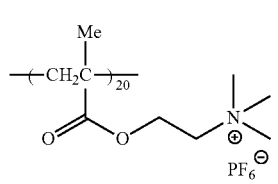 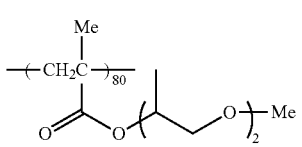
(9)
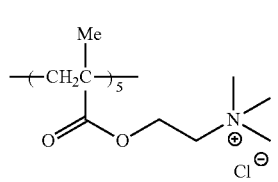 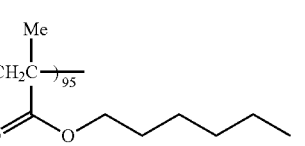
(10)
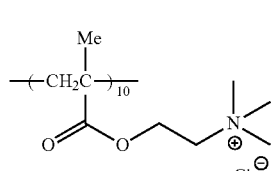 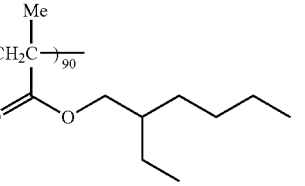
(11)
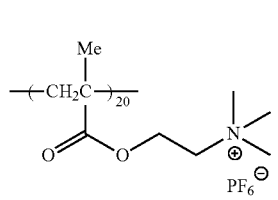 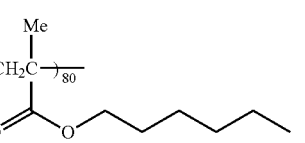

-continued
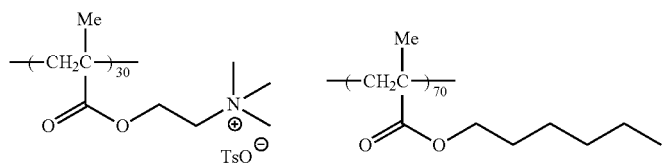
(12)
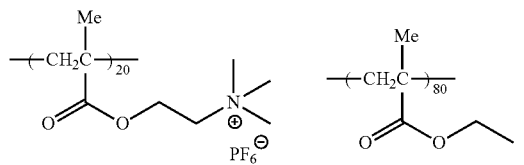
(13)
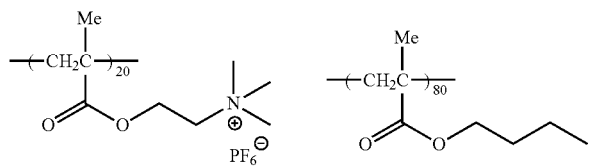
(14)
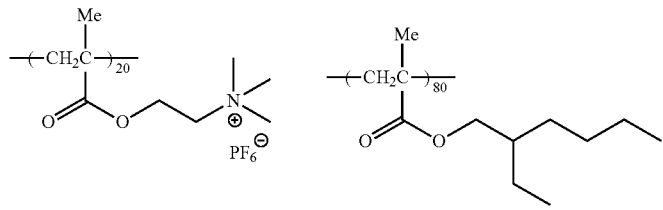
(15)
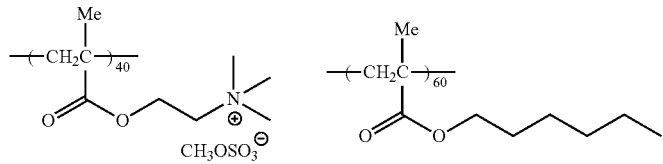
(16)
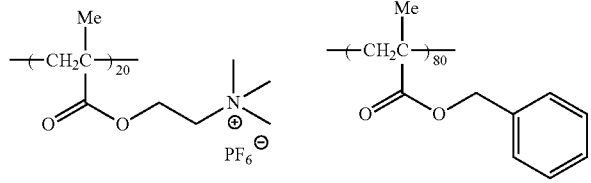
(17)
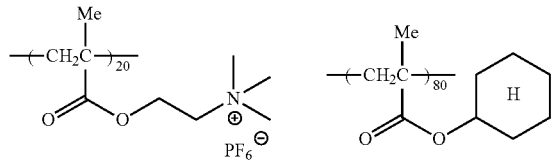
(18)
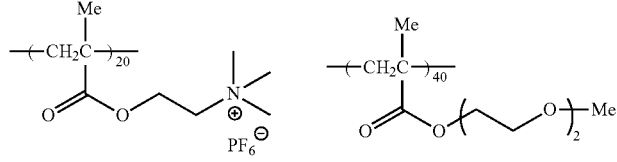
(19)
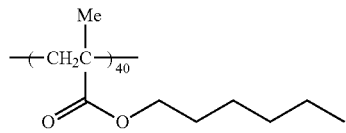

-continued

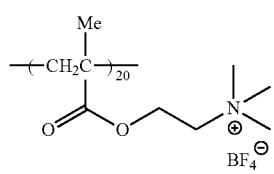 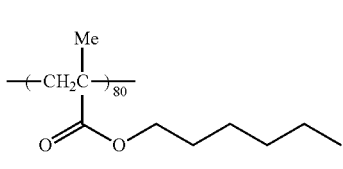

(20)

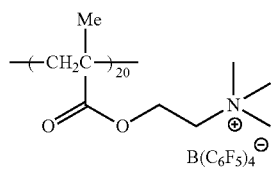 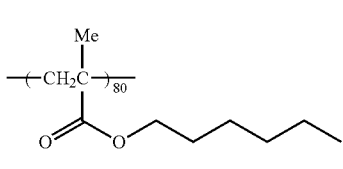

(21)

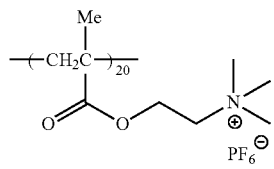 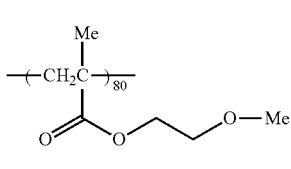

(22)

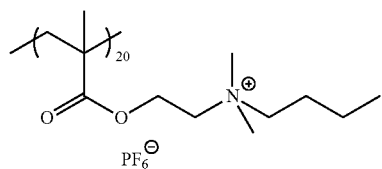 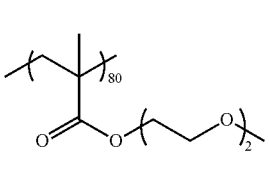

(23)

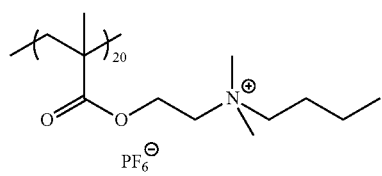 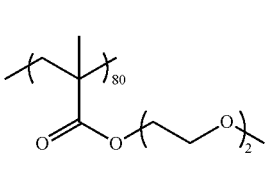

(24)

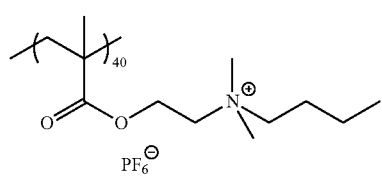 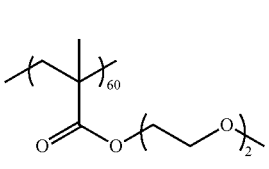

(25)

<Formation of the Image Recording Layer>

The image recording layer of the present invention is formed by dissolving or dispersing the required components as described above in solvent to form a coating fluid; coating this coating fluid on a support; and drying.

The solvent used here can be exemplified by ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, water, and so forth, but the solvent is not limited to the preceding. A single one of these solvents or a mixture of these solvents may be used. The solids concentration in the coating fluid is preferably 1 to 50 mass %.

The image recording layer of the present invention may also be formed as an image recording layer with a multilayer structure by preparing a plurality of coating fluids in which the same or different components (=the components described above) are dispersed or dissolved in the same solvent or different solvents and by carrying out coating and drying a plurality of times.

The application rate (solids fraction) for the image recording layer on the support that is obtained after coating and drying will vary with the application, but 0.3 to 3.0 g/m² is generally preferred. An excellent sensitivity is obtained in the cited range, as are excellent film-formation properties for the image recording layer.

A variety of methods can be used for the coating method. Examples are bar coater coating, spin coating, spray coating, curtain coating, dip coating, air knife coating, blade coating, roll coating, and so forth.

(The Undercoat Layer)

The lithographic printing plate precursor may as necessary be provided with an undercoat layer (also called an intermediate layer or interlayer) between the image recording layer and the support.

This undercoat layer facilitates delamination of the image recording layer from the support in the unexposed areas and thereby improves the developability. In addition, when exposure is carried out with an infrared laser, the undercoat layer functions as a heat insulating layer; as a consequence, the heat generated by exposure is prevented from diffusing to the support and is thereby efficiently utilized, accruing the advantage of supporting an increase in the sensitivity.

Preferred compounds for forming the undercoat layer can be specifically exemplified by silane coupling agents that contain an addition-polymerizable ethylenic double bond reactive group, as described in Japanese Patent Application Publication No. Hei 10-282679, and phosphorus compounds containing an ethylenic double bond reactive group, as described in Japanese Patent Application Publication No. Hei 2-304441.

Compounds most preferred for the formation of the undercoat layer can be exemplified by polymer resins that contain an adsorptive group, hydrophilic group, and crosslinking group. These polymer resins are preferably obtained by the copolymerization of adsorptive group-containing monomer, hydrophilic group-containing monomer, and crosslinking group-containing monomer.

The polymer resin for undercoat layer formation preferably contains a group that adsorbs to the surface of the hydrophilic support. The presence/absence of adsorptivity to the surface of the hydrophilic support can be determined, for example, by the following method.

A coating solution is prepared by dissolving the test compound in a good solvent and this coating solution is coated and dried on the support so as to provide a post-drying coating rate of 30 mg/m². The support coated with the test compound is then thoroughly rinsed with the good solvent, and the residual quantity of the test compound that has not been removed by rinsing is subsequently measured in order to determine the quantity adsorbed to the support. Measurement of this residual quantity can be carried out by a direct determination of the residual quantity of the compound, or the quantity of the test compound that has dissolved in the rinse solution can be determined and used to calculate the residual quantity. Determination of the compound can be carried out, for example, by x-ray fluorescence measurements, reflection absorption spectroscopic measurements, liquid chromatographic measurement, and so forth. A compound that is adsorptive to the support will have a residue of at least 1 mg/m² even when the cited rinsing treatment is carried out.

The group adsorptive to the surface of the hydrophilic support is a functional group that can produce a chemical bond (for example, an ionic bond, hydrogen bond, coordination bond, or a bond due to intermolecular forces) with a substance (for example, a metal or metal oxide) or a functional group (for example, the hydroxyl group) present at the surface of the hydrophilic support. The adsorptive group is preferably an acid group or a cationic group.

The acid group preferably has an acid dissociation constant (pKa) no greater than 7. Examples of the acid group are the phenolic hydroxyl group, the carboxyl group, —SO₃H, —OSO₃H, —PO₃H₂, —OPO₃H₂, —CONHSO₂—, —SO₂NHSO₂, and —COCH₂COCH₃. Particularly preferred among the preceding are —OPO₃H₂ and PO₃H₂. This acid group may also be a metal salt.

The cationic group is preferably an onium group. Examples of onium groups are ammonium, phosphonium, arsonium, stibonium, oxonium, sulfonium, selenonium, stannonium, and iodonium. Preferred thereamong are ammonium, phosphonium, and sulfonium. Ammonium and phosphonium are more preferred, and ammonium is most preferred.

Compounds represented by the following general formula (U1) and general formula (U2) are particularly preferred examples of adsorptive group-containing monomers for use in the synthesis of polymer resins preferred for the compound for the formation of the undercoat layer.

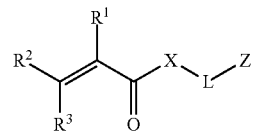

(U1)

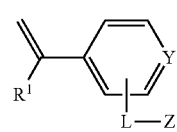

(U2)

$R^1$, $R^2$, and $R^3$ in general formulas (U1) and (U2) are each independently the hydrogen atom, a halogen atom, or $C_{1-6}$ alkyl.

$R^1$, $R^2$, and $R^3$ are each independently preferably the hydrogen atom or $C_{1-6}$ alkyl, more preferably the hydrogen atom or $C_{1-3}$ alkyl, and most preferably the hydrogen atom or methyl group. $R^2$ and $R^3$ are particularly preferably the hydrogen atom.

Z is a functional group that adsorbs to the surface of the hydrophilic support, and this adsorptive functional group is in accordance with the preceding description.

L in general formulas (U1) and (U2) is a single bond or a divalent linking group.

L is preferably a divalent aliphatic group (alkylene, substituted alkylene, alkenylene, substituted alkenylene, alkynylene, substituted alkynylene), divalent aromatic group (arylene, substituted arylene), or divalent heterocyclic group, or a combination of the preceding with the oxygen atom (—O—), sulfur atom (—S—), imino (—NH—), substituted imino (—NR— wherein R is an aliphatic group, aromatic group, or heterocyclic group), or carbonyl (—CO—).

The aforementioned divalent aliphatic group may have a cyclic structure or a branched structure. The number of carbons in the divalent aliphatic group is preferably 1 to 20, more preferably 1 to 15, and most preferably 1 to 10. A saturated aliphatic group is more preferred for the divalent aliphatic group than an unsaturated aliphatic group. The divalent aliphatic group may bear a substituent, and this substituent can be exemplified by halogen atoms, the hydroxyl group, aromatic groups, and heterocyclic groups.

The number of carbons in the aforementioned divalent aromatic group is preferably 6 to 20, more preferably 6 to 15, and most preferably 6 to 10. The divalent aromatic group may bear a substituent, and this substituent can be exemplified by halogen atoms, the hydroxyl group, aliphatic groups, aromatic groups, and heterocyclic groups.

The aforementioned divalent heterocyclic group preferably has a five-membered ring or six-membered ring for its heterocyclic ring. In addition, this heterocyclic ring may be condensed with an aliphatic ring, aromatic ring, or another heterocyclic ring. The divalent heterocyclic group may bear a substituent, and this substituent can be exemplified by halogen atoms, the hydroxyl group, the oxo group (═O), the thioxo group (═S), the imino group (═NH), substituted imino (═N—R wherein R is an aliphatic group, aromatic group, or heterocyclic group), aliphatic groups, aromatic groups, and heterocyclic groups.

L in the present invention is preferably a divalent linking group that contains a plurality of polyoxyalkylene structures.

The polyoxyalkylene structure is more preferably a polyoxyethylene structure. In other words, L preferably contains —(OCH$_2$CH$_2$)$_n$— (n is an integer of at least 2).

X in general formula (U1) is the oxygen atom (—O—) or imino (—NH—). X is more preferably the oxygen atom.

Y in general formula (U2) is the carbon atom or nitrogen atom. In those instances where Y=nitrogen atom and L is connected to Y and a quaternary pyridinium group is thereby created, such a group is itself adsorptive and Z then becomes unnecessary and may be a hydrogen atom.

Examples of representative compounds with general formula (U1) or (U2) are provided below.

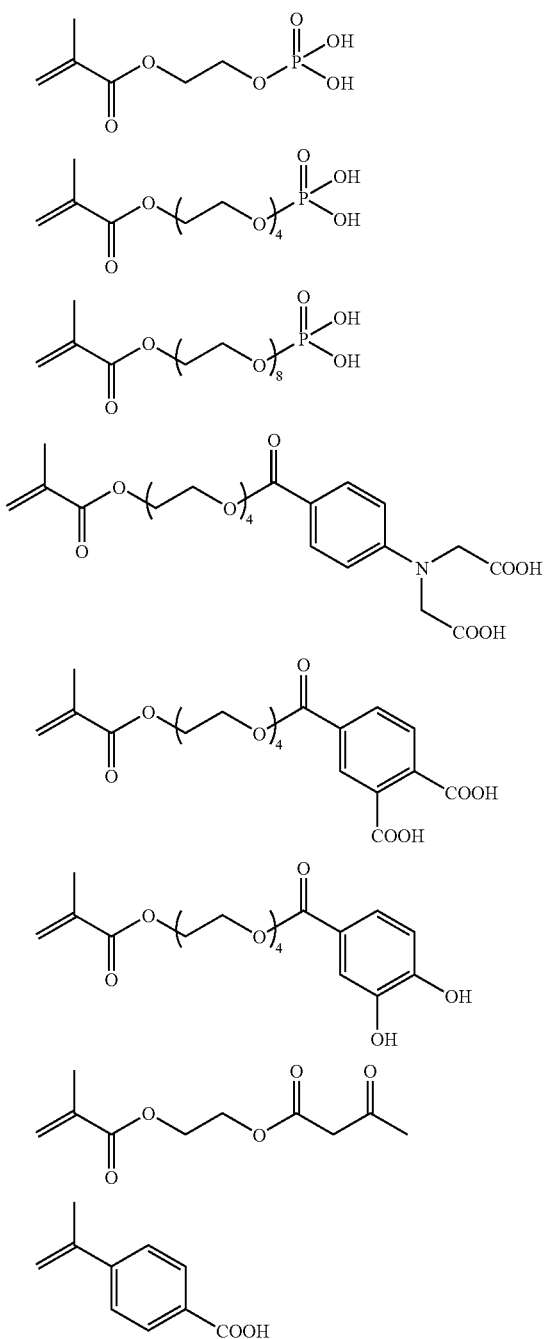

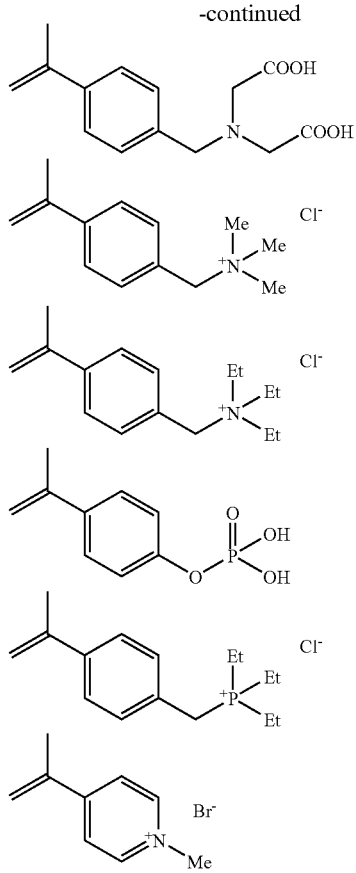

-continued

Polymer resins suitable for use as the compound for undercoat layer formation preferably contain a hydrophilic group. Suitable examples of this hydrophilic group are the hydroxyl group, carboxyl group, carboxylate group, hydroxyethyl, polyoxyethyl, hydroxypropyl, polyoxypropyl, the amino group, aminoethyl, aminopropyl, the ammonium group, amide groups, carboxymethyl, the sulfo group, the phosphate group, and so forth. The highly hydrophilic sulfo group is preferred among the preceding.

The following are specific examples of sulfo group-containing monomers: the sodium and amine salts of methallyloxybenzenesulfonic acid, allyloxybenzenesulfonic acid, allylsulfonic acid, vinylsulfonlic acid, p-styrenesulfonic acid, methallylsulfonic acid, acrylamide-t-butylsulfonic acid, 2-acrylamido-2-methylpropanesulfonic acid, and (3-acryloyloxypropyl)butylsulfonic acid. Sodium 2-acrylamido-2-methylpropanesulfonate is preferred among the preceding for its hydrophilicity and handling during synthesis.

These monomers are well suited for use in the synthesis of polymer resins preferred for use as the compound for undercoat layer formation.

The polymer resin used to form the undercoat layer in the present invention preferably has a crosslinking group. An improved adhesion with the image areas is provided by the crosslinking group. In order to endow the polymer resin used to form the undercoat layer with the ability to crosslink, a crosslinking functional group, e.g., an ethylenically unsaturated bond, may be introduced into side chain position on the polymer, and/or the crosslinking functional group may be introduced by forming a salt structure with a compound that has an ethylenically unsaturated bond and a substituent that carries a charge opposite that of a polar substituent in the polymer resin.

Examples of polymers that have ethylenically unsaturated bonds in side chain position on the molecule are polymers of an ester or amide of acrylic acid or methacrylic acid wherein the ester or amide residue (R in —COOR or CONHR) contains an ethylenically unsaturated bond.

Examples of the ethylenically unsaturated bond-containing residue (the R cited above) are as follows: —(CH$_2$)$_n$CR$^1$=CR$^2$R$^3$, —(CH$_2$O)$_n$CH$_2$CR$^1$=CR$^2$R$^3$, —(CH$_2$CH$_2$O)$_n$CH$_2$CR$^1$=CR$^2$R$^3$, —(CH$_2$)$_n$NH—CO—O—CH$_2$CR$^1$=CR$^2$R$^3$, —(CH$_2$)$_n$—O—CO—CR$^1$=CR$^2$R$^3$, and (CH$_2$CH$_2$O)$_2$—X (in these formulas, R$^1$ to R$^3$ each represent the hydrogen atom, a halogen atom, or C$_{1-20}$ alkyl, aryl, alkoxy, or aryloxy; R$^1$ may be bonded with R$^2$ or R$^3$ to form a ring; n is an integer from 1 to 10; and X is the dicyclopentadienyl residue).

The following are specific examples of the ester residue: —CH$_2$CH=CH$_2$ (described in Japanese Patent Publication No. Hei 7-21633), —CH$_2$CH$_2$O—CH$_2$CH=CH$_2$, —CH$_2$C(CH$_3$)=CH$_2$, —CH$_2$CH=CH—C$_6$H$_5$, —CH$_2$CH$_2$OCOCH=CH—C$_6$H$_5$, —CH$_2$CH$_2$NHCOO—CH$_2$CH=CH$_2$, and CH$_2$CH$_2$O—X (X in the formula represents the dicyclopentadienyl residue).

The following are specific examples of the amide residue: —CH$_2$CH=CH$_2$, —CH$_2$CH$_2$O—Y (Y in the formula represents the cyclohexene residue), and —CH$_2$CH$_2$OCO—CH=CH$_2$.

The aforementioned crosslinking group-containing ester or amide of acrylic acid or methacrylic acid is well suited for use as the crosslinking group-containing monomer for the polymer resin for undercoat layer formation.

The content of the crosslinking group in the polymer resin for undercoat layer formation (i.e., the content of the radically polymerizable unsaturated double bond, as yielded by iodine titration) is preferably 0.1 to 10.0 mmol per 1 g of the polymer resin, more preferably 1.0 to 7.0 mmol per 1 g of the polymer resin, and most preferably 2.0 to 5.5 mmol per 1 g of the polymer resin. An excellent combination of sensitivity and scumming behavior and an excellent storage stability are obtained in the cited range.

The polymer resin for undercoat layer formation has a mass-average molar weight preferably of at least 5000 and more preferably of 10,000 to 300,000 and has a number-average molar weight preferably of at least 1000 and more preferably of 2000 to 250,000. The polydispersity (mass-average molar mass/number-average molar weight) is preferably 1.1 to 10.

The polymer resin for undercoat layer formation may be a random polymer, block polymer, graft polymer, and so forth, wherein a random polymer is preferred.

A single polymer resin for undercoat layer formation may be used or a mixture of two or more may be used.

In order to prevent scumming during elapsed time as the unexposed plate, the undercoat layer of the present invention can contain a secondary or tertiary amine and/or a polymerization inhibitor. The secondary and tertiary amines can be exemplified by imidazole, 4-dimethylaminopyridine, 4-dimethylaminobenzaldehyde, tris(2-hydroxy-1-methyl)amine, 1,4-diazabicyclo[2,2,2]octane (DABCO), 1,5,7-triazabicyclo[4,4,0]deca-5-ene, 1,8-diazabicyclo[5,4,0]undeca-7-ene, 1,10-phenanthroline, 1,8-bis(dimethylamino)naphthalene, 4,4'-bis(dimethylamino)biphenyl, diphenylamine, 1,3-diphenylguanidine, 4-phenylpyridine, N,N'-ethylenebis(2,2,5,5-tetramethylpyrrolidine), and so forth.

Known thermal polymerization inhibitors can be used as the polymerization inhibitor. Preferred polymerization inhibitors thereamong are compounds selected from the group consisting of phenolic hydroxyl-containing compounds, quinone compounds, N-oxide compounds, piperidine-1-oxyl free radical compounds, pyrrolidine-1-oxyl free radical compounds, N-nitrosophenylhydroxylamines, diazonium compounds, cationic dyes, sulfide group-containing compounds, nitro group-containing compounds, and transition metal compounds such as FeCl$_3$, CuCl$_2$, and so forth. Quinone compounds are particularly suitable among the preceding compounds. The quinone compounds can be specifically exemplified by 1,4-benzoquinone, 2,3,5,6-tetrahydroxy-1,4-benzoquinone, 2,5-dihydroxy-1,4-benzoquinone, chloranyl, 2,3-dichloro-5,6-dicyano-1,4-benzoquinone, naphthoquinone, 2-fluoro-1,4-naphthoquinone, 2-hydroxyethyl-1,4-naphthoquinone, anthraquinone, 1,2,4-trihydroxyanthraquinone, 2,6-dihydroxyanthraquinone, and so forth.

The quantity of addition of these compounds to the undercoat layer is preferably 10 to 90 mass %, more preferably 20 to 80 mass %, and most preferably 30 to 70 mass %, in each case with reference to the components constituting the undercoat layer.

Compounds that have (i) an amino group or a functional group capable of inhibiting polymerization and (ii) a group that interacts with the surface of an aluminum support can also be used as compounds effective for the aforementioned scumming prevention. The group that interacts with the surface of an aluminum support is exemplified by trialkoxysilyl and onium groups and by acid groups selected from the phenolic hydroxyl group, the carboxyl group, —SO$_3$H, —OSO$_3$H, —PO$_3$H$_2$, —OPO$_3$H$_2$, —CONHSO$_2$—, SO$_2$NHSO$_2$—, and COCH$_2$CO— as well as their metal salts.

The following are examples of compounds that have an amino group and a group that interacts with the surface of an aluminum support: salts between an acid and 1,4-diazabicyclo[2,2,2]octane, compounds that contain at least one 4-aza-1-azoniabicyclo[2,2,2]octane structure (e.g., 1-methyl-4-aza-1-azoniabicyclo[2,2,2]octane p-toluenesulfonate), ethylenediaminetetraacetic acid, hydroxyethylethylenediaminetriacetic acid, dihydroxyethylethylenediaminediacetic acid, 1,3-propanediaminetetraacetic acid, diethylenetriaminepentaacetic acid, triethylenetetraaminehexaacetic acid, hydroxyethyliminodiacetic acid, and so forth. The following are examples of compounds that have a functional group capable of inhibiting polymerization and a group that interacts with the surface of an aluminum support: 2-trimethoxysilylpropylthio-1,4-benzoquinone, 2,5-bis(trimethoxysilylpropylthio)-1,4-benzoquinone, 2-carboxyanthraquinone, 2-trimethylammonioanthraquinone chloride, and so forth.

The coating solution for undercoat layer formation is obtained by dissolving the aforementioned polymer resin for undercoat formation and the necessary additives in organic solvent (for example, methanol, ethanol, acetone, methyl ethyl ketone, and so forth) and/or water. The coating solution for undercoat layer formation may also contain an infrared absorber.

Various known methods can be used to coat the support with the coating solution for undercoat layer formation. Examples of these methods are coating with a bar coater, spin coating, spray coating, curtain coating, dip coating, air knife coating, blade coating, roll coating, and so forth.

The coating rate (solids fraction) for the undercoat layer is preferably 0.1 to 100 mg/m$^2$ and more preferably 1 to 30 mg/m$^2$.

(The Support)

The support used for the lithographic printing plate precursor of the present invention is a dimensionally stable sheet or plate but is not otherwise particularly limited. The support can be exemplified by paper, plastic-laminated paper (the plastic can be exemplified by polyethylene, polypropylene, polystyrene, and so forth), metal plate or sheet (e.g., aluminum, zinc, copper, and so forth), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, and so forth), and paper or plastic film on which any of the aforementioned metals has been laminated or vapor-deposited. The support is preferably a polyester film or an aluminum plate. Aluminum plate is preferred therebetween for its excellent dimensional stability and relatively low cost.

The aluminum plate is a pure aluminum plate, an alloy plate containing aluminum as its main component along with trace amounts of heteroelements, or plastic laminated with a thin film of aluminum or aluminum alloy. Heteroelements that may be present in the aluminum alloy can be exemplified by silicon, iron, manganese, copper, magnesium, chromium, zinc, bismuth, nickel, titanium, and so forth. The heteroelement content in the alloy is preferably no more than 10 mass %. Although a pure aluminum plate is preferred in the present invention, the production of absolutely pure aluminum is problematic from the standpoint of refining technology, and the aluminum plate may therefore contain trace amounts of heteroelements. The aluminum plate is not limited with regard to composition, and any aluminum plate of material in the public domain can be used as appropriate.

The thickness of the support is preferably from 0.1 to 0.6 mm and more preferably from 0.15 to 0.4 mm.

Prior to its use, the aluminum plate is preferably subjected to a surface treatment such as a roughening treatment or an anodic oxidation treatment. Securing adhesion between the image recording layer and the support and securing an improved hydrophilicity are facilitated by the implementation of a surface treatment. Prior to executing a roughening treatment on the aluminum plate, the aluminum plate may as desired be submitted to a degreasing treatment with, for example, surfactant, organic solvent, aqueous base solution, and so forth, in order to remove rolling oil from the surface.

Various methods can be employed to roughen the surface of the aluminum plate, for example, mechanical surface roughening, electrochemical surface roughening (roughening by electrochemical dissolution of the surface), and chemical surface roughening (roughening by selective chemical dissolution of the surface).

Known methods, such as ball grinding, brush grinding, blast grinding, and buff grinding, can be used as the method for carrying out mechanical surface roughening. A transfer method can also be used in which elevations and depressions are transferred in the aluminum rolling stage using a roll provided with elevations and depressions.

Electrochemical roughening can be carried out, for example, using alternating current or direct current in an electrolytic bath that contains an acid such as hydrochloric acid or nitric acid. Another example is a method that uses a mixed acid as described in Japanese Patent Application Publication No. Sho 54-63902.

The surface-roughened aluminum plate may optionally be subjected to an alkali etching treatment using an aqueous solution of potassium hydroxide, sodium hydroxide, and so forth, followed by neutralization and then as desired an anodic oxidation treatment in order to improve the abrasion resistance.

The various electrolytes that can bring about the formation of a porous oxide film can be used as the electrolyte employed for anodic oxidation of the aluminum plate. Sulfuric acid, hydrochloric acid, oxalic acid, chromic acid, or a mixed acid of the preceding is typically used. The concentration of these electrolytes is determined as appropriate in accordance with the type of electrolyte.

The anodic oxidation conditions vary as a function of the electrolyte used and thus cannot be unconditionally specified; however, the following are generally preferred: electrolyte concentration=1 to 80 mass % solution, bath temperature=5 to 70° C., current density=5 to 60 A/dm$^2$, voltage=1 to 100 V, electrolysis time=10 seconds to 5 minutes. The quantity of anodic-oxidation film formation is preferably from 1.0 to 5.0 g/m$^2$ and more preferably is from 1.5 to 4.0 g/m$^2$. An excellent printing durability and an excellent resistance to damage in the nonimage areas of the lithographic printing plate are obtained in the cited range.

After surface treatment as described above, the anodic oxidation film-bearing substrate may be used as such as the support employed by the present invention; however, a treatment selected as appropriate from the following may be carried out in order to further improve the adhesion with the overlying layer, hydrophilicity, scumming resistance, and heat insulating performance: treatment to widen or seal the micropores in the anodic oxidation film, as described in Japanese Patent Application Publication Nos. 2001-253181 and 2001-322365, and a surface hydrophilization treatment comprising immersion in an aqueous solution containing a hydrophilic compound. The widening treatment and sealing treatment are of course not limited to the descriptions in these citations and may be carried out by any heretofore known method. For example, sealing can also be carried out by steam sealing, treatment with fluorozirconic acid alone, treatment with sodium fluoride, and steam sealing with the addition of lithium chloride.

There are no particular limitations on the sealing treatment used in the present invention, and the heretofore known methods can be used, among which sealing using an aqueous solution containing an inorganic fluorine compound, sealing with steam, and sealing with hot water are preferred. Each of these is described in greater detail below.

<1> Sealing Using an Aqueous Solution Containing an Inorganic Fluorine Compound

Metal fluorides are preferred examples of the inorganic fluorine compound used in sealing using an aqueous solution containing an inorganic fluorine compound.

Specific examples are sodium fluoride, potassium fluoride, calcium fluoride, magnesium fluoride, sodium fluorozirconate, potassium fluorozirconate, sodium fluorotitanate, potassium fluorotitanate, ammonium fluorozirconate, ammonium fluorotitanate, potassium fluorotitanate, fluorozirconic acid, fluorotitanic acid, hexafluorosilicic acid, nickel fluoride, iron fluoride, fluorophosphoric acid, and ammonium fluorophosphate. Preferred thereamong are sodium fluorozirconate, sodium fluorotitanate, fluorozirconic acid, and fluorotitanic acid.

Considered in terms of achieving a satisfactory sealing of the micropores in the anodic oxidation film, the concentration of the inorganic fluorine compound in the aqueous solution is preferably at least 0.01 mass % and more preferably is at least 0.05 mass %, but from the standpoint of the scumming resistance is preferably no more than 1 mass % and more preferably is no more than 0.5 mass %.

The aqueous solution containing the inorganic fluorine compound preferably also contains a phosphate salt compound. When this phosphate salt compound is present, the surface of the anodic oxidation film exhibits an increased hydrophilicity, which results in an improved on-press developability and an improved scumming resistance.

The phosphate salts of metals such as the alkali metals and alkaline-earth metals are examples of suitable phosphate salt compounds.

Specific examples are zinc phosphate, aluminum phosphate, ammonium phosphate, diammonium hydrogen phosphate, ammonium dihydrogen phosphate, monoammonium phosphate, monopotassium phosphate, monosodium phosphate, potassium dihydrogen phosphate, dipotassium hydrogen phosphate, calcium phosphate, sodium ammonium hydrogen phosphate, magnesium hydrogen phosphate, magnesium phosphate, ferrous phosphate, ferric phosphate, sodium dihydrogen phosphate, sodium phosphate, disodium hydrogen phosphate, lead phosphate, diammonium phosphate, calcium dihydrogen phosphate, lithium phosphate, phosphotungstic acid, ammonium phosphotungstate, sodium phosphotungstate, ammonium phosphomolybdate, sodium phosphomolybdate, sodium phosphite, sodium tripolyphosphate, and sodium pyrophosphate. Preferred thereamong are sodium dihydrogen phosphate, disodium hydrogen phosphate, potassium dihydrogen phosphate, and dipotassium hydrogen phosphate.

There are no particular limitations on the inorganic fluorine compound+phosphate salt compound combination, but the aqueous solution preferably contains at least sodium fluorozirconate as the inorganic fluorine compound and at least sodium dihydrogen phosphate as the phosphate salt compound.

Considered in terms of increasing the on-press developability and scumming resistance, the concentration of the phosphate salt compound in the aqueous solution is preferably at least 0.01 mass % and more preferably is at least 0.1 mass %, but from a solubility standpoint is preferably no more than 20 mass % and more preferably is no more than 5 mass %.

While the proportion of each compound in the aqueous solution is not particularly limited, the mass ratio between the inorganic fluorine compound and the phosphate salt compound is preferably from 1/200 to 10/1 and is more preferably from 1/30 to 2/1.

The temperature of the aqueous solution is preferably at least 20° C. and more preferably at least 40° C. and preferably no more than 100° C. and more preferably no more than 80° C.

The pH of the aqueous solution is preferably at least 1 and more preferably at least 2 and preferably no more than 11 and more preferably no more than 5.

The method of carrying out sealing with the aqueous solution containing an inorganic fluorine compound is not particularly limited and, for example, immersion or spraying can be used. One of these may be used once or a plurality of times, or two or more may be used in combination.

Immersion is preferred among the preceding. When treatment is carried out by immersion, the treatment time is preferably at least 1 second and more preferably is at least 3 seconds and is preferably no more than 100 seconds and more preferably no more than 20 seconds.

<2> Steam Sealing

Steam sealing can be exemplified by methods in which the anodic oxidation film is continuously or discontinuously brought into contact with ambient pressure or pressurized water vapor.

The steam temperature is preferably at least 80° C. and more preferably is at least 95° C. and preferably is no more than 105° C.

The steam pressure is preferably from (atmospheric pressure−50 mmAq) to (atmospheric pressure+300 mmAq) (from $1.008 \times 10^5$ to $1.043 \times 10^5$ Pa).

The duration of steam contact is preferably at least 1 second and more preferably at least 3 seconds and preferably no more than 100 seconds and more preferably no more than 20 seconds.

<3> Sealing with Hot Water

In hot water sealing, for example, the aluminum plate bearing an anodic oxidation film is immersed in hot water.

The hot water may contain an inorganic salt (for example, a phosphate) or an organic salt.

The temperature of the hot water is preferably at least 80° C. and more preferably is at least 95° C. and is preferably no more than 100° C.

The duration of immersion in the hot water is preferably at least 1 second and more preferably is at least 3 seconds and preferably is not more than 100 seconds and more preferably is not more than 20 seconds.

The hydrophilicizing treatment cited above can employ the alkali metal silicate method described in U.S. Pat. Nos. 2,714,066, 3,181,461, 3,280,734, and 3,902,734. In this method, the support is treated with an aqueous solution of, for example, sodium silicate, by immersion or electrolytic treatment. Other methods are, for example, treatment with potassium fluorozirconate as described in Japanese Patent Publication No. Sho 36-22063, and treatment with polyvinylphosphonic acid as described in U.S. Pat. Nos. 3,276,868, 4,153,461, and 4,689,272.

In those instances where a support that exhibits an inadequate surface hydrophilicity (for example, polyester film) is employed as the support, a hydrophilic layer is desirably applied in order to impart hydrophilicity to the surface. This hydrophilic layer is preferably a hydrophilic layer, as described in Japanese Patent Application Publication No. 2001-199175, formed by the application of a coating bath that contains a colloid of an oxide or hydroxide of at least one element selected from beryllium, magnesium, aluminum, silicon, titanium, boron, germanium, tin, zirconium, iron, vanadium, antimony, and transition metals; a hydrophilic layer, as described in Japanese Patent Application Publication No. 2002-79772, that has an organic hydrophilic matrix obtained by the crosslinking or pseudo-crosslinking of an organic hydrophilic polymer; a hydrophilic layer that has an inorganic hydrophilic matrix obtained by a sol-gel conversion comprising the hydrolysis and condensation reactions of polyalkoxysilane, titanate, zirconate, or aluminate; or a hydrophilic layer comprising an inorganic thin layer that has a metal oxide-containing surface. Preferred among the preceding is a hydrophilic layer formed by the application of a coating bath that contains a colloid of an oxide or hydroxide of silicon.

Also in those instances where, for example, a polyester film is employed as the support, an antistatic layer is preferably provided on the hydrophilic layer side of the support, or on the opposite side, or on both sides. The disposition of an antistatic layer between the support and a hydrophilic layer also contributes to improving the adhesion with the hydrophilic layer. A polymer layer having finely divided metal oxide particles or a matting agent dispersed therein, as described in Japanese Patent Application Publication No. 2002-79772, may be used as the antistatic layer.

The center-line average roughness of the support is preferably from 0.10 to 1.2 μm. A good adhesion to the image recording layer, good printing durability, and good scumming resistance are obtained in the cited range.

(The Protective Layer)

The lithographic printing plate precursor of the present invention is preferably provided with a protective layer (overcoat layer) on the image recording layer.

By shutting out oxygen, this protective layer functions to prevent reactions that inhibit image formation; the protective layer also functions, inter alia, to prevent damage to the image recording layer and to prevent ablation during exposure with a high energy laser.

The components constituting the protective layer and other features of the protective layer are described in the following.

The exposure of lithographic printing plates is generally carried out in the air. Low molecular weight compounds present in the air, such as oxygen and basic substances, can inhibit the exposure-induced image-forming reactions in the image recording layer. The protective layer prevents these low molecular weight compounds (e.g., oxygen and basic substances) from mixing into the image recording layer and as a result prevents reactions that would inhibit image formation in the air. Thus, the characteristics desired for the protective layer are the ability to reduce the permeability of the low molecular weight compounds (e.g., oxygen), an excellent transmittance for the light used for exposure, an excellent adhesion to the image recording layer, and the ability to be easily removed in the on-press development treatment process following exposure. Protective layers having such characteristics are described in, for example, U.S. Pat. No. 3,458, 311 and Japanese Patent Publication No. Sho 55-49729.

The material used for the protective layer is suitably selected from water-soluble polymers and water-insoluble polymers. Specific examples are water-soluble polymers, e.g., polyvinyl alcohol, modified polyvinyl alcohol, polyvinylpyrrolidone, polyvinylimidazole, polyacrylic acid, polyacrylamide, the partial saponification products of polyvinyl acetate, ethylene-vinyl alcohol copolymers, water-soluble cellulose derivatives, gelatin, starch derivatives, gum arabic, and so forth, as well as polymers such as polyvinylidene chloride, poly(meth)acrylonitrile, polysulfone, polyvinyl chloride, polyethylene, polycarbonate, polystyrene, polyamide, cellophane, and so forth.

These polymers may as necessary also be used in combinations of two or more.

Water-soluble polymer compounds that exhibit an excellent crystallinity are relatively useful materials among the materials listed above. Preferred specific examples are polyvinyl alcohol, polyvinylpyrrolidone, polyvinylimidazole, water-soluble acrylic resins, e.g., polyacrylic acid, gelatin, gum arabic, and so forth. In terms of being coatable using water as the solvent and being easy to remove by the fountain solution during printing, polyvinyl alcohol, polyvinylpyrrolidone, and polyvinylimidazole are preferred among the preceding. Among these latter polymers, polyvinyl alcohol (PVA) provides the best results with respect to the basic characteristics, i.e., oxygen-barrier performance and removability during development.

Polyvinyl alcohols that can be used for the protective layer may be partially substituted with an ester, ether, or acetal as long as the unsubstituted vinyl alcohol unit is present in substantially the amount that provides the necessary water solubility. Other copolymer components may be present to some degree under the same conditions. For example, the use is also preferred of polyvinyl alcohol with various degrees of polymerization that randomly contains any of various hydrophilic modified sites, such as anion-modified sites that have been modified with an anion (e.g., the carboxyl group or sulfo group), cation-modified sites that have been modified with a cation (e.g., an amino group or ammonium group), silanol-modified sites, thiol-modified sites, and so forth, and polyvinyl alcohols with various degrees of polymerization that have various modified sites at the polymer chain terminals, e.g., the aforementioned anion-modified sites, the aforementioned cation-modified sites, silanol-modified sites, and thiol-modified sites as well as alkoxyl-modified sites, sulfide-modified sites, ester-modified sites between the vinyl alcohol and an organic acid, ester-modified sites between the aforementioned anion-modified site and, for example, an alcohol, epoxy-modified sites, and so forth.

These modified polyvinyl alcohols are preferably compounds that have been from 71 to 100 mol % hydrolyzed and that have a degree of polymerization in the range from 300 to 2,400. Specific examples are PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 (from Kuraray Co., Ltd.).

The following are additional examples of modified polyvinyl alcohols: KL-318, KL-118, KM-618, KM-118, and SK-5102, which each have anion-modified sites; C-318, C-118, and CM-318, which each have cation-modified sites; M-205 and M-115, which each have terminal thiol-modified sites; MP-103, MP-203, MP-102, and MP-202, which each have terminal sulfide-modified site; HL-12E and HL-1203, which have terminal ester (higher aliphatic acid)-modified sites; and R-1130, R-2105, and R-2130, which each have reactive silane-modified sites.

The protective layer also preferably contains an inorganic layer compound, that is, a plate-shaped inorganic compound that has a layer structure. The co-use of such an inorganic layer compound can provide an additional increase in the oxygen-blocking performance, can further improve the film strength of the protective layer, can improve the resistance to damage, and can impart a mat character to the specific protective layer.

The inorganic layer compound can be exemplified by the mica group, for example, synthetic micas and natural micas with the following general formula

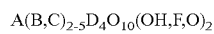

$A(B,C)_{2-5}D_4O_{10}(OH,F,O)_2$ (wherein A represents any selection from Li, K, Na, Ca, Mg, and organic cations; B and C represent any selection from Fe(II), Fe(III), Mn, Al, Mg, and V; and D represents Si or Al), and by talc as represented by the formula $3MgO \cdot 4SiO \cdot H_2O$, taeniolite, montmorillonite, saponite, hectorite, and zirconium phosphate.

Among the mica compounds, the natural micas are exemplified by muscovite, paragonite, phlogopite, biotite, and lepidolite. The synthetic micas can be exemplified by non-swellable micas, e.g., fluorophlogopite $KMg_3(AlSi_3O_{10})F_2$ and potassium tetrasilicic mica $KMg_{2.5}(Si_4O_{10})F_2$, and swellable micas, for example, Na tetrasilicic mica $NaMg_{2.5}(Si_4O_{10})F_2$, Na or Li taeniolite $(Na,Li)Mg_2Li(Si_4O_{10})F_2$, and montmorillonite series Na or Li hectorite $(Na,Li)_{1/8}Mg_{2/5}Li_{1/8}(Si_4O_{10})F_2$. Synthetic smectites are also useful.

Among the mica compounds described above, fluorine-containing swellable micas that are synthetic layer compounds are particularly useful. Thus, swellable clay minerals, e.g., mica, montmorillonite, saponite, hectorite, and bentonite, have a layer structure comprising a unit crystal lattice layer having a thickness from about 10 to about 15 Å, and metal atom substitution within the lattice is much greater than in other clay minerals. As a result, a positive charge deficiency is produced in the lattice layer, and cations such as $Li^+$, $Na^+$, $Ca^{2+}$, and $Mg^{2+}$ and organic cations (e.g., amine salts, quaternary ammonium salts, phosphonium salts, sulfonium salts, and so forth) are adsorbed between the layers to compensate for this deficiency. These layer compounds are swollen by water. When shear is applied in the swollen state, cleavage readily occurs and a stable sol is formed in water. Bentonite and swellable synthetic micas strongly exhibit this tendency and are useful in the present invention; use of the swellable synthetic micas is particularly preferred from the standpoint of ease of acquisition and consistency in quality.

The layer compounds have a plate shape: with regard to thickness, thinner is more desirable from the standpoint of controlling diffusion; with regard to the size of the flat side, larger is more desirable as long as neither the smoothness of the coated surface nor the transmission of the active light are impaired. The aspect ratio is therefore at least 20, preferably at least 100, and particularly preferably at least 200. Here, the aspect ratio is the ratio between the longer diameter of the particle and the thickness thereof, and can be measured, for example, from the projection yielded by a microphotograph of the particle. A larger aspect ratio provides a greater effect.

With regard to the average particle size of the layer compound, its average longer diameter is from 0.3 to 20 µm, preferably from 0.5 to 10 µm, and particularly preferably from 1 to 5 µm. The inhibition of oxygen and moisture permeation is inadequate at a particle size smaller than 0.3 µm and an adequate effect therefore cannot be evidenced. When the particle size is larger than 20 µm, the dispersion stability in the coating fluid is inadequate and coating cannot be carried out in a stable manner. The average thickness of the particles is no more than 0.1 µm, preferably no more than 0.05 µm, and particularly preferably no more than 0.01 µm. For example, among the inorganic layer compounds, the swellable synthetic micas, taken as representative compounds, have a thickness from 1 to 50 nm and a face size from about 1 to about 20 µm.

The coated film strength can be improved and the permeation of oxygen and moisture can be effectively prevented when the protective layer contains the high aspect ratio inorganic layer compound particles described above. As a consequence, impairment of the protective layer due, for example, to deformation, can be prevented, and an excellent storage stability—including no decline in the image-forming performance of the lithographic printing plate precursor due to humidity changes—is obtained even for long-term storage under high humidity conditions.

Examples of general dispersing methods are provided below for those instances in which a layer compound is used in the protective layer.

First, from 5 to 10 mass parts of the swellable layer compound, which was provided as a preferred layer compound among the previously described layer compounds, is added to 100 mass parts water. After thorough mixing into the water and swelling, the mixture is transferred to a disperser and dispersion is carried out. The disperser used here can be exemplified by mills that carry out dispersion by the direct application of mechanical force, high-speed stirring-type dispersers that generate high shear forces, and dispersers that apply high intensity ultrasonic energy. Specific examples are ball mills, sand grinder mills, viscomills, colloid mills, homogenizers, dissolvers, Polytrons, homomixers, homoblenders, Kady mills, the Jet Agitor, capillary emulsifying devices, liquid sirens, piezoelectric-type ultrasonic generators, and emulsifying devices equipped with a Polman whistle. The dispersion, containing 5 to 10 mass % of the inorganic layer compound dispersed by the previously described method, has a high viscosity or is a gel and exhibits an extremely good storage stability.

To prepare a coating fluid for protective layer formation using this dispersion, the dispersion is preferably diluted with water and thoroughly stirred and then blended with the binder solution.

The content of the inorganic layer compound in the protective layer is preferably from 5/1 to 1/100 as the mass ratio with respect to the amount of binder used in the protective layer. When a plurality of inorganic layer compounds are used in combination, it is again preferred that the total quantity of these inorganic layer compounds satisfy this mass ratio.

With regard to other additions for the protective layer, for example, flexibility can be provided by the addition of glycerol, dipropylene glycol, propionamide, cyclohexanediol, sorbitol, and so forth, in an amount corresponding to several mass % with respect to the aforementioned water-soluble or water-insoluble polymer. In addition, known additives, such as a water-soluble (meth)acrylic-type polymer or a water-soluble plasticizer, can be added in order to improve the properties of the film.

The protective layer is formed in the present invention using the coating fluid for protective layer formation as described below, and known additives may be added to this coating fluid in order to improve the adhesion with the image recording layer and the timewise stability of the coating fluid.

Thus, an anionic surfactant, nonionic surfactant, cationic surfactant, or fluorosurfactant and specifically an anionic surfactant such as a sodium alkyl sulfate or sodium alkylsulfonate, an amphoteric surfactant such as an alkylaminocarboxylic acid salt or alkylaminodicarboxylic acid salt, or a nonionic surfactant such as a polyoxyethylene alkylphenyl ether may be added to the coating fluid for protective layer formation in order to improve the coating characteristics. The amount of addition of these surfactants is 0.1 to 100 mass % with respect to the aforementioned water-soluble or water-insoluble polymer.

With regard to achieving an excellent adhesion with the image areas, Japanese Patent Application Publication No. Sho 49-70702 and GB 1,303,578 teach that a satisfactory adhesion is obtained by mixing 20 to 60 mass % of, for example, an acrylic emulsion or a water-insoluble vinylpyrrolidone-vinyl acetate copolymer, into a hydrophilic polymer comprising mainly polyvinyl alcohol and layering this on the image recording layer. Any of these known technologies may be used in the present invention.

In addition, an oleosensitizer, such as the previously described low molecular weight nitrogenous compounds and ammonium salt-containing polymers, may also be added to the protective layer. This addition provides an additional improvement in the receptivity. When an oleosensitizer is added to the protective layer, the quantity of oleosensitizer addition is preferably in the range from 0.5 to 30 mass %.

The protective layer may also be provided with other functionalities. For example, the safelight fitness can be improved without causing a decline in sensitivity by adding a colorant (e.g., a water-soluble dye) that exhibits an excellent transmittance for the infrared radiation used in exposure and that can efficiently absorb light at other wavelengths. In addition, finely divided spherical inorganic particles, as are added to the image recording layer as previously described, may be incorporated for the purpose of controlling the slipperiness of the outermost surface of the lithographic printing plate precursor. Suitable examples of these finely divided inorganic particles are silica, alumina, magnesium oxide, titanium oxide, magnesium carbonate, calcium alginate, and mixtures of the preceding. The finely divided inorganic particles preferably have an average particle size of 5 nm to 10 µm and more preferably 50 nm to 3 µm. The finely divided inorganic particles under consideration can be easily acquired as commercial products, e.g., as a colloidal dispersion of silica.

The content of the finely divided inorganic particles is preferably no more than 40 mass % and more preferably no more than 20 mass %, in each case with reference to the total solids fraction of the protective layer.

The protective layer is formed by dispersing or dissolving the previously described protective layer components in solvent and applying the thusly prepared coating fluid for protective layer formation on the image recording layer and drying.

The solvent used for coating can be selected as appropriate in relation to the binder, wherein the use of distilled water or purified water is preferred when a water-soluble polymer is used.

The method for applying the protective layer is not particularly limited and known methods, e.g., the methods described in U.S. Pat. No. 3,458,311 and Japanese Patent Publication No. Sho 55-49729, can be used.

Specifically, for example, blade coating, air knife coating, gravure coating, roll coating, spray coating, dip coating, or bar coating may be used to form the protective layer.

The coating rate for the protective layer is preferably in the range from 0.01 to 10 g/m$^2$, more preferably in the range from 0.02 to 3 g/m$^2$, and most preferably in the range from 0.02 to 1 g/m$^2$, in each case as the coating rate after drying.

(Backcoat Layer)

After surface treatment has been carried out on the support or after the undercoat layer, supra, has been formed on the support, a backcoat layer may as necessary be formed on the back side of the support.

Preferred examples of the backcoat layer are the coating layer comprising an organic polymer compound as described in Japanese Patent Application Publication No. Hei 5-45885, and the coating layer comprising a metal oxide obtained by the hydrolysis and polycondensation of an organometal compound or inorganic metal compound as described in Japanese Patent Application Publication No. Hei 6-35174. In particular, the use of alkoxy compounds of silicon, e.g., $Si(OCH_3)_4$, $Si(OC_2H_5)_4$, $Si(OC_3H_7)_4$, $Si(OC_4H_9)_4$, and so forth, is preferred because these starting material can be easily and inexpensively acquired.

Method of Platemaking and Method of Lithographic Printing

Known light sources can be used as the light source for exposing the lithographic printing plate precursor of the present invention, and in specific terms the use is preferred of various lasers as the light source. The lithographic printing plate precursor is imagewise exposed using an infrared laser in the lithographic printing method of the present invention. The infrared laser used is not particularly limited, but preferred examples thereof are solid-state lasers and semiconductor lasers that emit infrared radiation at a wavelength of 760 to 1,200 nm.

With regard to the mechanism for exposure, an internal drum system, external drum system, flat bed system, and so forth may be employed. The output of the infrared laser is preferably at least 100 mW. The use of a multibeam laser device is preferred for the purpose of shortening the exposure time. The exposure time per pixel is preferably no more than 20 microseconds. The quantity of irradiated energy is preferably from 10 to 300 mJ/cm$^2$.

(1) Lithographic Printing Using on-Press Development

In the lithographic printing method of the present invention, printing can be carried out by imagewise exposure of the lithographic printing plate precursor of the present invention with an infrared laser as described above and by subsequently supplying, without going through any development process step, an oil-based ink and a water-based component. Thus, the exposed lithographic printing plate precursor is mounted on the plate cylinder of a press. When the press itself is equipped with a laser exposure device, imagewise exposure is carried out after the lithographic printing plate precursor has been mounted on the press's plate cylinder.

On-press development is characterized by a step in which the lithographic printing plate precursor is imagewise exposed and by a printing step in which printing is carried out—without executing any development treatment—by feeding oil-based ink and a water-based component to the lithographic printing plate precursor after exposure, wherein the unexposed areas of the lithographic printing plate precursor are removed during the course of the printing step. First, imagewise exposure may be carried out with the lithographic printing plate precursor mounted in the press, or the lithographic printing plate precursor may be mounted in the press after exposure. On-press development is thereafter carried out in the initial stage of printing with the aforementioned press by supplying printing ink and fountain solution and carrying out printing in the described state. The image recording layer in the unexposed areas is thus removed and accompanying this the surface of the hydrophilic support is exposed and becomes receptive to the fountain solution and printing can proceed.

In specific terms, in one method the lithographic printing plate precursor is exposed with an infrared laser and thereafter is installed on the press without going through a development process step and printing is carried out, while in another method the lithographic printing plate precursor is mounted in the press followed by exposure on the press with an infrared laser and printing.

When, for the case of an on-press-developable lithographic printing plate precursor, the lithographic printing plate precursor is imagewise exposed with an infrared laser followed—without going through a development process step such as a wet development process step—by printing in which a water-based component and oil-based ink are supplied, the exposure-cured image recording layer in the exposed areas of the image recording layer forms an oil-based ink receptive region that has an oleophilic surface. In the unexposed areas, on the other hand, the uncured image recording layer is removed by dissolution or dispersion by the supplied water-based component and/or oil-based ink and the hydrophilic surface is exposed in these areas. As a result, the water-based component attaches to the exposed hydrophilic surface, the oil-based ink is taken up by the image recording layer in the exposed regions, and printing is initiated.

Here, either the water-based component or the oil-based ink may be supplied to the plate surface at the very first; however, for the on-press-developable lithographic printing plate precursor of the present invention, the oil-based ink is preferably supplied at the outset based on a consideration of preventing contamination of the water-based component by the unexposed areas of the image recording layer. The fountain solution and printing ink typically employed for lithographic printing are used as the water-based component and oil-based ink.

Proceeding in the described manner, the lithographic printing plate precursor undergoes on-press development on the offset press and is used as such for long-run printing.

(2) Lithographic Printing Using Gum Development

After the lithographic printing plate precursor has been imagewise exposed with a laser, the nonimage areas in the photopolymer layer may be removed using a gum solution. The lithographic printing plate precursor is then used for printing. In the present invention, this gum solution denotes an aqueous solution that contains a hydrophilic resin. The presence of this hydrophilic resin makes it possible to protect the hydrophilic support that has been exposed by removal of the nonimage areas and to protect the image areas.

Gum arabic, which generally has a strong desensitizing action, is frequently used in the gum solution, and an approximately 15 to 20% aqueous gum arabic solution is often used as the gum solution. Besides gum arabic, various water-soluble resins can also be used as the desensitizer. Preferred examples in this regard are dextrin, sterabic, stractan, alginate salts, polyacrylate salts, hydroxyethyl cellulose, polyvinylpyrrolidone, polyacrylamide, methyl cellulose, hydroxypropyl cellulose, hydroxymethyl cellulose, carboxyalkyl cellulose salts, and the water-soluble polysaccharides extracted from soy bean curd lees. Pullulan, pullulan derivatives, and polyvinyl alcohol are also preferred.

The following are preferred modified starch derivatives: roasted starches such as British gum; enzyme-modified dextrins such as enzymatically produced dextrin and Schardinger dextrin; oxidized starches represented by solubilized starch; pregelatinized starches such as modified pregelatinized starch and unmodified pregelatinized starch; esterified starches such as starch phosphate, fatty starch esters, starch sulfate, starch nitrate, starch xanthate, and starch carbamate; etherized starches such as carboxyalkyl starch, hydroxyalkyl starch, sulfoalkyl starch, cyanoethyl starch, allyl starch, benzyl starch, carbamylethyl starch, and dialkylamino starch; crosslinked starches such as methylol-crosslinked starch, hydroxyalkyl-crosslinked starch, phosphate-crosslinked starch, and dicarboxylic acid-crosslinked starch; and graft copolymerized starches such as starch/polyacrylamide copolymers, starch/polyacrylic acid copolymers, starch/polyvinyl acetate copolymers, starch/polyacrylonitrile copolymers, cationic starch/polyacrylate ester copolymers, cationic starch/vinyl polymer copolymers, starch/polystyrene/maleic acid copolymers, starch/polyethylene oxide copolymers, and starch/polypropylene copolymers.

The following are preferred natural polymer compounds: starches as sweet potato starch, potato starch, tapioca starch, wheat starch, and corn starch; natural polymer compounds obtained from seaweed, such as carrageenan, laminaran, mannan derived from seaweed, funori, Irish moss, agar, and sodium alginate; plant mucilages such as tororoaoi mucilage, mannan, quince seed mucilage, pectin, tragacanth gum, karaya gum, xanthine gum, guar bean gum, locust bean gum, carob gum, and benzoin gum; microbial mucilages such as homopolysaccharides, e.g., dextran, glucan, and levan, and heteropolysaccharides, e.g., succinoglucan and xanthan gum; and proteins such as glue, gelatin, casein, and collagen.

Two or more of these water-soluble polymers may be used in combination. The water-soluble polymer content in the gum solution is preferably 1 to 50 mass % and more preferably is 3 to 30 mass %.

In addition to the desensitizer as described above, the gum solution used by the present invention may contain a pH adjuster, surfactant, antiseptic, antimold, oleophilic substance, wetting agent, chelating agent, defoamer, and so forth.

The gum solution is advantageously used in the pH range of 3 to 12. A pH adjuster is generally added for this reason. In order to bring the pH to 3 to 12, adjustment is generally carried out by adding a mineral acid, organic acid, or inorganic salt to the gum solution. The quantity of addition is 0.01 to 2 mass %. The mineral acid can be exemplified by nitric acid, sulfuric acid, phosphoric acid, metaphosphoric acid, and so forth. The organic acid can be exemplified by acetic acid, oxalic acid, malonic acid, p-toluenesulfonic acid, levulinic acid, phytic acid, organophosphonic acids, and amino acids such as glycine, α-alanine, and β-alanine. The inorganic salt can be exemplified by magnesium nitrate, primary sodium phosphate, secondary sodium phosphate, nickel sulfate, sodium hexametaphosphate, sodium tripolyphosphate, and so forth. At least one mineral acid, organic acid, or inorganic salt can be used or two or more may be used in combination.

The surfactant in the gum solution can be an anionic surfactant, cationic surfactant, amphoteric surfactant, or nonionic surfactant. The anionic surfactant can be exemplified by fatty acid salts, abietic acid salts, hydroxyalkanesulfonic acid salts, alkanesulfonic acid salts, α-olefinsulfonic acid salts, dialkyl sulfosuccinate salts, alkyldiphenyl ether disulfonic acid salts, straight-chain alkylbenzenesulfonic acid salts, branched alkylbenzenesulfonic acid salts, alkylnaphthalenesulfonic acid salts, alkylphenoxy polyoxyethylenepropylsulfonic acid salts, polyoxyethylene alkylsulfophenyl ether salts, sodium N-methyl-N-oleyltaurate, N-alkylsulfosuccinic acid monoamide disodium salts, petroleum sulfonic acid salts, sulfated castor oil, sulfated beef tallow oil, salts of sulfate esters of alkyl esters of fatty acids, salts of alkyl sulfates, salts of sulfate esters of polyoxyethylene alkyl ethers, salts of sulfate esters of fatty acid monoglycerides, salts of sulfate esters of polyoxyethylene alkylphenyl ethers, salts of sulfate esters of polyoxyethylene styrylphenyl ethers, alkyl phosphate ester salts, salts of phosphate esters of polyoxyethylene alkyl ethers, salts of phosphate esters of polyoxyethylene alkylphenyl ethers, partially saponified styrene/maleic anhydride copolymers, partially saponified olefin/maleic anhydride copolymers, and naphthalenesulfonate/formalin condensates. The use is particularly preferred among the preceding of dialkyl sulfosuccinate salts, salts of alkyl sulfates, alkylnaphthalenesulfonic acid salts, α-olefinsulfonic acid salts, and alkyldiphenyl ether disulfonic acid salts.

Alkylamine salts, quaternary ammonium salts, and so forth, can be used as the cationic surfactant.

Alkylcarboxybetaines, alkylimidazolines, alkylaminocarboxylic acids, and so forth, can be used as the amphoteric surfactant.

The nonionic surfactant can be exemplified by polyoxyethylene alkyl ethers, polyoxyethylene alkylphenyl ethers, polyoxyethylene polystyrylphenyl ethers, polyoxyethylene-polyoxypropylene alkyl ethers, glycerol/fatty acid partial esters, sorbitan/fatty acid partial esters, pentaerythritol/fatty acid partial esters, propylene glycol/fatty acid monoesters, sucrose/fatty acid partial esters, polyoxyethylene sorbitan/fatty acid partial esters, polyoxyethylene sorbitol/fatty acid partial esters, polyethylene glycol/fatty acid esters, polyglycerol/fatty acid partial esters, polyoxyethylenated castor oil, polyoxyethylene glycerol/fatty acid partial esters, fatty acid diethanolamides, N,N-bis-2-hydroxyalkylamines, polyoxyethylene alkylamines, triethanolamine/fatty acid esters, trialkylamine oxides, polypropylene glycol with a molecular weight of 200 to 5000, polyoxyethylene or polyoxypropylene adducts on trimethylolpropane or glycerol or sorbitol, acetylene glycol, and so forth. Fluorine-type and silicon-type nonionic surfactants can also be similarly used.

Two or more of these surfactants can be used in combination. There are no particular limitations on the quantity of use; however, with regard to the preferred range, 0.01 to 20 mass % based on the total mass of the gum solution is suitable while 0.05 to 10 mass % based on the total mass of the gum solution is preferred.

The preservative can be the known substances used in the fiber, wood processing, food, drug, cosmetic, and agrochemical sectors. The known preservatives can be used, for example, quaternary ammonium salts, monohydric phenol derivatives, dihydric phenol derivatives, polyhydric phenol derivatives, imidazole derivatives, pyrazolopyrimidine derivatives, monohydric naphthol, carbonates, sulfone derivatives, organotin compounds, cyclopentane derivatives, phenyl derivatives, phenol ether derivatives, phenol ester derivatives, hydroxylamine derivatives, nitrile derivatives, naphthalenes, quinoline derivatives, benzothiazole derivatives, secondary amines, 1,3,5-triazine derivatives, thiadiazole derivatives, anilide derivatives, pyrrole derivatives, halogen derivatives, dihydric alcohol derivatives, dithiol derivatives, cyanic acid derivatives, thiocarbamate derivatives, diamine derivatives, isothiazole derivatives, monohydric alcohols, saturated aldehydes, unsaturated monocarboxylic acids, saturated ethers, unsaturated ethers, lactones, amino acid derivatives, hydantoin, cyanuric acid derivatives, guanidine derivatives, pyridine derivatives, saturated monocarboxylic acids, benzenecarboxylic acid derivatives, hydroxycarboxylic acid derivatives, biphenyl, hydroxamic acid derivatives, aromatic alcohols, halophenol derivatives, mercaptocarboxylic acid derivatives, quaternary ammonium salt derivatives, triphenylmethane derivatives, hinokithiol, furan derivatives, benzofuran derivatives, acridine derivatives, isoquinoline derivatives, arsine derivatives, thiocarbamic acid derivatives, phosphate esters, halobenzene derivatives, quinone derivatives, benzenesulfonic acid derivatives, monoamine derivatives, organophosphate esters, piperazine derivatives, phenazine derivatives, pyrimidine derivatives, thiophanate derivatives, imidazoline derivatives, isoxazole derivatives, ammonium salt derivatives, and so forth. The following are particularly preferred preservatives: the salts of pyridinethiol-1-oxide, salicylic acid and its salts, 1,3,5-trishydroxyethylhexahydro-s-triazine, 1,3,5-trishydroxymethylhexahydro-s-triazine, 1,2-benzisothiazolin-3-one, 5-chloro-2-methyl-4-isothiazolin-3-one, and 2-bromo-2-nitro-1,3-propanediol. The preferred quantity of addition is a quantity that provides a stable efficacy with respect to bacteria, mold, yeast, and so forth, and while this will vary with the species of bacteria, mold, or yeast, the range of 0.01 to 4 mass % with respect to the gum solution at the time of use is preferred. The combined use of two or more preservatives in order to be efficacious against various mold and bacteria is preferred.

An oleophilic substance may also be present in the gum solution. Preferred oleophilic substances include, for example, castor oil and $C_{5-25}$ organic carboxylic acids such as oleic acid, lanolic acid, valeric acid, nonanoic acid, caprylic acid, myristic acid, palmitic acid, and so forth. A single oleophilic substance can be used or two or more can be used in combination. The content of the oleophilic substance in the gum solution is in the range from 0.005 to 10 mass % and more preferably in the range from 0.05 to 5 mass %, in each case with respect to the total mass of the gum solution.

In addition, the wetting agent that can be added as necessary to the gum solution is, for example, glycerol, ethylene glycol, propylene glycol, triethylene glycol, butylene glycol, hexylene glycol, diethylene glycol, dipropylene glycol, trimethylolpropane, diglycerol, and so forth. A single one of these wetting agents may be used or two or more may be used in combination. The preferred quantity of use of these wetting agents is 0.1 to 5 mass %.

A chelating compound may also be added to the gum solution. Gum solutions are typically sold as concentrates, which are diluted at the time of use with, for example, tap water or well water, and then used. The calcium ion and so forth present in this tap water or well water used for dilution has a negative effect on printing and functions to facilitate scumming on the printed material; these problems can be dealt with by the addition of a chelating compound. Preferred chelating compounds are, for example, ethylenediaminetetraacetic acid and its potassium and sodium salts; diethylenetriaminepentaacetic and its potassium and sodium salts; triethylenetetraminehexaacetic acid and its potassium and sodium salts; hydroxyethylethylenediaminetriacetic acid and its potassium and sodium salts; nitrilotriacetic acid and its sodium salt; and organophosphonic acids and phosphonoalkanetricarboxylic acids, e.g., 1-hydroxyethane-1,1-diphosphonic acid and its potassium and sodium salts, aminotri (methylenephosphonic acid) and its potassium and sodium salts, and so forth. In addition to the sodium and potassium salts, the salts of these chelating agents with organic amines are also effective. A chelating agent is selected that is stable in the gum solution composition and that does not impair the printing characteristics. The quantity of addition is suitably 0.001 to 1.0 mass % with reference to the gum solution at the time of use.

A defoamer can also be added to the gum solution, and silicone defoamers are particularly preferred. Among these defoamers, either of an emulsion/dispersion type or a solubilizing type can be used. A range of 0.001 to 1.0 mass % with respect to the gum solution at the time of use is optimal.

Water is the component that balances out the gum solution. From a transportation standpoint, the gum solution advantageously is made as a concentrate having a smaller water content than at the time of use and is diluted with water at the time of use. The concentration in such cases is desirably a concentration that does not result in separation or precipitation of the components. The gum solution may be prepared as an emulsion/dispersion type wherein organic solvent is used as the oil phase thereof, and, using the assistance of a surfactant as described above, may be formulated as a solubilizing type (emulsion type).

The organic solvent preferably is an organic solvent that has a solubility in water at 20° C. of no more than 5 mass % and a boiling point of at least 160° C. A plasticizer with a solidification point no greater than 15° C. and a boiling point at 1 atmosphere of at least 300° C. is present, for example, a phthalate diester such as dibutyl phthalate, diheptyl phthalate, di-n-octyl phthalate, di(2-ethylhexyl) phthalate, dinonyl phthalate, didecyl phthalate, dilauryl phthalate, butyl benzyl phthalate, and so forth; esters of aliphatic dibasic acids, such as dioctyl adipate, butyl glycol adipate, dioctyl azelate, dibutyl sebacate, di(2-ethylhexyl) sebacate, dioctyl sebacate, and so forth; epoxidized triglycerides such as epoxidized soy oil and so forth; phosphate esters such as tricresyl phosphate, trioctyl phosphate, trischloroethyl phosphate, and so forth; and benzoate esters such as benzyl benzoate and so forth.

In addition, the alcohol system can be exemplified by 2-octanol, 2-ethylhexanol, nonanol, n-decanol, undecanol, n-dodecanol, trimethylnonyl alcohol, tetradecanol, benzyl alcohol, and so forth. The glycol system can be exemplified by ethylene glycol isoamyl ether, ethylene glycol monophenyl ether, ethylene glycol benzyl ether, ethylene glycol hexyl ether, octylene glycol, and so forth.

Odor is a particular consideration when selecting the preceding compounds. The preferred range for the quantity of use of these solvents is 0.1 to 5 mass % of the gum solution and the more preferred range is 0.5 to 3 mass % of the gum solution. A single solvent can be used or two or more can be used in combination.

The gum solution used by the present invention is produced by bringing the aqueous phase to a temperature of 40° C.±5° C.; slowly dripping the prepared oil phase into the aqueous phase while stirring at high speed; and, after thorough stirring, carrying out emulsification and dispersion by passage through a pressure-type homogenizer.

In the present invention, the step of removing the nonimage areas of the photopolymer layer using the aforementioned gum solution can be followed as appropriate by a water rinse step and/or a subsequent additional step of desensitizing the nonimage areas using the gum solution.

The gum development process in the present invention can be suitably carried out using an automatic processor that is provided with a rubbing member and a means of supplying, inter alia, the gum solution. An example of an automatic processor is the automatic processor described in Japanese Patent Application Publication No. 2006-235227, which after imaging carries out a rubbing process while transporting the lithographic printing plate precursor. A particularly preferred automatic processor in this sphere uses a rotating brush roll as the rubbing member.

A rotating brush roll preferred for use in the present invention can be selected as appropriate based on considerations of preventing damage to the image areas, the rigidity of the support in the lithographic printing plate precursor, and so forth. The rotating brush roll can be a known rotating brush roll in which brush elements are attached to a plastic or metal roll. Examples of usable rotating brush rolls are described in Japanese Patent Application Publication Nos. Sho 58-159533 and Hei 3-100554 and in Japanese Utility Model Publication No. Sho 62-167253, which describes a brush roll in which a metal or plastic channel-shaped member having brush elements implanted therein in a row configuration is wound without gaps and in a radiating manner on a core comprising a plastic or metal roll. A plastic fiber (for example, a synthetic fiber of, for example, a polyester such as polyethylene terephthalate, polybutylene terephthalate, and so forth; a polyamide such as nylon 6,6, nylon 6,10, and so forth; a polyacrylic type such as polyacrylonitrile, poly(alkyl(meth)acrylate), and so forth; or a polyolefin such as polypropylene, polystyrene, and so forth) can be used as the brush element. For example, the diameter of the fiber bristle is suitably 20 to 400 μm and its length is suitably 5 to 30 mm.

The outer diameter of the rotating brush roll is preferably 30 to 200 mm and the peripheral velocity at the end of the brush that rubs the plate surface is preferably 0.1 to 5 m/sec.

The direction of rotation of the rotating brush roll used in the present invention may be the same direction as the direction of transport of the lithographic printing plate precursor of the present invention or may be the direction opposite from the direction of transport of the lithographic printing plate precursor of the present invention. However, in a preferred embodiment for the use of at least two rotating brush rolls, as in the automatic processor shown as an example in FIG. 1, at least one rotating brush roll rotates in the same direction and at least one rotating brush roll rotates in the opposite direction. This serves to provide an even more secure and reliable removal of the image recording layer in the nonimage areas. Rocking the rotating brush roll along the axis of rotation of the brush roll is also effective.

The temperature of the gum solution used for gum development in the present invention and the temperature of the rinse water in subsequent steps can be freely selected independently from one another, but are preferably 10° C. to 50° C.

A drying step may be provided at any point after gum development in the gum development method of the present invention. The drying step is generally carried out by the application of a dry air current with a freely selected temperature after most of the processing solution has been removed by the roller nip.

After gum development processing as described above, the plate is installed on an offset press; a water-based component and oil-based ink are supplied; and long-run printing can be performed. The fountain solution and printing ink typically employed for lithographic printing are used as the water-based component and oil-based ink.

EXAMPLES

The present invention is described in detail in the following using examples, but the present invention is not limited to these examples.
1. Production of Lithographic Printing Plate Precursors (1) to (29), (49), and (51)
(1) Preparation of the Support 0.3 mm-thick aluminum sheet (quality: JIS A 1050) was subjected to a degreasing treatment with 10 mass % aqueous sodium aluminate solution at 50° C. for 30 seconds in order to remove the rolling oil on the surface. The aluminum surface was thereafter grained using three bundled nylon brushes (bristle diameter=0.3 mm) and an aqueous suspension of pumice (median diameter of the pumice=25 μm, specific gravity of the suspension=1.1 g/cm$^3$) and was then thoroughly washed with water. This sheet was immersed for 9 seconds in 25 mass % aqueous sodium hydroxide solution at 45° C. to carry out etching, washed with water, immersed in 20 mass % nitric acid at 60° C. for 20 seconds, and washed with water. The etching rate on the grained surface in this case was approximately 3 g/m$^2$.

A continuous electrochemical roughening treatment was then carried out using 60-Hz AC voltage. The electrolytic solution used for this treatment was a 1 mass % aqueous nitric acid solution (containing 0.5 mass % aluminum ion) and the bath temperature was 50° C. The AC power source waveform provided trapezoidal square wave alternating current with a TP (time required for the current value to go from zero to the peak) of 0.8 msec and a duty ratio of 1:1, and electrochemical roughening was carried out using a carbon electrode as the counterelectrode. Ferrite was used as an auxiliary anode. The current density was 30 A/dm$^2$ at the current peak value. 5% of the current flowing from the power source was branched to the auxiliary anode.

The quantity of electricity in this nitric acid electrolysis was 175 C/dm$^2$ for the time in which the aluminum sheet was functioning as an anode. This treatment was followed by a water rinse by spraying.

An electrochemical roughening treatment was then carried out by the same method as for the nitric acid electrolysis, but using the following conditions: electrolytic solution=0.5 mass % aqueous hydrochloric acid solution (containing 0.5 mass % aluminum ion), bath temperature=50° C., quantity of electricity=50 C/dm$^2$ for the time in which the aluminum sheet was functioning as an anode. This was followed by a water rinse by spraying.

A 2.5 g/m$^2$ direct-current anodic oxidation film was then disposed on this sheet using a current density of 15 A/dm$^2$ and using 15 mass % sulfuric acid (containing 0.5 mass % aluminum ion) as the electrolytic solution; this was followed by a water rinse and drying.

Then, in order to secure hydrophilicity in the nonimage areas, a silicate treatment was carried out for 12 seconds at 70° C. using a 2.5 mass % aqueous #3 sodium silicate solution. The Si add-on was 10 mg/m$^2$. This was followed by a water rinse to provide a support designated support (1). The center-line average surface roughness (Ra) of this substrate was measured at 0.51 μm using a needle with a diameter of 2 μm.

(2) Formation of Undercoat Layer (1)

An undercoat layer (1) was then provided on support (1) by the application of the following undercoat fluid (1) so as to give a dry coating weight of 28 mg/m².

| <Coating fluid (1) for undercoat layer formation> | |
|---|---|
| compound (1) for undercoat layer formation, with the structure given below | 0.18 g |
| hydroxyethyliminodiacetic acid | 0.10 g |
| methanol | 55.24 g |
| water | 6.15 g |

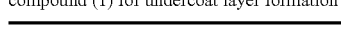

compound (1) for undercoat layer formation

(3) Formation of Image Recording Layer (1)

The image recording layer coating fluid (1) with the composition shown below was bar coated on the undercoat layer formed as described above; this was followed by oven drying for 60 seconds at 100° C. to form an image recording layer (1) having a dry coating weight of 1.0 g/m².

The image recording layer coating fluid (1) was obtained by mixing and stirring the following photosensitive fluid (1) with microgel fluid (1) immediately before application.

| <Photosensitive fluid (1)> | |
|---|---|
| binder polymer (1) (structure given below: component (D)) | 0.24 g |
| infrared absorber (1) (structure given below: component (C)) | 0.030 g |
| compound represented by general formula (1) to (3) (indicated in the table below: component (A)) or comparative polymerization initiator (R-1) or (R-2) (structures given below) | 0.162 g |
| compound that contains at least one addition-polymerizable ethylenically unsaturated bond (component (B)), tris(acryloyloxyethyl) isocyanurate (NK Ester A-9300, from Shin-Nakamura Chemical Co., Ltd.) | 0.192 g |
| low molecular weight hydrophilic compound tris(2-hydxoyethyl) isocyanurate | 0.062 g |
| low molecular weight hydrophilic compound (1) (structure given below) | 0.050 g |
| oleosensitizer, phosphonium compound (1) (structure given below) | 0.055 g |
| oleosensitizer benzyldimethyloctylammonium•PF₆ salt | 0.018 g |
| fluorosurfactant (1) (structure given below) | 0.008 g |
| methyl ethyl ketone | 1.091 g |
| 1-methoxy-2-propanol | 8.609 g |
| <Microgel fluid (1)> | |
| microgel (1) | 2.640 g |
| distilled water | 2.425 g |

The component (A) designations given in the table correspond to compounds (A-1) to (A-48) provided above as examples. The structures of the above-cited binder polymer (1), infrared absorber (1), phosphonium compound (1), low molecular weight hydrophilic compound (1), fluorosurfactant (1), comparative polymerization initiator (R-1), and comparative polymerization initiator (R-2) are shown below.

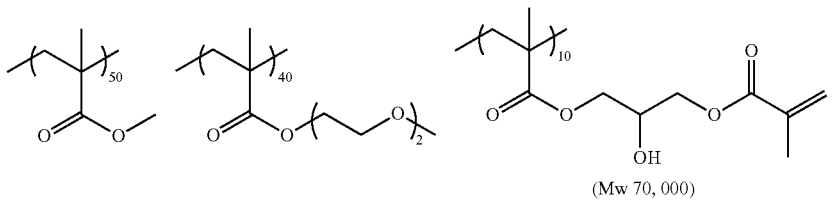

(Mw 70,000)

binder polymer (1)

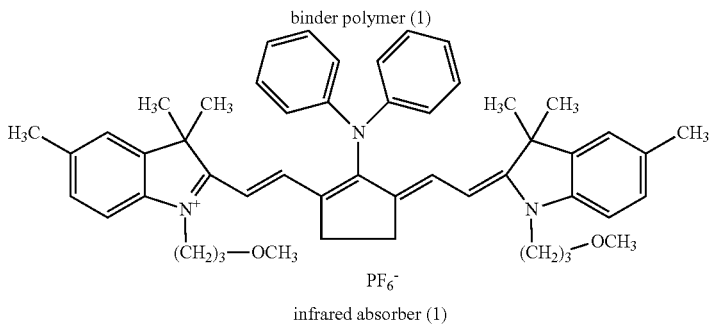

infrared absorber (1)

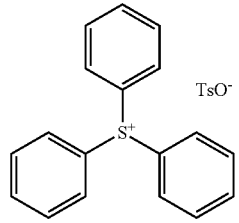

comparative polymerization initiator (R-1)

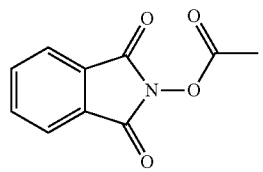

comparative polymerization initiator (R-2)

-continued

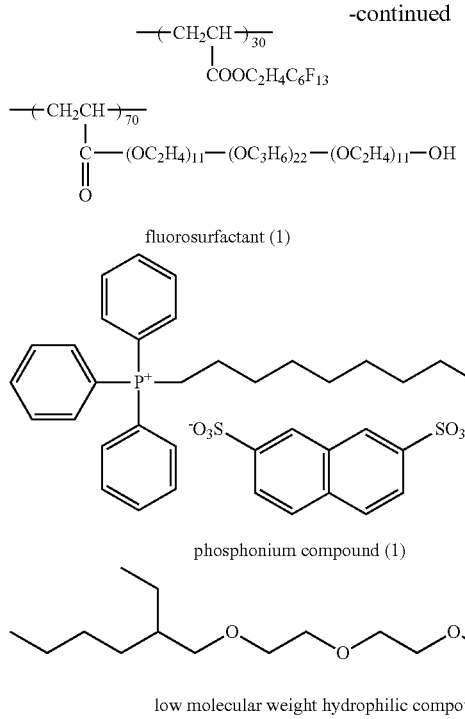

fluorosurfactant (1)

phosphonium compound (1)

low molecular weight hydrophilic compound (1)

The aforementioned microgel (1) was synthesized as follows.

<Synthesis of Microgel (1)>

10 g trimethylolpropane/xylylene diisocyanate adduct (Takenate D-110N from Mitsui Takeda Chemicals Inc.), 3.15 g pentaerythritol triacrylate (component (B), SR444 from Nippon Kayaku Co., Ltd.), and 0.1 g Paionin A-41C (Takemoto Oil & Fat Co., Ltd.) were dissolved in 17 g ethyl acetate as the oil phase component. 40 g of an aqueous 4 mass % solution of PVA-205 was prepared as the aqueous phase component. The oil phase component and aqueous phase component were mixed and were emulsified for 10 minutes at 12,000 rpm using a homogenizer. The resulting emulsion was added to 25 g distilled water and this was stirred for 30 minutes at room temperature and then for 3 hours at 50° C. Dilution was performed with distilled water to bring the solids fraction concentration of the resulting microgel fluid to 15 mass %, thus yielding the aforementioned microgel (1). The average particle diameter in this microgel was measured by a light-scattering procedure at 0.2 μm.

(4) Formation of the Protective Layer

The protective layer coating fluid with the composition given below was coated on the image recording layer that had been formed as described in the preceding; this was followed by oven drying for 60 seconds at 120° C. to form a protective layer having a dry coating weight of 0.15 g/m², thus yielding lithographic printing plate precursors (1) to (29), (49), and (51).

| <Coating fluid for protective layer formation> | |
|---|---|
| inorganic layer compound dispersion | 1.5 g |
| polyvinyl alcohol (CKS50 from Nippon Synthetic Chemical Industry Co., Ltd., sulfonic acid modified, degree of saponification at least | 0.55 g |

| <Coating fluid for protective layer formation> | |
|---|---|
| 99 mol %, degree of polymerization = 300), 6 mass % aqueous solution | |
| polyvinyl alcohol (PVA-405 from Kuraray Co., Ltd., degree of saponification = 81.5 mol %, degree of polymerization = 500), 6 mass % aqueous solution | 0.03 g |
| surfactant from Nihon Emulsion Co., Ltd., (Emalex 710), 1 mass % aqueous solution | 8.60 g |
| ion-exchanged water | 6.0 g |

(Preparation of the Inorganic Layer Compound Dispersion)

6.4 g of the synthetic mica Somashif ME-100 (Co-op Chemical Co., Ltd.) was added to 193.6 g ion-exchanged water, and dispersion was carried out using a homogenizer until the average particle size reached 3 μm (laser scattering method). The aspect ratio of the resulting dispersed particles was at least 100.

2. Preparation of Lithographic Printing Plate Precursors (30) to (48) (50), and (52)

(1) Formation of Image Recording Layer (2)

Lithographic printing plate precursors (30) to (48), (50), and (52) were prepared in the same manner as for the fabrication of lithographic printing plate precursor (1), with the exception that the following image recording layer coating fluid (2) was used in place of image recording layer coating fluid (1).

| <Image recording layer coating fluid (2)> | |
|---|---|
| binder polymer (1) (structure given above: component (D)) | 0.24 g |
| infrared absorber (2) (structure given | 0.05 g |

-continued

<Image recording layer coating fluid (2)>

| | |
|---|---|
| below: component (C)) compound represented by general formula (1) to (3) (indicated in the table below: component (A)) or comparative polymerization initiator (R-1) or (R-2) (structures given above) | 0.20 g |
| compound that contains at least one addition-polymerizable ethylenically unsaturated bond (component (B), Aronix M-215 from Toagosei Co., Ltd.) | 0.192 g |
| low molecular weight hydrophilic compound sodium n-heptylsulfonate | 0.05 g |
| oleosensitizer benzyldimethyloctylammonium•PF$_6$ salt | 0.018 g |
| oleosensitizer, ammonium group-containing polymer (exemplary compound (23) in this Specification, reduced specific viscosity = 44 cSt/g/mL) | 0.035 g |
| fluorosurfactant (1) (structure given above) | 0.10 g |
| methyl ethyl ketone | 18.0 g | infrared absorber (2)

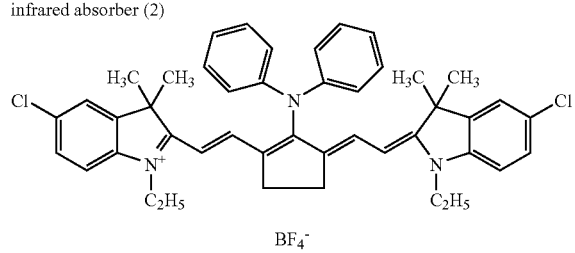

BF$_4^-$

Examples 1 to 48 and Comparative Examples 1 to 4

On-Press Development (1) Plate Inspectability

Exposure and Printing

Each of the obtained lithographic printing plate precursors (1) to (52) was exposed using a Trendsetter 3244VX (Creo), which was equipped with a water-cooled 40-W infrared semiconductor laser; exposure was carried out at an output of 11.7 W, an external drum rotation rate of 250 rpm, and a resolution of 2400 dpi. The resulting exposed precursor was then held without modification in a dark location for 30 minutes at 25° C. and a relative humidity of 50%, after which the plate inspectability was evaluated. Using the L value (lightness) in the L*a*b* color representation system, the ease of plate inspection was indicated by the difference ΔL between the L value of the exposed region and the L value of the unexposed region. Larger values for ΔL indicate a better plate inspectability, and a value for ΔL of 2.0 or more can be considered as indicative of an excellent visual plate inspectability. The measurements were performed by the specular component excluded (SCE) methodology using a CM 2600d spectrophotometer and CM-S100W operating software from Konica-Minolta. In the SCE methodology, the light due to specular reflection is excluded and only the diffuse light is measured, thereby providing a color evaluation that approximates visual color evaluation and that correlates well with plate inspection by an actual human observer. The results are shown in Tables 1 and 2.

(2) On-Press Developability

Each of the lithographic printing plate precursors prepared as described above was exposed using a Luxel Platesetter T-6000III (Fujifilm Corporation), which was equipped with an infrared semiconductor laser; the conditions were an external drum rotation rate of 1000 rpm, a laser output of 70%, and a resolution of 2400 dpi. Exposure was carried out in such a manner that the exposed image contained a solid image and the 50% halftone chart of a 20 μm-dot FM screen.

The resulting exposed precursor was installed, without a development process, on the plate cylinder of a Lithrone 26 press from the Komori Corporation. Using a fountain solution of Ecolity-2 (Fujifilm Corporation)/tap water=2/98 (volume ratio) and Values-G(N) black ink (Dainippon Ink and Chemicals, Incorporated), on-press development was performed by supplying fountain solution and ink using the standard automatic printing start-up procedure on the Lithrone 26, followed by printing 100 impressions on Mitsubishi special-grade art paper (76.5 kg) at a printing speed of 10,000 impressions per hour.

The on-press developability was evaluated as the number of sheets of printing paper required until on-press development of the unexposed areas of the image recording layer on the press was completed and ink was not transferred to the nonimage areas. The results are shown in Tables 1 and 2.

(3) Printing Durability

Printing was continued after carrying out the above-described evaluation of on-press developability. As the number of printed impressions grew, the ink density on the printed material declined due to gradual wear of the image recording layer. The printing durability was evaluated by designating the number of impressions at the printing end point to be the number of impressions when the value measured with a Gretag densitometer for the halftone area percentage of the FM screen 50% halftone had declined 5% from the value measured on the 100th printed impression. The results are shown in Tables 1 and 2.

(4) Scumming Behavior

The obtained lithographic printing plate precursor was allowed to stand for 2 days in a humidistat/thermostat set to 60° C. and 75% relative humidity, after which it was exposed and used for printing as described above and the spot scumming appearing in the nonimage areas was visually counted using a 5× loupe. The results are shown in Tables 1 and 2.

TABLE 1

| Example | lithographic printing plate precursor | image recording layer | compound given by general formulas (1) to (3): component (A) | plate inspectability (ΔL) | on-press developability (impressions) | printing durability (thousands of impressions) | scumming behavior (no./100 cm$^2$) |
|---|---|---|---|---|---|---|---|
| Example 1 | (1) | (1) | A-1 | 3.5 | 15 | 40 | less than 5 |
| Example 2 | (2) | (1) | A-2 | 3.5 | 15 | 40 | less than 5 |
| Example 3 | (3) | (1) | A-5 | 3.0 | 15 | 40 | less than 5 |
| Example 4 | (4) | (1) | A-6 | 3.0 | 20 | 40 | less than 5 |
| Example 5 | (5) | (1) | A-7 | 3.0 | 15 | 40 | less than 5 |
| Example 6 | (6) | (1) | A-8 | 3.3 | 15 | 40 | less than 5 |
| Example 7 | (7) | (1) | A-9 | 3.3 | 15 | 40 | less than 5 |
| Example 8 | (8) | (1) | A-13 | 4.5 | 20 | 50 | 10 |
| Example 9 | (9) | (1) | A-14 | 4.3 | 20 | 50 | 10 |

TABLE 1-continued

| Example | lithographic printing plate precursor | image recording layer | compound given by general formulas (1) to (3): component (A) | plate inspectability (ΔL) | on-press developability (impressions) | printing durability (thousands of impressions) | scumming behavior (no./100 cm$^2$) |
|---|---|---|---|---|---|---|---|
| Example 10 | (10) | (1) | A-16 | 3.0 | 15 | 40 | less than 5 |
| Example 11 | (11) | (1) | A-18 | 3.5 | 15 | 40 | less than 5 |
| Example 12 | (12) | (1) | A-20 | 3.0 | 15 | 40 | less than 5 |
| Example 13 | (13) | (1) | A-21 | 3.0 | 15 | 40 | less than 5 |
| Example 14 | (14) | (1) | A-23 | 4.5 | 20 | 50 | 10 |
| Example 15 | (15) | (1) | A-25 | 3.0 | 15 | 40 | less than 5 |
| Example 16 | (16) | (1) | A-26 | 3.5 | 15 | 40 | less than 5 |
| Example 17 | (17) | (1) | A-28 | 3.0 | 15 | 40 | less than 5 |
| Example 18 | (18) | (1) | A-29 | 3.0 | 15 | 40 | less than 5 |
| Example 19 | (19) | (1) | A-31 | 4.5 | 20 | 50 | 10 |
| Example 20 | (20) | (1) | A-33 | 3.0 | 15 | 40 | less than 5 |
| Example 21 | (21) | (1) | A-34 | 3.5 | 15 | 40 | less than 5 |
| Example 22 | (22) | (1) | A-36 | 3.0 | 15 | 40 | less than 5 |
| Example 23 | (23) | (1) | A-37 | 3.0 | 15 | 40 | less than 5 |
| Example 24 | (24) | (1) | A-39 | 4.5 | 20 | 50 | 10 |
| Example 25 | (25) | (1) | A-42 | 3.5 | 15 | 40 | less than 5 |
| Example 26 | (26) | (1) | A-44 | 3.0 | 15 | 40 | less than 5 |
| Example 27 | (27) | (1) | A-45 | 3.0 | 15 | 40 | less than 5 |
| Example 28 | (28) | (1) | A-46 | 4.5 | 20 | 50 | 10 |
| Example 29 | (29) | (1) | A-48 | 3.0 | 15 | 40 | less than 5 |

TABLE 2

| example | lithographic printing plate precursor | image recording layer | compound given by general formulas (1) to (3): component (A) | plate inspectability (ΔL) | on-press developability (impressions) | printing durability (thousands of impressions) | scumming behavior (no./100 cm$^2$) |
|---|---|---|---|---|---|---|---|
| Example 30 | (30) | (2) | A-1 | 3.5 | 20 | 35 | less than 5 |
| Example 31 | (31) | (2) | A-5 | 3.0 | 20 | 35 | less than 5 |
| Example 32 | (32) | (2) | A-13 | 4.5 | 20 | 40 | 10 |
| Example 33 | (33) | (2) | A-16 | 3.0 | 20 | 35 | less than 5 |
| Example 34 | (34) | (2) | A-18 | 3.5 | 20 | 35 | less than 5 |
| Example 35 | (35) | (2) | A-20 | 3.0 | 20 | 35 | less than 5 |
| Example 36 | (36) | (2) | A-23 | 4.5 | 20 | 40 | 10 |
| Example 37 | (37) | (2) | A-25 | 3.0 | 20 | 35 | less than 5 |
| Example 38 | (38) | (2) | A-26 | 3.5 | 20 | 35 | less than 5 |
| Example 39 | (39) | (2) | A-28 | 3.0 | 20 | 35 | less than 5 |
| Example 40 | (40) | (2) | A-31 | 4.5 | 20 | 40 | 10 |
| Example 41 | (41) | (2) | A-33 | 3.0 | 20 | 35 | less than 5 |
| Example 42 | (42) | (2) | A-34 | 3.5 | 20 | 35 | less than 5 |
| Example 43 | (43) | (2) | A-36 | 3.0 | 20 | 35 | less than 5 |
| Example 44 | (44) | (2) | A-39 | 4.5 | 20 | 40 | 10 |
| Example 45 | (45) | (2) | A-42 | 3.0 | 20 | 35 | less than 5 |
| Example 46 | (46) | (2) | A-44 | 3.0 | 20 | 35 | less than 5 |
| Example 47 | (47) | (2) | A-46 | 4.5 | 20 | 40 | 10 |
| Example 48 | (48) | (2) | A-48 | 3.0 | 20 | 35 | less than 5 |
| Comparative Example 1 | (49) | (1) | R-1 | 0.2 | 25 | 40 | 300 |
| Comparative Example 2 | (50) | (2) | R-1 | 0.1 | 28 | 35 | 300 |
| Comparative Example 3 | (51) | (1) | R-2 | 0.1 | 50 | 5 | 20 |
| Comparative Example 4 | (52) | (2) | R-2 | 0.1 | 55 | 5 | 20 |

As may be understood from Tables 1 and 2, the present invention can provide a lithographic printing plate precursor that, while maintaining a good printing durability, exhibits an excellent plate inspectability, an excellent on-press developability, and an excellent scumming performance, and can provide an excellent method of lithographic printing that uses this lithographic printing plate precursor.

Example 49 to 96 and Comparative Examples 5 to 8

Gum Development

The same lithographic printing plate precursors (1) to (52) as used above were exposed with an infrared laser and subjected to gum development and were submitted to an evaluation of the printing characteristics as described below.

(1) Gum Developability

The lithographic printing plate precursor was imagewise exposed using a Trendsetter 3244VX (Creo), which was equipped with an infrared semiconductor laser; exposure was carried out at an output of 6.4 W, an external drum rotation rate of 150 rpm, and a resolution of 2400 dpi. The exposed image contained a solid image and a fine-line image.

The obtained exposed precursor was processed by using the automatic developing apparatus shown in FIG. 1. The processing solution shown below was used as the development processing solution.

| <Developer 1> composition (mass %) | |
| --- | --- |
| gum arabic | 1.6% |
| enzyme-modified potato starch | 8.8% |
| phosphated waxy corn starch | 0.80% |
| sodium salt of dioctyl sulfosuccinate | 0.10% |
| citric acid | 0.14% |
| α-alanine | 0.11% |
| EDTA, tetrasodium salt | 0.10% |
| dodecyldiphenyl ether disulfonic acid, 2Na salt | 0.18% |
| ethylene glycol | 0.72% |
| benzyl alcohol | 0.87% |
| sodium dehydroacetate | 0.04% |
| emulsion-type silicone defoamer | 0.01% |
| addition of water | to bring the total to 100% |
| | pH 5.0 |

The following procedure was used to evaluate whether removal of the image recording layer in the nonimage areas by the development process described above proceeded in conformity with the desired image: mounting on the cylinder of a Speedmaster 52 press (Heidelberg), supplying fountain solution and ink using fountain solution (IF102 etching solution from Fujifilm Corporation/water=3/97 (volume ratio)) and Trans-G(N) black ink (Dainippon Ink and Chemicals, Incorporated), then printing 100 impressions at a printing speed of 6000 impressions per hour.

The evaluation was done on the basis of the width of the reproduced white fine lines, by visually inspecting the printed paper to determine to what white fine line width on the printed paper the exposed fine line image (test chart in which the white line thickness (fine line-shaped nonimage areas within the image area) was varied from 10 μm to 50 μm in 2 μm increments) could be reproduced. Thus, a smaller value indicates a better development to a narrower fine line and is the preferred result. These results are shown in Tables 3 and 4.

(2) Printing Durability

After the fine line reproducibility had been evaluated as described above, printing was continued and the printing durability was evaluated in the same manner as described above for the on-press-developed printing plates. The results are shown in Tables 3 and 4.

(3) Scumming Behavior

The obtained lithographic printing plate precursor was held for 2 days in a humidistat/thermostat set at 60° C. and 75% relative humidity, followed by exposure and printing in the same manner as described above and visually counting with the aid of a 5× loupe the spot scumming that appeared in the nonimage areas. The results are shown in Tables 3 and 4.

TABLE 3

| example | lithographic printing plate precursor | image recording layer | compound given by general formulas (1) to (3): component (A) | gum developability (fine line reproducibility (μm))) | printing durability (thousands of impressions) | scumming behavior (no./100 cm$^2$) |
| --- | --- | --- | --- | --- | --- | --- |
| Example 49 | (1) | (1) | A-1 | 16 | 45 | less than 5 |
| Example 50 | (2) | (1) | A-2 | 16 | 45 | less than 5 |
| Example 51 | (3) | (1) | A-5 | 16 | 45 | less than 5 |
| Example 52 | (4) | (1) | A-6 | 18 | 45 | less than 5 |
| Example 53 | (5) | (1) | A-7 | 16 | 45 | less than 5 |
| Example 54 | (6) | (1) | A-8 | 16 | 45 | less than 5 |
| Example 55 | (7) | (1) | A-9 | 16 | 45 | less than 5 |
| Example 56 | (8) | (1) | A-13 | 18 | 55 | less than 5 |
| Example 57 | (9) | (1) | A-14 | 18 | 55 | less than 5 |
| Example 58 | (10) | (1) | A-16 | 16 | 45 | less than 5 |
| Example 59 | (11) | (1) | A-18 | 16 | 45 | less than 5 |
| Example 60 | (12) | (1) | A-20 | 16 | 45 | less than 5 |
| Example 61 | (13) | (1) | A-21 | 16 | 45 | less than 5 |
| Example 62 | (14) | (1) | A-23 | 18 | 55 | less than 5 |
| Example 63 | (15) | (1) | A-25 | 16 | 45 | less than 5 |
| Example 64 | (16) | (1) | A-26 | 16 | 45 | less than 5 |
| Example 65 | (17) | (1) | A-28 | 16 | 45 | less than 5 |
| Example 66 | (18) | (1) | A-29 | 16 | 45 | less than 5 |
| Example 67 | (19) | (1) | A-31 | 18 | 55 | less than 5 |
| Example 68 | (20) | (1) | A-33 | 16 | 45 | less than 5 |
| Example 69 | (21) | (1) | A-34 | 16 | 45 | less than 5 |
| Example 70 | (22) | (1) | A-36 | 16 | 45 | less than 5 |
| Example 71 | (23) | (1) | A-37 | 16 | 45 | less than 5 |
| Example 72 | (24) | (1) | A-39 | 18 | 55 | less than 5 |
| Example 73 | (25) | (1) | A-42 | 16 | 45 | less than 5 |
| Example 74 | (26) | (1) | A-44 | 16 | 45 | less than 5 |
| Example 75 | (27) | (1) | A-45 | 16 | 45 | less than 5 |
| Example 76 | (28) | (1) | A-46 | 18 | 55 | less than 5 |
| Example 77 | (29) | (1) | A-48 | 16 | 45 | less than 5 |

TABLE 4

| example | lithographic printing plate precursor | image recording layer | compound given by general formulas (1) to (3): component (A) | gum developability (fine line reproducibility (μm))) | printing durability (thousands of impressions) | scumming behavior (no./100 cm$^2$) |
| --- | --- | --- | --- | --- | --- | --- |
| Example 78 | (30) | (2) | A-1 | 16 | 40 | less than 5 |
| Example 79 | (31) | (2) | A-5 | 18 | 40 | less than 5 |
| Example 80 | (32) | (2) | A-13 | 18 | 45 | less than 5 |
| Example 81 | (33) | (2) | A-16 | 18 | 40 | less than 5 |
| Example 82 | (34) | (2) | A-18 | 18 | 40 | less than 5 |

TABLE 4-continued

| example | lithographic printing plate precursor | image recording layer | compound given by general formulas (1) to (3): component (A) | gum developability (fine line reproducibility (μm))) | printing durability (thousands of impressions) | scumming behavior (no./100 cm$^2$) |
|---|---|---|---|---|---|---|
| Example 83 | (35) | (2) | A-20 | 18 | 40 | less than 5 |
| Example 84 | (36) | (2) | A-23 | 18 | 45 | less than 5 |
| Example 85 | (37) | (2) | A-25 | 18 | 40 | less than 5 |
| Example 86 | (38) | (2) | A-26 | 18 | 40 | less than 5 |
| Example 87 | (39) | (2) | A-28 | 18 | 40 | less than 5 |
| Example 88 | (40) | (2) | A-31 | 18 | 45 | less than 5 |
| Example 89 | (41) | (2) | A-33 | 18 | 40 | less than 5 |
| Example 90 | (42) | (2) | A-34 | 18 | 40 | less than 5 |
| Example 91 | (43) | (2) | A-36 | 18 | 40 | less than 5 |
| Example 92 | (44) | (2) | A-39 | 18 | 45 | less than 5 |
| Example 93 | (45) | (2) | A-42 | 18 | 40 | less than 5 |
| Example 94 | (46) | (2) | A-44 | 18 | 40 | less than 5 |
| Example 95 | (47) | (2) | A-46 | 18 | 45 | less than 5 |
| Example 96 | (48) | (2) | A-48 | 18 | 40 | less than 5 |
| Comparative Example 5 | (49) | (1) | R-1 | 28 | 40 | 200 |
| Comparative Example 6 | (50) | (2) | R-1 | 30 | 40 | 200 |
| Comparative Example 7 | (51) | (1) | R-2 | 40 | 5 | 40 |
| Comparative Example 8 | (52) | (2) | R-2 | 40 | 5 | 40 |

As may be understood from Tables 3 and 4, the present invention can provide a lithographic printing plate precursor that exhibits an excellent gum developability (fine line reproducibility), an excellent printing durability, and an excellent scumming performance, and can provide a method of lithographic printing that uses this lithographic printing plate precursor.

What is claimed is:

1. A lithographic printing plate precursor that comprises an image recording layer having:
    (A) a nonionic polymerization initiator that contains at least two cyclic imide structures,
    (B) a compound that has at least one addition-polymerizable ethylenically unsaturated bond, and
    (C) an infrared absorber,
wherein the nonionic polymerization initiator (A) is a compound represented by the following general formula (2) or (3):

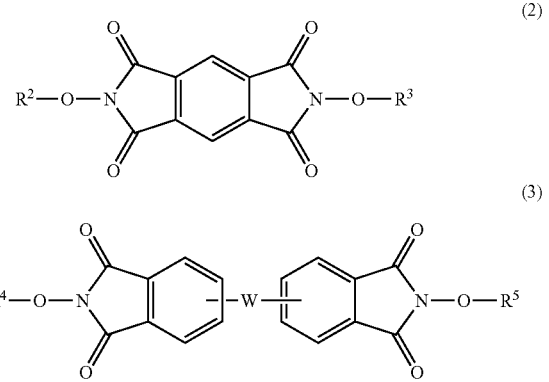

wherein $R^2$, $R^3$, $R^4$, and $R^5$ each independently represent a monovalent organic group selected from the group consisting of a substituted carbonyl group and, an alkyl group, and W represents a divalent organic linking group.

2. The lithographic printing plate precursor according to claim 1, wherein the lithographic printing plate precursor further has a protective layer.

3. The lithographic printing plate precursor according to claim 1, wherein the infrared absorber (C) is a cyanine dye.

4. The lithographic printing plate precursor according to claim 1, wherein the infrared absorber (C) is a compound that contains a solvent-soluble group in the molecule.

5. The lithographic printing plate precursor according to claim 4, wherein the solvent-soluble group present in the infrared absorber (C) is at least one selected from the group consisting of an alkyloxy group, an aryloxy group, an alkyloxycarbonyl group, and an aryloxycarbonyl group.

6. The lithographic printing plate precursor according to claim 1, wherein the infrared absorber (C) has a cyanine dye structure represented by the following general formula (4) and has at least one solvent-soluble group in the molecule

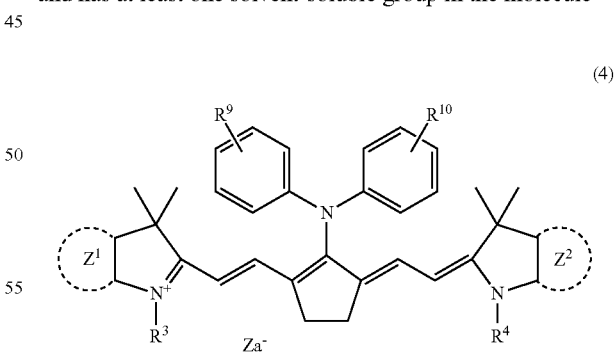

wherein $Z^1$ and $Z^2$ each independently represent an optionally substituted aromatic ring or aromatic heterocycle, $R^3$ and $R^4$ each independently represent hydrocarbyl that contains no more than 20 carbons and that may be substituted, $R^9$ and $R^{10}$ each independently represent a hydrogen atom or an optionally substituted alkoxy group, and $Za^-$ represents a counteranion that is present when charge neutralization is required.

7. The lithographic printing plate precursor according to claim 1, wherein the infrared absorber (C) has a salt structure comprising a cation and an anion, and the anion moiety is an inorganic anion.

8. The lithographic printing plate precursor according to claim 1, wherein the image recording layer further contains (D) a binder polymer.

9. A lithographic printing method, comprising the steps of:

imagewise exposing the lithographic printing plate precursor according to claim 1 using an infrared laser; and carrying out printing, without executing any development process, by supplying an oil-based ink and a fountain solution to the lithographic printing plate precursor after exposure, wherein the portions of the image recording layer that are not exposed to the infrared laser are removed by the oil-based ink and/or fountain solution during the course of the printing step.

10. A lithographic printing method, comprising the steps of:

imagewise exposing the lithographic printing plate precursor according to claim 1 using a laser;

executing thereafter a development process with a gum solution to remove unexposed portions of the image recording layer; and carrying out printing by supplying an oil-based ink and a fountain solution to the lithographic printing plate precursor.

* * * * *